United States Patent
Nishizawa et al.

(10) Patent No.: US 7,971,791 B2
(45) Date of Patent: Jul. 5, 2011

(54) MULTI-FUNCTION CARD DEVICE

(75) Inventors: Hirotaka Nishizawa, Fuchu (JP); Akira Higuchi, Takasaki (JP); Kenji Osawa, Hachioji (JP); Junichiro Osako, Kodaira (JP); Tamaki Wada, Higashimurayama (JP); Michiaki Sugiyama, Tokyo (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 1329 days.

(21) Appl. No.: 10/562,727

(22) PCT Filed: Jul. 3, 2003

(86) PCT No.: PCT/JP03/08434
§ 371 (c)(1),
(2), (4) Date: Dec. 30, 2005

(87) PCT Pub. No.: WO2005/004047
PCT Pub. Date: Jan. 13, 2005

(65) Prior Publication Data
US 2006/0151614 A1 Jul. 13, 2006

(51) Int. Cl.
*G06K 19/06* (2006.01)
*G06K 19/00* (2006.01)
(52) U.S. Cl. .................................... 235/492; 235/487
(58) Field of Classification Search ............... 235/441, 235/451, 487, 492, 439
See application file for complete search history.

(56) References Cited

U.S. PATENT DOCUMENTS

| | | | |
|---|---|---|---|
| 5,758,121 A * | 5/1998 | Fukuzumi | 711/164 |
| 6,573,567 B1 * | 6/2003 | Nishizawa et al. | 257/358 |
| 6,606,707 B1 * | 8/2003 | Hirota et al. | 713/172 |
| 6,669,487 B1 | 12/2003 | Nishizawa et al. | |
| 6,686,663 B2 * | 2/2004 | Masuda et al. | 257/777 |
| 6,858,925 B2 | 2/2005 | Wada et al. | |
| 2001/0009505 A1 | 7/2001 | Nishizawa et al. | 361/737 |
| 2002/0177407 A1 | 11/2002 | Mitsumoto | 455/41 |
| 2003/0112611 A1 | 6/2003 | Nishizawa et al. | 361/763 |

FOREIGN PATENT DOCUMENTS

| | | |
|---|---|---|
| EP | 1278154 A1 | 1/2003 |
| JP | 2002-351623 | 12/2002 |
| JP | 2003-22216 | 1/2003 |
| JP | 2003-022216 A | 1/2003 |
| JP | 2003-30613 | 1/2003 |
| JP | 2003-91704 | 3/2003 |
| KR | 2003-0005304 A | 1/2003 |
| TW | 540004 | 12/1995 |
| WO | WO 01/84480 | 11/2001 |
| WO | WO 01/84490 | 11/2001 |
| WO | WO 02/082364 A1 | 10/2002 |

* cited by examiner

*Primary Examiner* — Thien M. Le
*Assistant Examiner* — April A Taylor
(74) *Attorney, Agent, or Firm* — Miles & Stockbridge P.C.

(57) ABSTRACT

A multifunction card device has an external connection terminal, an interface controller, a memory, and the security controller connected to the interface controller and the external connection terminal. The interface controller has a plurality of interface control modes, and controls an external-interface action and a memory interface action by the control mode according to the instruction from the outside. The external connection terminals have an individual terminal individualized for every interface control mode, and a communalized common terminal. A clock input terminal, a power supply terminal, and an earthing terminal are included in the common terminals. A data terminal, and a dedicated terminal of the security controller are included in the individual terminals. Partial communalization and individualization of an external connection terminal attain a guarantee of the reliability of an interface, and increase control of physical magnitude to some kinds of interface control modes. The security process by a security controller independent interface can also be guaranteed.

8 Claims, 44 Drawing Sheets

66   65   66

MULTI-FUNCTION CARD DEVICE

TECHNICAL FIELD

The present invention relates to a multifunction card device like the multifunctional memory card which can correspond to some kinds of standard of a memory card, or can support a security process.

BACKGROUND ART

Some kinds of standard exist in an available memory card with a communication personal digital assistant, PDA (personal data assistant), PC (Personal Computer), etc. For example, specifications, such as MMC (Multi Media Card), HSMMC (High Speed Multi Media Card), RSMMC (Reduced Size Multi Media Card), SD card, memory stick, and memory stick Pro, exist. It is written in addition that these designations are a registered trademark or a trademark, respectively here. About each specification, the number of data bits, a card recognition protocol, the buss control method, a data format, etc. have a difference.

In order to realize a multi bank and a multifunction, maintaining interchangeability with MMC, the technology which mounts SIM (Subscriber Identity Module) in MMC, and strengthened security is described in international publication No. WO 01/84480 pamphlet.

Japanese Unexamined Patent Publication No. 2003-30613 has a description about the memory device which was provided with a plurality of controller chips, supported the interface mode corresponding to each controller chip, and enabled the mode change.

Japanese Unexamined Patent Publication No. 2003-91704 has a description about the memory device which mounted the flash memory chip, IC card chip which performs a security process, and the controller chip which controls them according to the instruction from the outside.

The present inventor examined the multifunction card device which can correspond to some kinds of standards of a memory card, or can support a security process. According to this, when the corresponding standard became three or more kinds, it was shown clearly that many-sided consideration of a guarantee of reliability and suppressing increase of physical magnitude by partial communalization and partial individualization of a terminal was needed. It is necessary to be able to deal with the possibility of various interfaces assumed also when interfacing with a security controller independent or using a memory card interface also about a security process. Not only a contact interface but the non-contact interface by transformer coupling etc. spreads also about an interface. From the viewpoint of reliability reservation of an interface, it is necessary to also take into consideration improvement in an antenna characteristic, and the measures against EMI (Electro magnetic interference). With the non-contact interface adopted with IC (Integrated circuit) card etc., the operation power has been obtained with the electromotive force (induced e.m.f.) generated by the electromagnetic induction by transformer coupling. When taking into consideration that there is a case of having to obtain operation power according to the induced e.m.f. like this, the predominance of taking into consideration about the low power that maintenance of a switch state does not take power consumption to a mode selection switch, a power switch, etc. which are especially always made into an ON state or an OFF state has been recognized.

The purpose of the present invention is to offer the means for solving above-mentioned consideration items over the multifunction card device which can correspond to some kinds of standards of a memory card, or can support a security process.

The above-described and the other purposes and novel features of the present invention will become apparent from the description herein and accompanying drawings.

DISCLOSURE OF THE INVENTION

[1] <<Versatility Over a Card Standard>>

As for a multifunction card device, a plurality of semiconductor chips are mounted on the wiring substrate on which the external connection terminal was formed, and the semiconductor chip of 1 includes the interface controller connected to the external connection terminal, and another semiconductor chip includes the memory connected to the interface controller. The interface controller has a plurality of interface control modes, and controls an external-interface action and a memory interface action according to the control mode according to the instruction from the outside, or setting opted beforehand inside. The external connection terminals have the individual terminal individualized for the every interface control mode, and the common terminal communalized for the every interface control mode. A clock input terminal, a power supply terminal, and an earthing terminal are included in the common terminals. A data terminal is included in the individual terminals.

Both sides of a guarantee of the reliability of an interface and the increase control of physical magnitude can be satisfied by partial communalization and individualization of the external connection terminals to some kinds of interface control modes.

It has further the security controller which comprised a semiconductor chip the same as that of the interface controller, or another in acceleration of multi-functionalization. The security controller is connected to the interface controller and an external connection terminal. The dedicated terminal of the security controller is further included in the individual terminals. The security process by a security controller independent interface can also be guaranteed. For example, when a security controller is what is called an IC card microcomputer, it becomes possible to operate a multifunction card device like a conventional IC card.

As a concrete form, it has a clock terminal, a data input output terminal, a reset terminal, a power supply terminal, and an earthing terminal as a dedicated terminal of the security controller. By the signal state to the dedicated terminal, recognition of an external card host is independently attained in a security controller.

[2] <<Security Process>>

As a concrete form, the security controller performs a security process according to the signal state of the external terminal, or the action command given from the interface controller. Hereby, it becomes possible to make it function with a memory using a memory card interface, guaranteeing operating a security controller independently.

As a concrete form, it has an internal antenna further and a non-contact interface is possible for the security controller using the antenna. It becomes possible to make it function independently by using the induced e.m.f. by transformer coupling as operation power like a noncontact IC card. This is significant, when removing a multifunction card device from a card host or using at the time of a card host's power supply cutoff.

As a concrete form, it has further an external antenna connection terminal which can connect an external antenna, and a switching circuit alternatively connectable the external antenna connection terminal to the security controller instead of the internal antenna. By preparing an external antenna, utilization of the antenna which was excellent in characteristics compared with the internal antenna is attained.

The switching circuit has a nonvolatile memory element which intervenes between corresponding connection terminals and is controllable in cutoff or conduction of a path according to the threshold voltage which can be electrically changed, and a controlling circuit which stops the path treating the threshold voltage seen from the selection terminal of the nonvolatile memory element as a first condition, and performs conduction of the path treating the threshold voltage as a second condition. The selection terminal is connected to the ground voltage of a circuit in the second condition of the threshold voltage. Hereby, maintenance of the switch state of the ON state to which conduction of the path is performed does not take power consumption.

If the high voltage impression when changing the threshold voltage of a nonvolatile memory element is taken into consideration, on both sides of the nonvolatile memory element, the switch for isolation of a pair may be arranged in series. The switch for isolation is made into an ON state by connecting the selection terminal to the ground voltage of a circuit. The controlling circuit controls the switch for isolation to an OFF state, when changing the threshold voltage of a nonvolatile memory element. It does not require making all the circuits connected to a path into a high breakdown voltage by this.

The nonvolatile memory element comprises a bipolar transistor part, and the nonvolatile MOS transistor part to which the drain source were connected between the base collector of a bipolar transistor part, for example, and as for a nonvolatile MOS transistor part, a charge storage region is formed via an insulating layer on the channel between source drain, and threshold voltage is made adjustable according to the charge accumulated in this charge storage region.

[3] <<Power on Reset of a Security Controller>>

When the reset to a security controller is taken into consideration, the power on reset which initializes all the internal states to abnormal condition has high possibility of being frequently carried out compared with an interface controller etc., on the characteristic to perform a security process.

If it has an external power source terminal for exclusive use for the security controller as the individual terminal, power on reset can become possible with a security controller independent, without resetting the whole multifunction card device, and user-friendliness can be improved.

It may have an external power source terminal common to the security controller and an interface controller as the external connection terminal, and a power switch which can stop a power supply by control of the interface controller in the power supply path from the common external power source terminal to the power supply terminal of the security controller. Power on reset becomes possible with a security controller independent also by this.

It has an external power source terminal common to the security controller and an interface controller as the external connection terminal, and the security controller has an input terminal of the reset signal with which power on reset is directed from the interface controller. Power on reset becomes possible with the security controller independent also by this.

The external connection terminal has an external power source terminal, operation power is supplied from the external power source terminal to the interface controller, the security controller uses as operation power the power source generated using the operation power, for example, step-down power supply, and the security controller has an input terminal of the reset signal with which power on reset is directed from the interface controller. Power on reset becomes possible with the security controller independent also by this. It is effective when a security controller and an interface controller are formed with another chip, and the operation power voltage is different especially.

[4] <<Antenna Characteristic Deterioration Prevention by a Ground Pattern>>

As a concrete form of the present invention, when the above-mentioned multifunction card device has an antenna, and the non-contact interface of the semiconductor chip which includes the security controller is enabled connecting with the antenna, it is desirable for the wiring substrate to have the division ground pattern which was divided into plurality and connected without forming a closed circuit as a ground pattern to which the grounding electric potential of a circuit is applied. On the front surface of a big ground pattern, the eddy current loss produced by fluctuating magnetic flux can be reduced, and degradation of an antenna characteristic can be prevented or eased.

[5] <<Improvement in Antenna Performance>>

As a concrete form of the present invention, when the above-mentioned multifunction card device has an antenna, and the non-contact interface of the semiconductor chip which includes the security controller is enabled connecting with the antenna, it is desirable for the antenna to be arranged in the outside area of the semiconductor chip, and for the stack of the semiconductor chip to be performed on a ferrite plate. Since a ferrite plate which is a ferromagnetic substance has large magnetic permeability, magnetic flux tries to take the path along it without penetrating the ferrite plate. Therefore, since the antenna is arranged at the peripheral part of the ferrite plate, it becomes possible to acquire big magnetic flux near the antenna, and it can contribute to the improvement in the inductance performance of an antenna, i.e., antenna performance, here, by this. Since the semiconductor chip is piled up on the ferrite plate, it can be eased that magnetic flux penetrates to the semiconductor chip, and it becomes possible to prevent beforehand a possibility of an undesirable eddy current or the undesirable induced e.m.f. occurring in a semiconductor chip, and producing malfunction.

The ferrite plate is a ferrite chip, an applied ferrite paste, or a stuck ferrite film. The ferromagnetic oxide represented by $MO\text{—}Fe_2O_3$ is named ferrite generically on the specifications.

What is necessary is just to arrange an antenna to the side of a semiconductor chip, if there is no need of arranging an antenna in the peripheral part of a semiconductor chip from the point of a space factor, in other words, if the comparatively big wiring substrate can be used. Also in this case, it is desirable to arrange a ferrite plate in the central part of the antenna from a viewpoint of improvement in antenna performance.

At this time, it is desirable to cover the semiconductor chip arranged in the side of an antenna with a metal cap or a ferrite cap from a viewpoint of malfunction prevention of the semiconductor chip by magnetic flux.

The antenna is the coil pattern formed in the wiring substrate, or a winding wire coil arranged on a wiring substrate, for example. In respect of cost, the way of the coil pattern on a wiring substrate is excellent. As for a coil pattern, in respect of the non-contact interface by transformer coupling, it is desirable that they are two or more layers.

The antenna may be a dielectric antenna chip. It is desirable to perform the stack of the dielectric antenna chip on a ferrite plate in respect of an antenna characteristic. What is necessary is just to perform the stack of the semiconductor chip on an opposite surface with the stack face of a dielectric antenna chip on a ferrite plate at this time.

[6] <<Measures Against EMI>>

As a concrete form of the multifunction card device concerning the present invention, when the external connection terminal is exposed and the whole is covered with a cap in the antenna, it is good for the cap to adopt a ferrite mixing cap or a metal cap. The cap serves as measures against EMI (Electro Magnetic Interference).

As a concrete form of the multifunction card device concerning the present invention, when having an antenna, and the semiconductor chip which includes the security controller is connected to then antenna, a non-contact interface is enabled, the external connection terminal is exposed and the whole is covered by casing, it is desirable to form the antenna in the outside area (for example, periphery region) of a semiconductor chip, to perform the stack of the semiconductor chip on a ferrite plate, and to form electromagnetic shielding in the opposite side with the receiving surface by the antenna. The measures against EMI, i.e., control of a generation of an electromagnetic blockage and a fault, are taken with electromagnetic shielding. Here, EMI is considered also including EMS (Electro Magnetic Susceptibility: susceptibility of electromagnetic waves) for convenience.

The electromagnetic shielding is the ferrite mixing layer of casing, a metal mixing layer of casing, a coating surface of the ferrite mixing coating applied to casing, a coating surface of the metal mixing coating applied to casing, or the metal evaporation label stuck on casing, for example. The casing is a cap or a resin molding.

[7] <<External Capacitor for Tuning>>

It is desirable to have the capacitor for tuning externally attached between the connection terminals of an antenna. It is because the input capacitance of the radio frequency head connected to an antenna has comparatively big manufacture variation. What is necessary is for the capacitor for tuning just to include the chip capacitor, a variable capacitance capacitor, or nonvolatile MOS capacity.

[8] <<The Thinning of a Socket, and Reverse Insertion Prevention of a Device>>

As for the multifunction card device concerning the present invention, when exposing an external connection terminal and sealing the whole in a package, at least two level difference parts stopped by the socket are formed in the thickness direction of the package. A package is formed with a batch molding or a MAP (mold array package) form, and a level difference part is also formed as one by a batch molding. Since a socket stops a level difference part thinner than the thickness of a package, it becomes easy to suppress the thickness of a socket to the minimum.

If the two level difference parts are made unsymmetrical, the situation of turning an upper-and-lower-sides or right-and-left border to a reverse direction, and equipping a package with a socket can be deterred. The situation that the terminal of a socket and the terminal of a package not corresponding to it electrically contact each other, and a circuit and a terminal deteriorate or destroy by this can be prevented.

As long as it stands on the viewpoint of preventing the situation that the terminal of a socket, and the terminal of a package not corresponding to it electrically contact each other, and a circuit and a terminal deteriorate or destroy, the external connection terminals exposed out of the package may be made into non-line symmetry to the center of a package. The external connection terminals exposed out of the package may be arranged in parallel in plural lines, and the plural lines may be biased to the level difference part of a package. Or the external connection terminal exposed out of the package is arranged in parallel in plural lines, and it may be made to give deviation mutually to the plural lines to a parallel direction.

According to the viewpoint of the thinning of a multifunction card device, a plurality of semiconductor chips by which a stack is performed on a wiring substrate or a ferrite plate are good to be thinly formed by the semiconductor chip with smaller surface area, and to arrange a thinner semiconductor chip at the upper layer.

[9] <<Test Facilitation>>

From a viewpoint of the test facilitation to the multifunction card device concerning the present invention, when external connection terminals are exposed and the whole is sealed by the package, it is good to arrange a plurality of test terminals which connect with a plurality of first external terminals, respectively and whose pitch and surface area are bigger than the first external terminal other than the first external terminal connected to the terminal of a card socket as external connection terminals exposed out of the package.

In order to increase the efficiency of arrangement of a test terminal, the first external terminals are good to space out, to arrange to plural lines and to arrange the second external terminals to the whole region between plural lines.

[10] <<Nonvolatile Switch>>

The present invention by the Viewpoint of a nonvolatile switch has a power switch circuit which can selectively stop the operation power of a circuit in a semiconductor integrated circuit. The power switch circuit has a nonvolatile memory element which was placed between the channels of communication of operation power and whose alteration of threshold voltage was enabled electrically, and a controlling circuit which stops the channels of communication treating the threshold voltage seen from the selection terminal of the nonvolatile memory element as a first condition, and performs conduction of the channels of communication treating the threshold voltage as a second condition. The selection terminal is connected to the ground voltage of a circuit in the second condition of the threshold voltage. Hereby, maintenance of the switch state of the ON state to which conduction of the path is performed does not take power consumption.

If the high voltage impression when changing the threshold voltage of a nonvolatile memory element is taken into consideration, on both sides of the nonvolatile memory element, the switch for isolation of a pair may be arranged in series. The switch for isolation is made into an ON state by connecting the selection terminal to fixed potential, such as ground voltage of a circuit. The controlling circuit controls the switch for isolation to an OFF state, when changing the threshold voltage of a nonvolatile memory element. It does not require making all the circuits connected to a path into a high breakdown voltage.

The semiconductor integrated circuit by another viewpoint of a nonvolatile switch has a switching circuit which can selectively stop between circuits. By adopting the same structure as the power switch circuit as the switching circuit, maintenance of the switch state of the ON state to which conduction of the path is performed does not take power consumption.

[11] Each technical matter concerning antenna characteristic deterioration prevention by the above-mentioned ground pattern, improvement in antenna performance, the measures against EMI, the thinning of a socket, the reverse insertion of a device, etc. is applicable not only to a multifunction card device but also to the semiconductor card device which has a wiring substrate, a semiconductor chip mounted on the wiring substrate, and an antenna connected to the semiconductor chip, furthermore to the semiconductor device which has a wiring substrate which exposed the external connection terminal on the one surface, a semiconductor chip mounted on the wiring substrate, an antenna which was connected to the semiconductor chip, and the cap which covers the wiring substrate, the semiconductor chip and the antenna exposing one side of the wiring substrate, and to the semiconductor card device with which the semiconductor chip mounted in the wiring substrate was sealed by the package, etc.

BEST MODE FOR CARRYING OUT THE INVENTION

<<Communication Personal Digital Assistant Device>>

Figure 1:
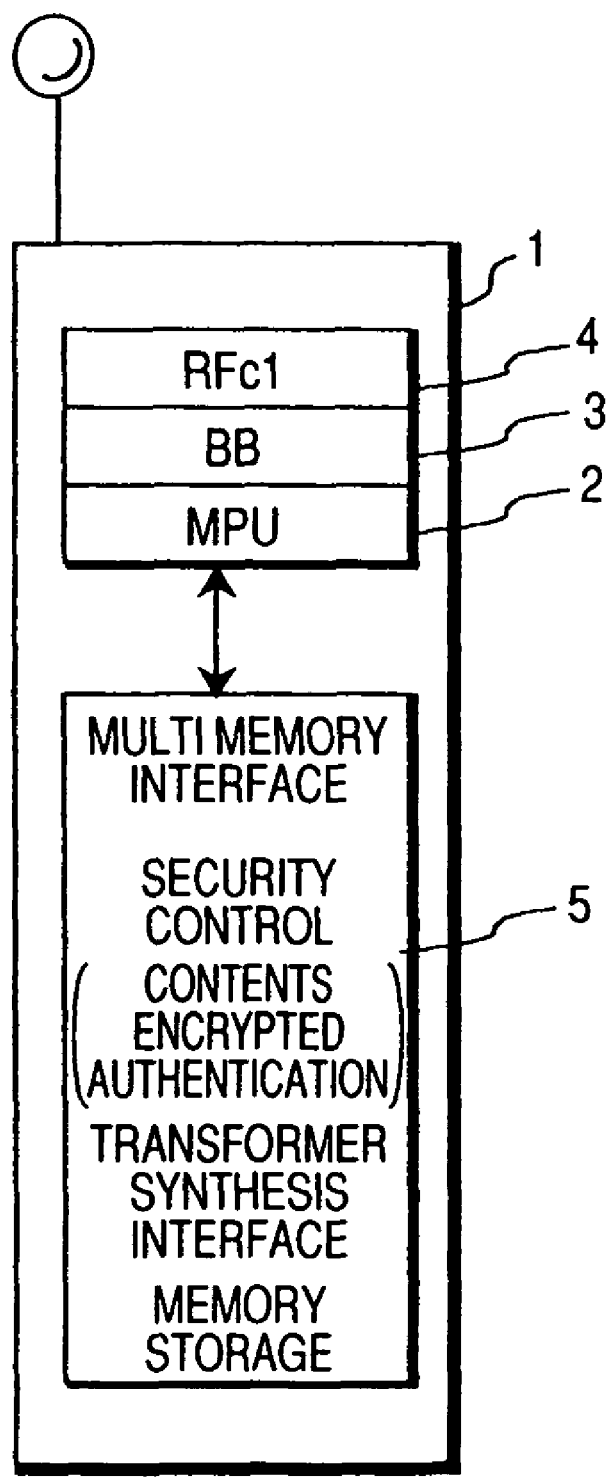
FIG. 1 is an outline explanatory drawing of communication personal digital assistant devices, such as a pocket telephone which applied MFMC concerning an example of the present invention.

The outline of communication personal digital assistant devices which applied the multifunction memory card concerning an example of the present invention, such as a pocket telephone, is shown in FIG. 1. Communication personal digital assistant device 1 has, for example, microprocessor (MPU) 2 which controls the whole system, baseband processing part (BB) 3 which performs the baseband process of modulation, demodulation, etc. for mobile communications, radio frequency head (RFcl) 4 which performs transmission and reception by regular high frequency, and multifunction memory card (MFMC) 5. The attachment and detachment of MFMC 5 to the card slot which omits illustration of communication personal digital assistant device 1 are enabled. MPU 2 is positioned as a card host for MFMC 5.

MFMC 5 has a memory storage function to memory storage, a multi-memory interface function to memory storage, security processing functions, such as a contents data encryption and a decoding process, and user authentication, a non-contact interface function, etc., for example. Hereafter, these functions and the technology accompanying it are explained in full detail.

<<Versatility Over a Card Standard>>

Figure 2:
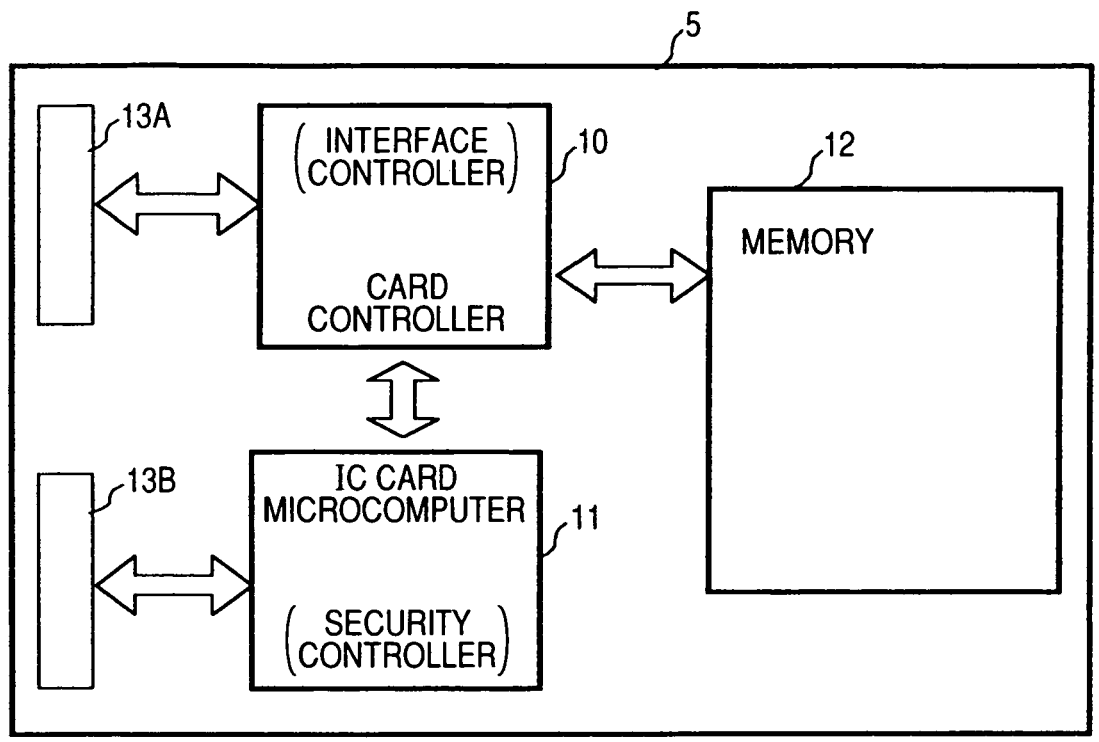
FIG. 2 is a block diagram which exemplifies the structure of MFMC.

The structure of MFMC 5 is exemplified by FIG. 2. About MFMC 5, a plurality of semiconductor chips are mounted on the wiring substrate on which a plurality of external connection terminals 13A and 13B were formed, one semiconductor chip includes interface controller 10 connected to the external connection terminal 13A, and another semiconductor chips include one piece or a plurality of memories 12 which were connected to the interface controller 10. It has IC card microcomputer 11 as a security controller which comprised an another semiconductor chip from the interface controller 10. The IC card microcomputer 11 is connected to the interface controller 10 and external connection terminal 13B. Although not illustrated in particular, the IC card microcomputer 11 may include the same semiconductor chip as the interface controller 10.

The interface controller 10 has a plurality of interface control modes, and controls an external-interface action, and the memory interface action to memory 12 by the control mode according to the instruction from the outside. Although not restricted in particular, about the interface control mode that MFMC 5 has, let it be each memory card interface mode of MMC, HS-MMC, an SD card, and a memory stick. The each memory card interface mode is based on the interface specification of each simple substance memory card. For example, interface controller 10 realizes the function of the memory card controller which supports the interface specification of these memory cards by program control (partly by hard wired logic, the writing to a ROM memory, etc.). Therefore, it is good if you do not want to support specific memory card interface specification, and the control program to it is not held. Or the action should just be made impossible by the nonvolatile control bit etc. It is also possible by adding a control program to interface controller 10 by download through a network etc. afterwards to support necessary memory card interface specification later. If execution of a predetermined control program is forbidden by the license information acquired via the network, predetermined memory card interface specification can also be made into usage impossible afterwards. The function of the interface controller 10 is considered as recognition of the memory card interface control mode which responds the command exchanged with the outside via an external connection terminal, and the condition of a bus, the change of the bus width which responds the recognized memory card interface control mode, the data format conversion which responds the recognized memory card interface control mode, a power-on-reset function, interface control with IC card microcomputer 11, interface control with memory 12, power-supply-voltage conversion, etc.

Let external connection terminal 13B be a dedicated terminal of IC card microcomputer 11. The IC card microcomputer 11 performs a security process according to the signal state of the external terminal 13B, or the action command given from interface controller 10. The IC card microcomputer 11 can also perform a security process via the non-contact interface function by transformer coupling etc. An external terminal, a signaling protocol, a command, etc. of IC card microcomputer 11 are based for example, on ISO/IEC7816 standard.

Figure 3:
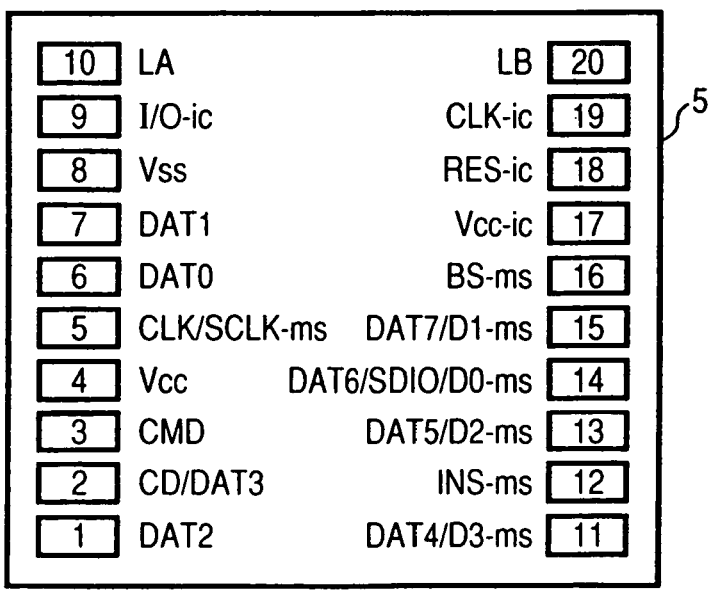
FIG. 3 is an explanatory drawing showing an example of the external terminal of MFMC.

An example of external terminals 13A and 13B of MFMC 5 is shown in FIG. 3. It has an external connection terminal of #1-#20 as external terminals 13A and 13B. DATA2 is a data terminal, CD/DAT3 is card detection/data terminal, CMD is a command input terminal, Vcc is a power supply terminal, is a clock input terminal, DAT0 is a data terminal, Vss is an earthing terminal of a circuit, I/O-ic is an input/output terminal only for an IC card microcomputer, LA and LB are external antenna connection terminals, DAT4/D3-*ms* is a data terminal, INS-ms is a terminal for insertion-and-drawing-out detection, DAT5/D2-*ms* is a data terminal, DAT6/SDIO/D0 is a data terminal, DAT7/D1-*ms* is a data terminal, BS-ms is a bus status terminal, Vcc-ic is a power supply terminal only for an IC card microcomputer, CLK-ic is a clock input terminal only for an IC card microcomputer, etc. It means that suffix ic given to the terminal name is a terminal for IC card microcomputers, and means that suffix ms is a terminal for memory sticks.

Figure 4:
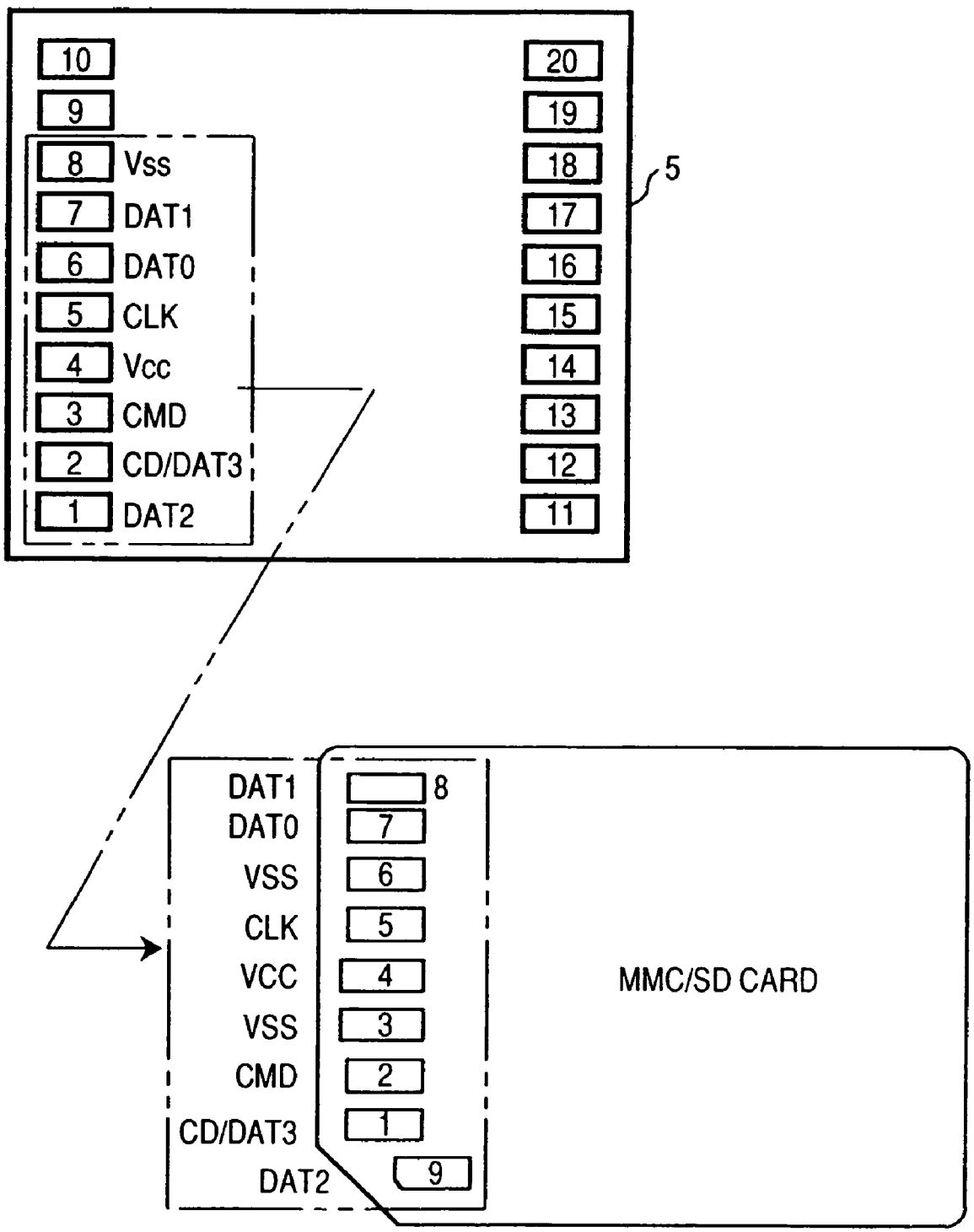
FIG. 4 is an explanatory drawing which exemplifies the external connection terminal validated when realizing the interface function of an SD card or MMC by MFMC, and the corresponding terminal of an SD card.

The external connection terminal validated when realizing the interface function of an SD card or MMC by MFMC 5, and the corresponding terminal of an SD card are exemplified by FIG. 4. Here, the case in an SD mode or MMC mode is shown, when it is an SD mode, 1-bit data terminal DAT0 or 4-bit data terminals DAT0-DAT3 perform a data input output, and command terminal CMD performs a command input. In the case of MMC mode, a data input output is performed at 1 bit of data terminal DAT0, command terminal CMD performs a command input, and terminal CD/DAT3 is made non connection. In the case of SPI mode, there is no distinction of MMC and an SD card, terminal CD/DAT3 is used as a chip-select terminal, terminal CMD is used as a data input and command input terminal, and terminal DAT0 is used as a data-out and command responded output terminal.

Figure 5:
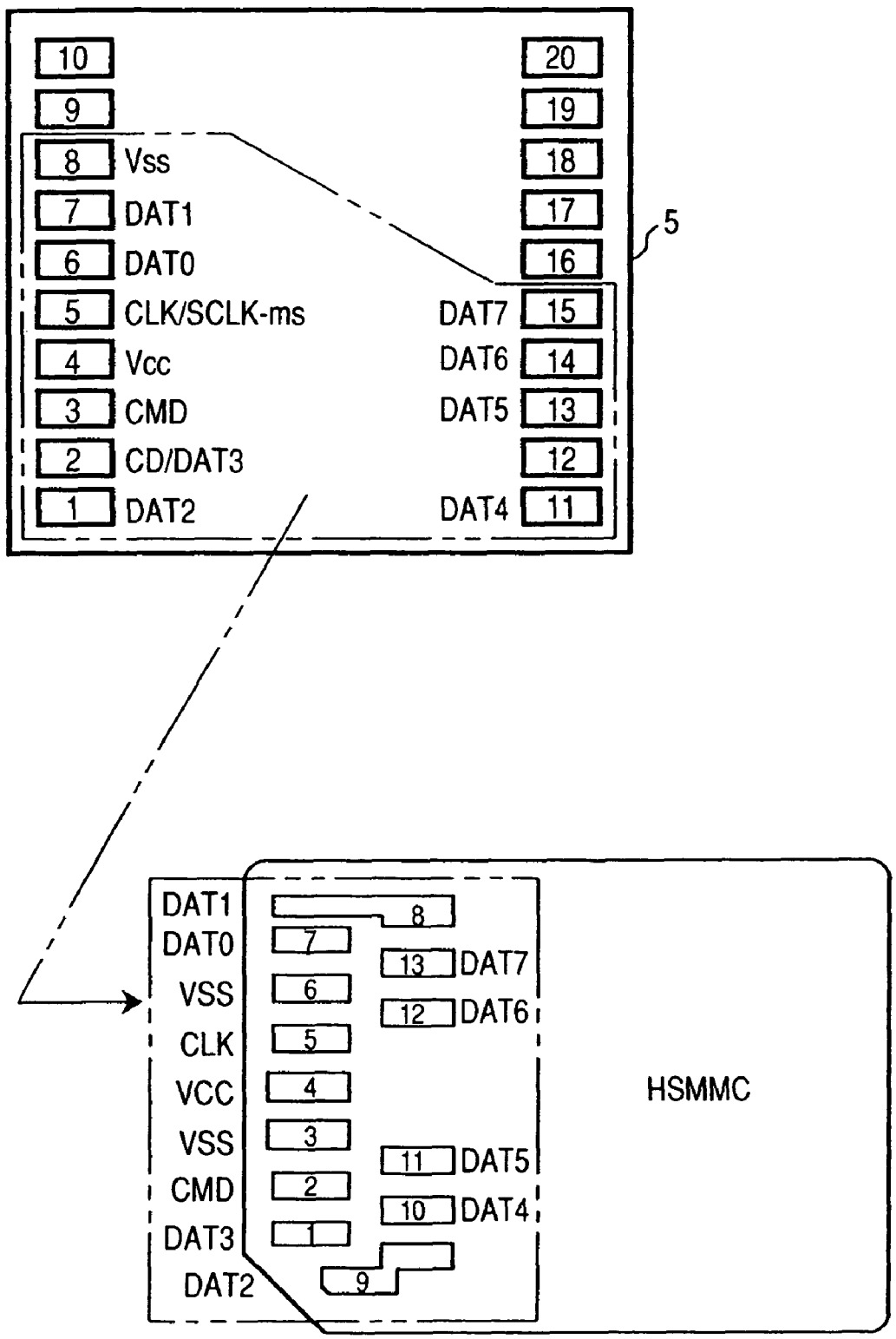
FIG. 5 is an explanatory drawing which exemplifies the external connection terminal validated when realizing the interface function of HSMMC by MFMC, and the corresponding terminal of a HSMMC card.

The external connection terminal validated when realizing the interface function of HSMMC by MFMC 5, and the corresponding terminal of a HSMMC card are exemplified by FIG. 5. 1-bit data terminal DAT0, 4 bits data terminals DAT0-DAT3, or 8-bit data terminals DAT0-DAT7 perform a data input output, and it performs a command input with command terminal CMD. HSMMC is positioned as an extended specification which increased the parallel data I/O bit number to MMC mode. Let the data bus of an SD card, MMC, and HSMMC be a pull-up system bus like an open drain bus.

Figure 6:
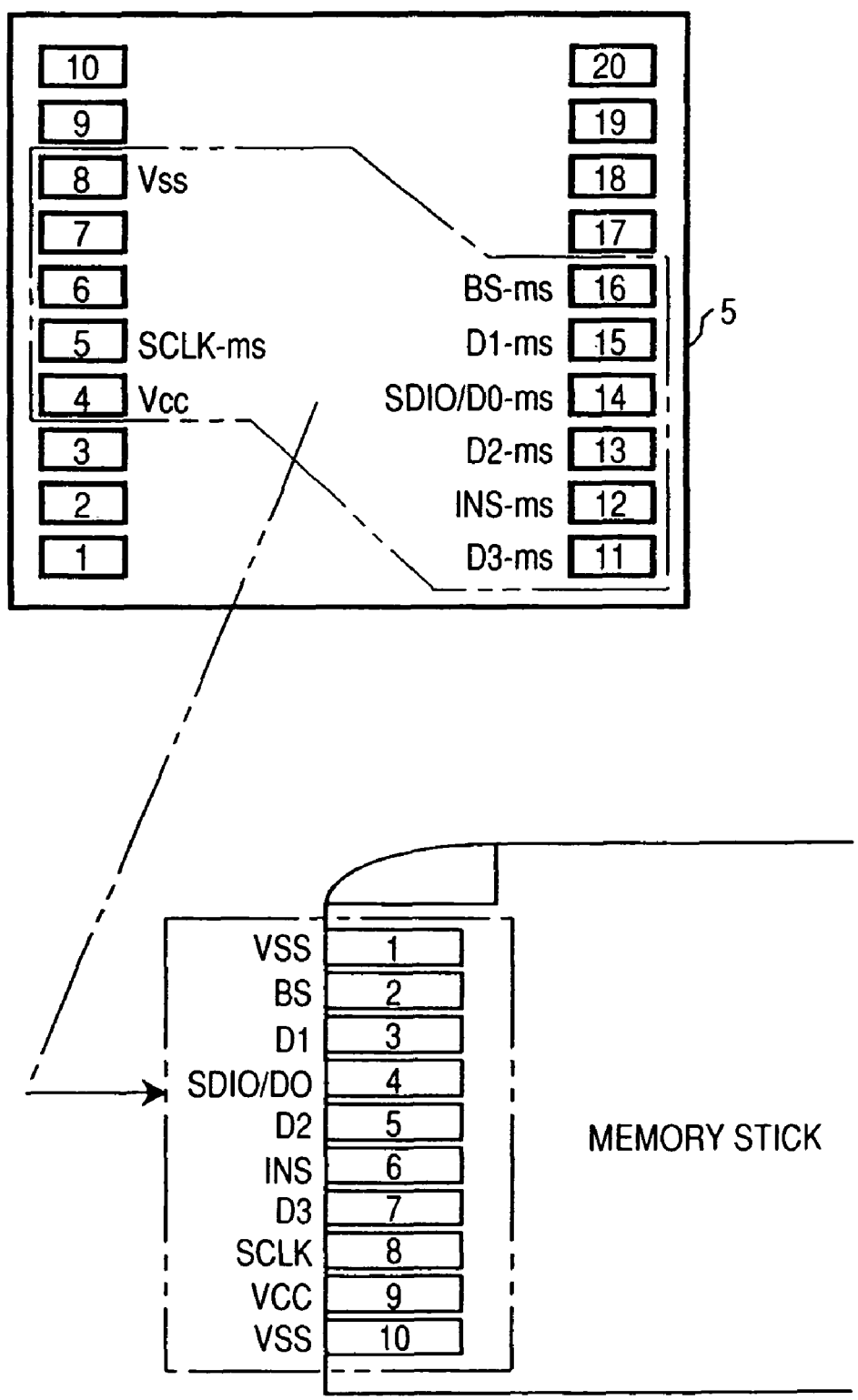
FIG. 6 is an explanatory drawing which exemplifies the external connection terminal validated when realizing the interface function of a memory stick by MFMC, and the corresponding terminal of a memory stick.

The external connection terminal validated when realizing the interface function of memory stick Pro by MFMC 5, and the corresponding terminal of memory stick Pro are exemplified by FIG. 6. A data input output, a command input, etc. are performed by 4-bit data terminal D0-*ms*-D3-*ms*. Let the bus of memory stick Pro be a pulldown system bus. Since data terminal DAT4/D3-*ms*, DAT5/D2-*ms*, DAT6/SDIO/D0-*ms*, and DAT7/D1-*ms* are connected to 3 state output buffer in the inside of MFMC 5, as shown in FIG. 5 and FIG. 6, these terminals can respond to the both sides of pull-up system bus specification and pulldown system bus specification. Terminal common use is possible about implementation of the interface mechanism of the memory stick which is 1-bit bus specification.

Figure 7:
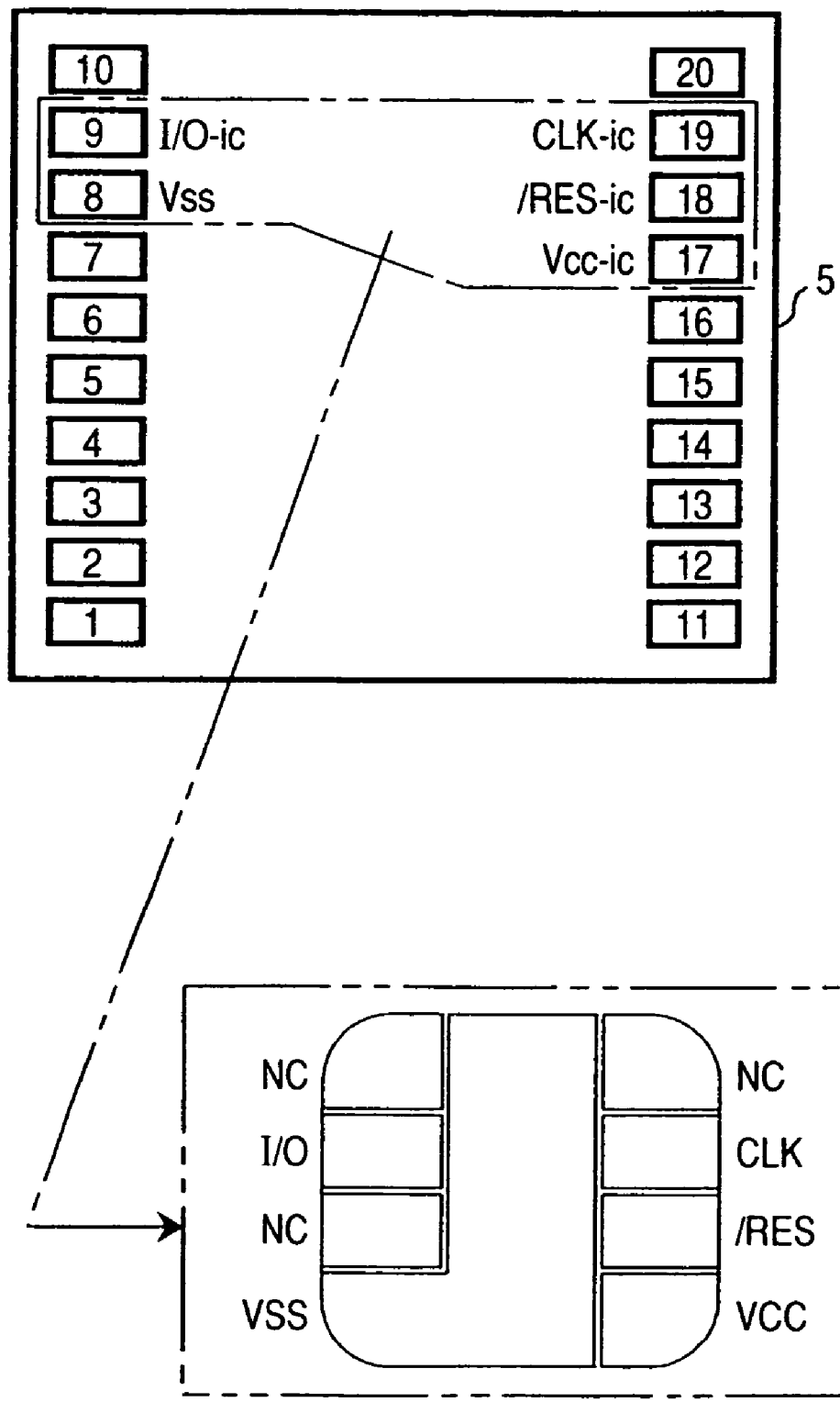
FIG. 7 is an explanatory drawing which exemplifies the external connection terminal validated when realizing the contact interface function of an IC card microcomputer by MFMC, and the corresponding terminal of an IC card microcomputer.

The external connection terminal validated when realizing the contact interface function of an IC card microcomputer, and the corresponding terminal of an IC card microcomputer are exemplified by FIG. 7. An IC card microcomputer dedicated terminal is used except for earthing terminal Vss of a circuit. An IC card microcomputer has power on reset and a system reset, the former is directed by powering on to power supply terminal Vcc-ic, and the latter is directed with the low level of a reset signal/RES. The former may perform data holding to some of register of an IC card microcomputer etc. For example, in order to realize compulsive reset to the no response of a system, a hang-up, etc., in initializing thoroughly, power on reset is needed. I/O of data and a command is performed using 1-bit data terminal I/O.

Figure 8:
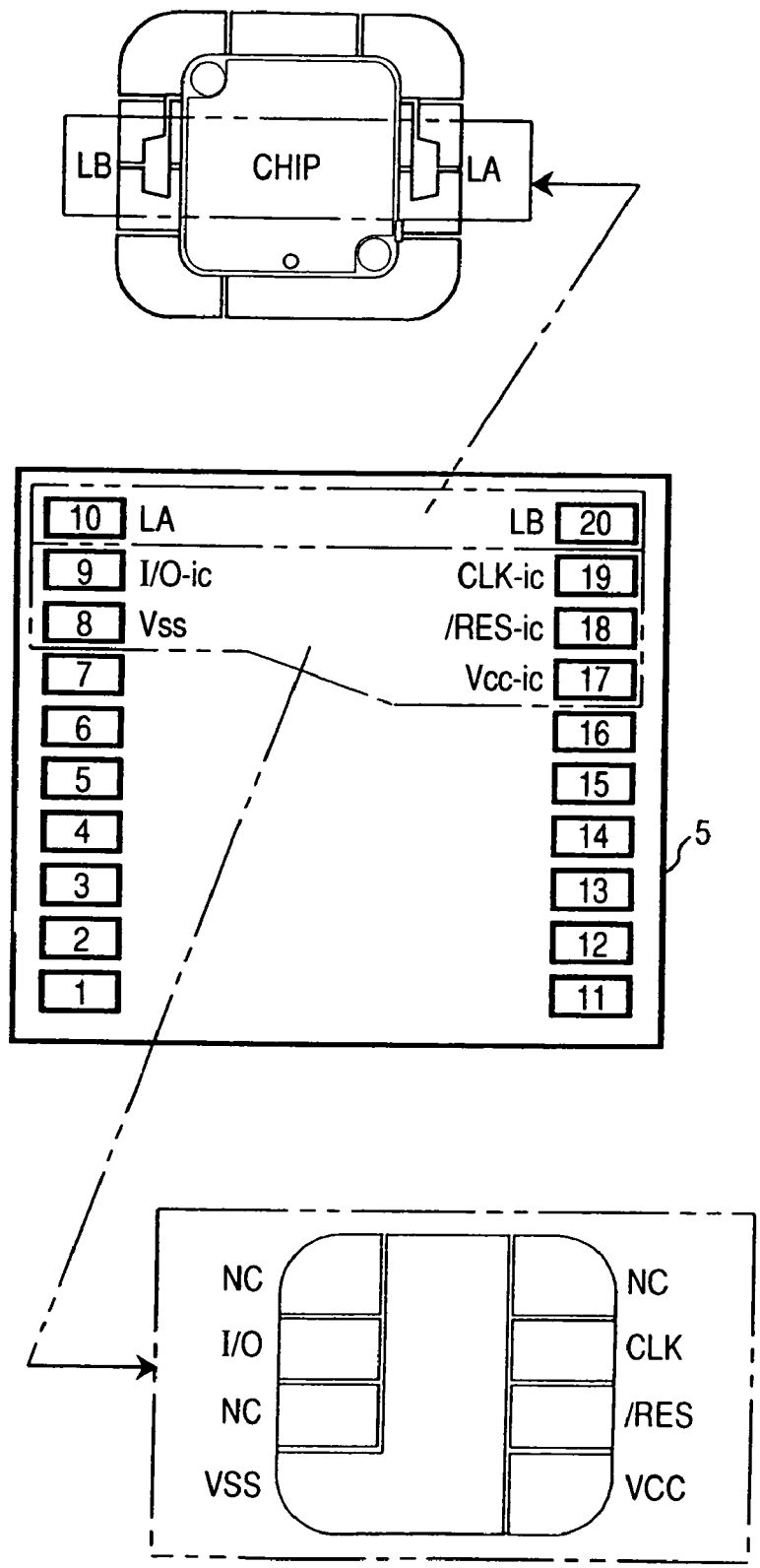
FIG. 8 is an explanatory drawing which exemplifies the external connection terminal validated when realizing the contact and non-contact interface function of an IC card microcomputer by MFMC, and the corresponding terminal of an IC card microcomputer.

The external connection terminal validated when realizing the contact interface and non-contact interface function of an IC card microcomputer, and the corresponding terminal of an IC card microcomputer are exemplified by FIG. 8. Antenna terminals LA and LB are increasing in number compared with FIG. 7. An external antenna is selectively connected to antenna terminals LA and LB. Other terminals are the same as FIG. 7.

If the example of FIG. 3 through FIG. 6 is followed, external connection terminal 13A will be classified into the individual terminal individualized every interface control mode, and the common terminal communalized for every interface control mode of MFMC 5. The common terminal contains clock input terminal CLK/SCLK-ms, power supply terminal Vcc, and earthing terminal Vss. As the individual terminal, there are data terminal D1-*ms*, D0-*ms*, D2-*ms*, D3-*ms* and bus status BS-ms for memory sticks, and data terminals DAT0-DAT3 and command terminal CMD for MMC/SD cards, for example.

Both sides of a guarantee of the reliability of an interface and suppressing increase of physical magnitude can be satisfied by partial communalization and partial individualization of an external connection terminal to some kinds of interface control modes.

If the example of FIG. 7 and FIG. 8 is followed, terminal I/O-ic, CLK-ic, RES-ic, Vcc-ic, LA, and LB for the IC card microcomputers will be thoroughly individualized with another terminals. About a security process, it can guarantee interfacing by IC card microcomputer 11 independent one. Recognition of MPU 2 as an external card host is independently attained in IC card microcomputer 11 by the signal state to the dedicated terminal for IC card microcomputer 11.

MPU 2 as a card host tends to perform recognition and initialization of a memory card according to the specification of the memory card which oneself supports, and it tends to access a memory card using the command of the system suitable for the specification. MFMC 5 must recognize with which memory card interface specification an interface action should be carried out to the instruction from MPU 2. The recognition sequence of the interface control mode is exemplified by FIG. 9.

If operation power is supplied to MFMC 5 inserted in terminal unit 1 (S1), power on reset of card controller 10, IC card microcomputer 11, and the memory 12 will be performed, and they will be initialized (S2). Then, MFMC 5 is made into a standby state and it waits for the instruction from MPU 2 (S3). In this standby state, a terminal indispensable for a system is changed into the condition that it can input, in the input terminal or input/output terminal of external terminals 13A and 13B of MFMC 5, for example, and it is made possible to judge that request in response to the output from MPU 2. Concretely, it waits for the input of the IC card command to input/output terminal I/O-ic assigned to the direct interface of IC card microcomputer 11 the first. It waits for the input of the initialize command to the range of data terminals DAT0-DAT7 assigned to the interface of the memory card system of an SD card and MMC the second. It waits for feeding of the grounding electric potential to terminal INS-ms assigned to card insertion-and-drawing-out detection of a memory stick the third. In a memory stick, terminal INS-ms is connected to the earthing terminal of a circuit inside, in the card host side, pull-up of the connection path of terminal INS-ms is performed, and insertion of a memory stick is detected by detecting level lowering of the path concerned. By detecting that the current from the outside to a pull-up resistor flows into terminal INS-ms, MFMC 5 judges with the interface control mode of a memory stick being demanded.

If issuance of the IC card command, issuance of the initialize command for memory card mode setting (memory card initialize command) or the current supply to terminal INS-ms occurs is performed from MPU2, MFMC 5 recognizes the interface control mode according to each (S4), it returns a response to MPU 2 if needed, and performs a necessary interface action (S5).

For example, when the memory card initialize command of an MMS and SD card system is published, in the process of step S4, MFMC 5 repeats the process which the command supplied one by one as an initialize command is decoded, and returns the response to a decoded result to MPU 2 several times, and recognizes any of an SD card, MMC, and HSMMC is the classification of the memory card which MPU 2 requires, and the recognition result is returned to MPU 2. After card recognition is established, memory card initializing processes, such as address assignment according to MMC mode, an SD mode, SPI mode, etc., are performed. By this, MFMC 5 is made into a ready condition in the control program which realizes the interface control mode of an SD card, MMC, or HSMMC, and performs interface action and memory operation by responding a subsequent access command.

For example, if the current supply to terminal INS-ms is detected, MFMC 5 will be made into a ready condition in the control program which realizes the interface control mode of a memory stick, and will perform interface action and memory operation by responding to a subsequent access command.

For example, if an IC card command is issued to terminal I/O-ic, an IC card microcomputer will perform the security process which responds to the command. Although not restricted in particular, when MFMC 5 operates as an IC card microcomputer, the connection between IC card microcomputer 11 and interface controller 10 is separated. Or connection between external connection terminal 13A and interface controller 10 is separated. This isolation control takes the safety of a security process into consideration, IC card microcomputer 11 performs it, and dissolution of that separation state is enabled by an IC card command.

What is necessary is just to recognize by the same approach as the specification of various memory cards about the former. For example, when recognizing as MMC/an SD card, MPU 2 as a card host should just make MFMC 5 recognize required interface specification by controlling the condition of card detection terminal CD. What is necessary is just to use terminal INS-ms for insertion-and-drawing-out detection in the case of a memory stick.

What is necessary is just to cope with it like the above as well as terminal I/O-ic to the IC card command sent via the non-contact interface concerned, if the non-contact interface of IC card microcomputer 11 can be operated. When supporting the both sides of a contact interface and a non-contact interface, an IC card microcomputer is also enabled to set one of interface functions as prohibition of an action by the predetermined IC card command or priority judging of operation.

Figure 10:
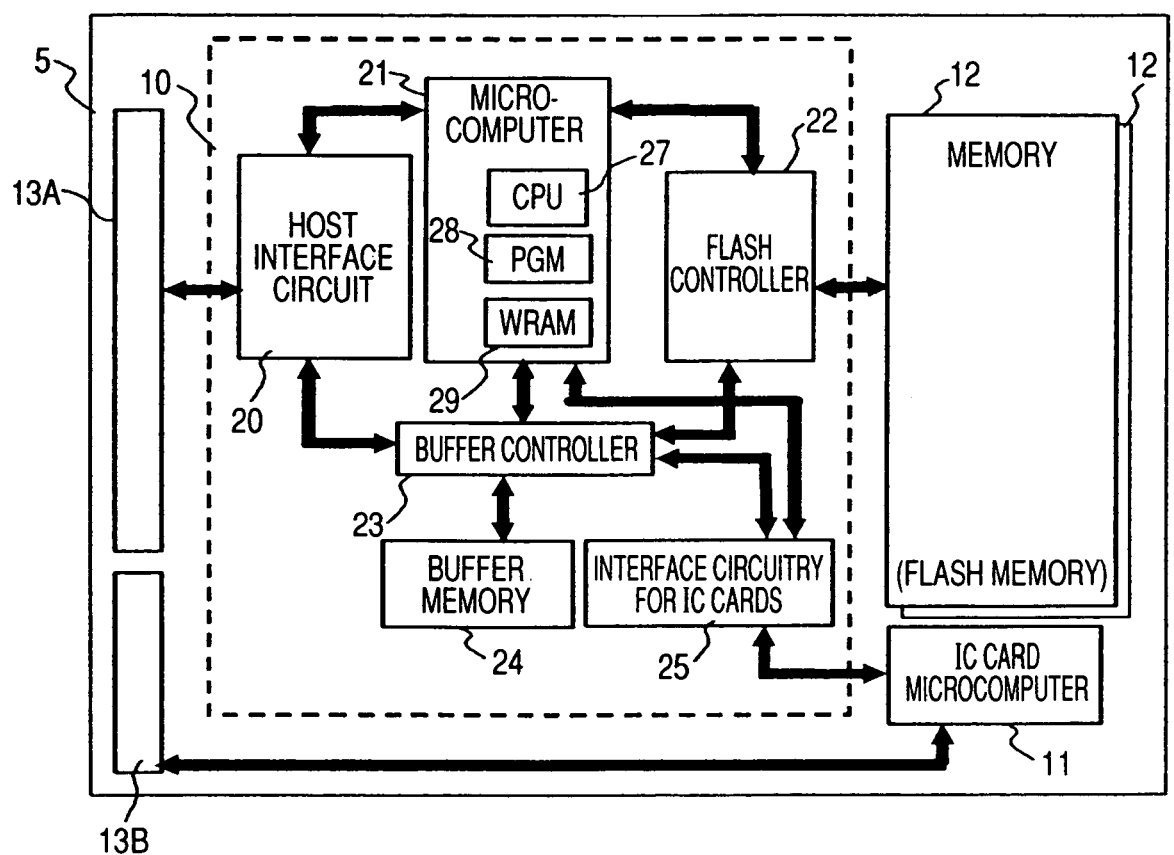
FIG. 10 is a block diagram which exemplifies the detail of an interface controller.

The detail of interface controller 10 is exemplified by FIG. 10. The memory 12 includes the flash memory which is a nonvolatile memory in which erasure and writing are possible electrically, for example. Although not illustrated in particular, the memory 12 has a nonvolatile memory cell transistor (it is described also as a flash memory cell) in which erasure and writing are electrically possible. Although not illustrated in particular, a flash memory cell has what is called stacked gate structure that has a floating gate, or what is called split gate structure that comprises the memory transistor part provided with the ONO (oxide/nitride/oxide) gate insulating film, and a selection transistor part. In the flash memory cell, if an electron is poured into the floating gate etc., threshold voltage will rise, and if an electron is drawn out from the floating gate etc., threshold voltage will fall. The flash memory cell will memorize the information according to the height of threshold voltage to the word line voltage for data read. Although not restricted in particular, in the specification, the condition that the threshold voltage of a memory cell transistor is low is called an erase state, and the high condition is called a write state.

Interface controller 10 comprises host interface circuit 20, microcomputer 21, flash controller 22, buffer controller 23, buffer memory 24, and interface circuitry 25 for IC cards. Buffer memory 24 comprises DRAM (Dynamic Random Access memory) or SRAM (Static Random Access Memory). IC card microcomputer 11 is connected to interface circuitry 25 for IC cards. Microcomputer 21 includes CPU (central processing unit) 27, program memory (PGM) 28 which holds the operation program of CPU 27, work memory (WRAM) 29 used for the work region of CPU 27, etc. PGM 28 holds the control program of the interface control mode corresponding to the SD card, MMC, HSMMC, and memory stick.

Figure 9:
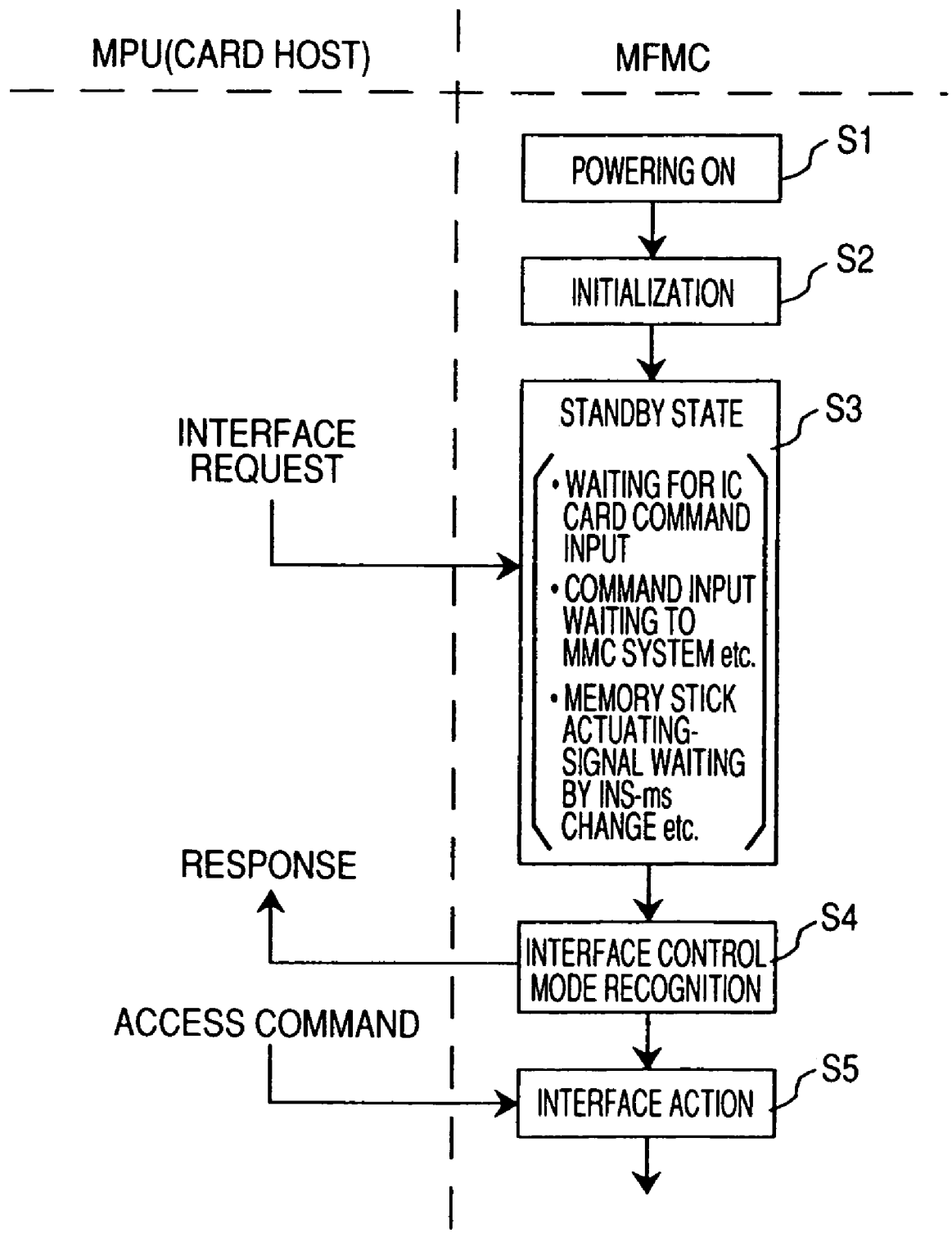
FIG. 9 is a flowchart in which the recognition procedure of the interface function by MFMC is shown.

If it detects the issuance of the memory card initialize command or the current supply to terminal INS-ms explained by FIG. 9, host interface circuit 20 makes the control program of the interface control mode corresponding to microcomputer 21 executable by interruption. Microcomputer 21 controls the external-interface action by host interface circuit 20, controls access (write in, erasure, and read operation) and a data management to memory 12 by flash controller 22, and controls the format conversion between a data format indigenous to a memory card and the common data format over a memory by buffer controller 23 by executing the control program.

The data read from memory 12 or the data written in memory 12 are held temporarily at buffer memory 24. Flash controller 22 operates memory 12 as a file memory compatible with a hard disk, and manages data by a sector unit.

When interface controller 10 is controlled by a necessary memory card interface control mode, interface circuitry 25 for IC cards performs conversion of data and a control signal required when operating IC card microcomputer 11 according to the IC card command from MPU 2. The flash controller 22 is provided with the ECC circuit which omits illustration, adds an ECC code on the occasion of the data storing to a memory, and performs the selection error-detection-correction process by an ECC code to read data.

Figure 11:
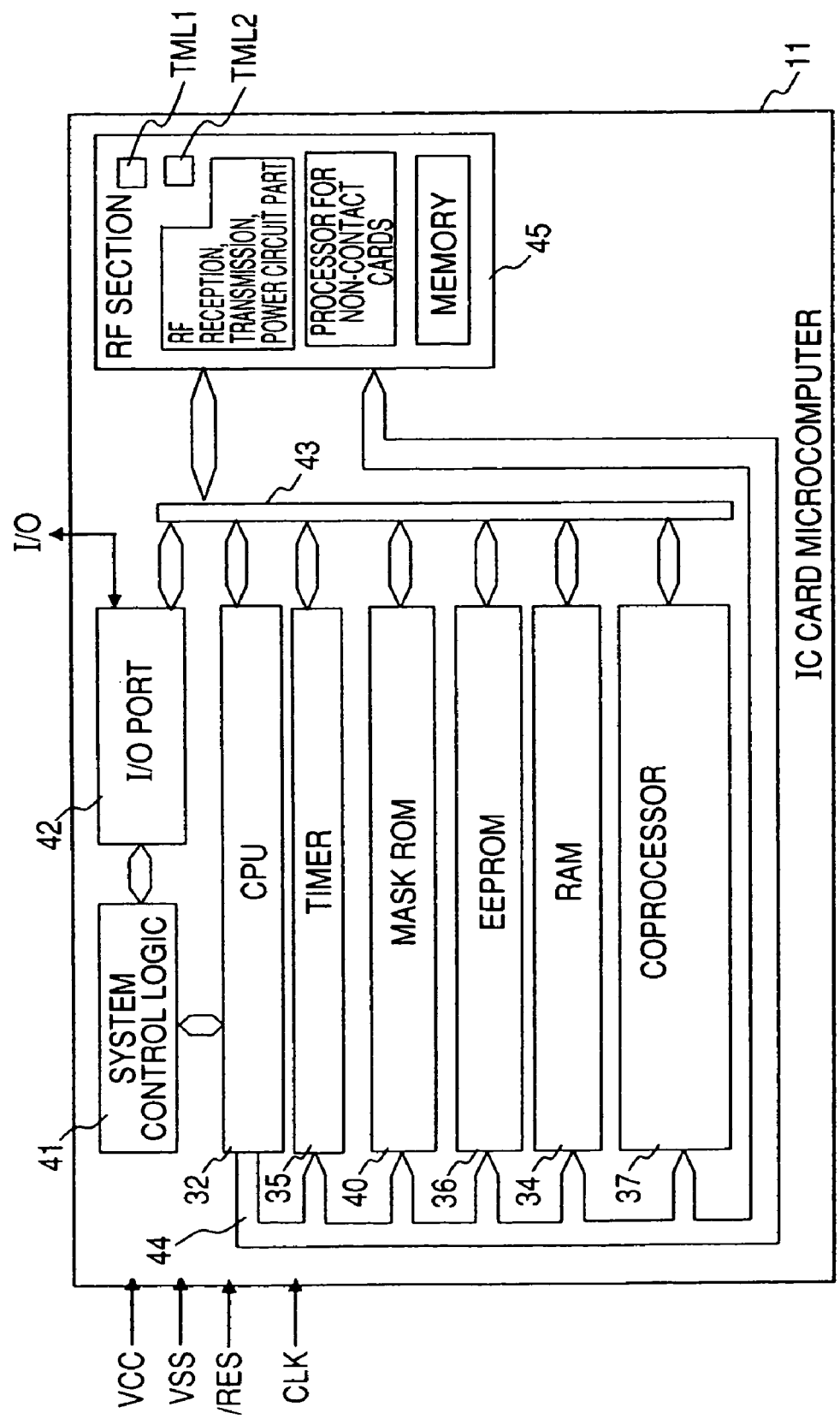
FIG. 11 is a block diagram which exemplifies the detail of an IC card microcomputer.

The detail of IC card microcomputer 11 is exemplified by FIG. 11. IC card microcomputer 11 has CPU 32, RAM (Random Access Memory) 34 as work RAM, timer 35, EEPROM (Electrically Erasable and Programmable Read Only Memory) 36, coprocessor unit 37, mask ROM (Read Only Memory) 40, system control logic 41, an input/output port (I/O port) 42, data bus 43, address bus 44, and RF section 45.

The mask ROM 40 is used for storing of the operation programs (an enciphering program, a decoding program, an interface control program, etc.) of CPU32, and data. The RAM 34 is a work region of CPU 32, or a temporary storage of data, for example, comprises SRAM (Static RAM) or DRAM (Dynamic Random Access Memory). When an IC card command is supplied to I/O port 42, system control logic 41 decodes this and makes CPU 32 execute a processing program required for execution of the command concerned. That is, CPU 32 fetches a command accessing mask ROM 40 in the address directed from system control logic 41, decodes the fetched command, and performs operand fetch and data operation based on a decoded result. Coprocessor unit 37 performs the remainder arithmetic process in RSA or elliptic curve code operation etc. according to control of CPU32. I/O port 42 has 1-bit input/output terminal I/O, and is used for both of I/O of data, and input of an external interrupt signal. I/O port 42 is combined with data bus 43, and the CPU 32, RAM 34, timer 35, EEPROM 36, coprocessor unit 37, etc. are connected to data bus 43. System control logic 41 performs control of an operation mode and interruption control of IC card microcomputer 11, and has the random-number-generation logic further used for formation of a cryptographic key. As for IC card microcomputer 11, if a reset action is directed by reset signal/RES, an inside will be initialized and CPU 32 will start an instruction execution from the head address of the program of EEPROM 36. Synchronous operation of the IC card microcomputer 11 is performed to clock signal CLK.

As for the EEPROM 36, erasing processing and a write-in process are enabled electrically, and it is used as a region which stores the data of ID information, an authentication certificate, etc. which are used in order that an individual is specified. A flash memory or a ferroelectric memory may be adopted instead of EEPRPM 36. IC card microcomputer 11 supports the both sides of the contact interface using an external connection terminal, and the non-contact interface using an antenna to an interface with the outside. RF section 45 for performing a non-contact interface has antenna terminal TML1 and TML2 of a chip. If electric power is supplied from the RF section via an antenna or a non-contact interface is chosen by system control logic 41 via an internal bus, RF section 45 outputs power supply voltage Vcc by using as operation power the induced e.m.f. produced when the antenna crosses predetermined electromagnetic waves (for example, the fluctuating flux of magnetic induction of high frequency and a microwave), generates each of internal clock signal CLK based on the induced current produced corresponding to the frequency of this predetermined electric wave, the internal data which separated the data received and passed lapping with this predetermined electric wave by RF section 45, and further reset signal/RES, and performs output and input of information by non-contact from an antenna. As for RF section 45 which operates via a non-contact interface, in the inside of IC card microcomputer 11, it is preferred to include a small-scale circuit which became independent in CPU 32 for an IC card action which operates via a contact interface. As RF section 45, a circuit required for a non-contact card action, for example, the processor for non-contact cards, the memory used for the control-program region and work region of the processor concerned, and an RF transmission-and-reception and power-source circuit part, is formed in the inside. Thus, since RF section 45 comprises a small-scale circuit which became independent like a processor function and its control program, it becomes easy to operate a circuit according to the induced e.m.f. from the outside also in the environment where the power supply through a contact terminal is not obtained. RF section 45 can also output and input data between a non-contact card and a contact card by going via an internal data bus and an internal address bus.

Figure 12:
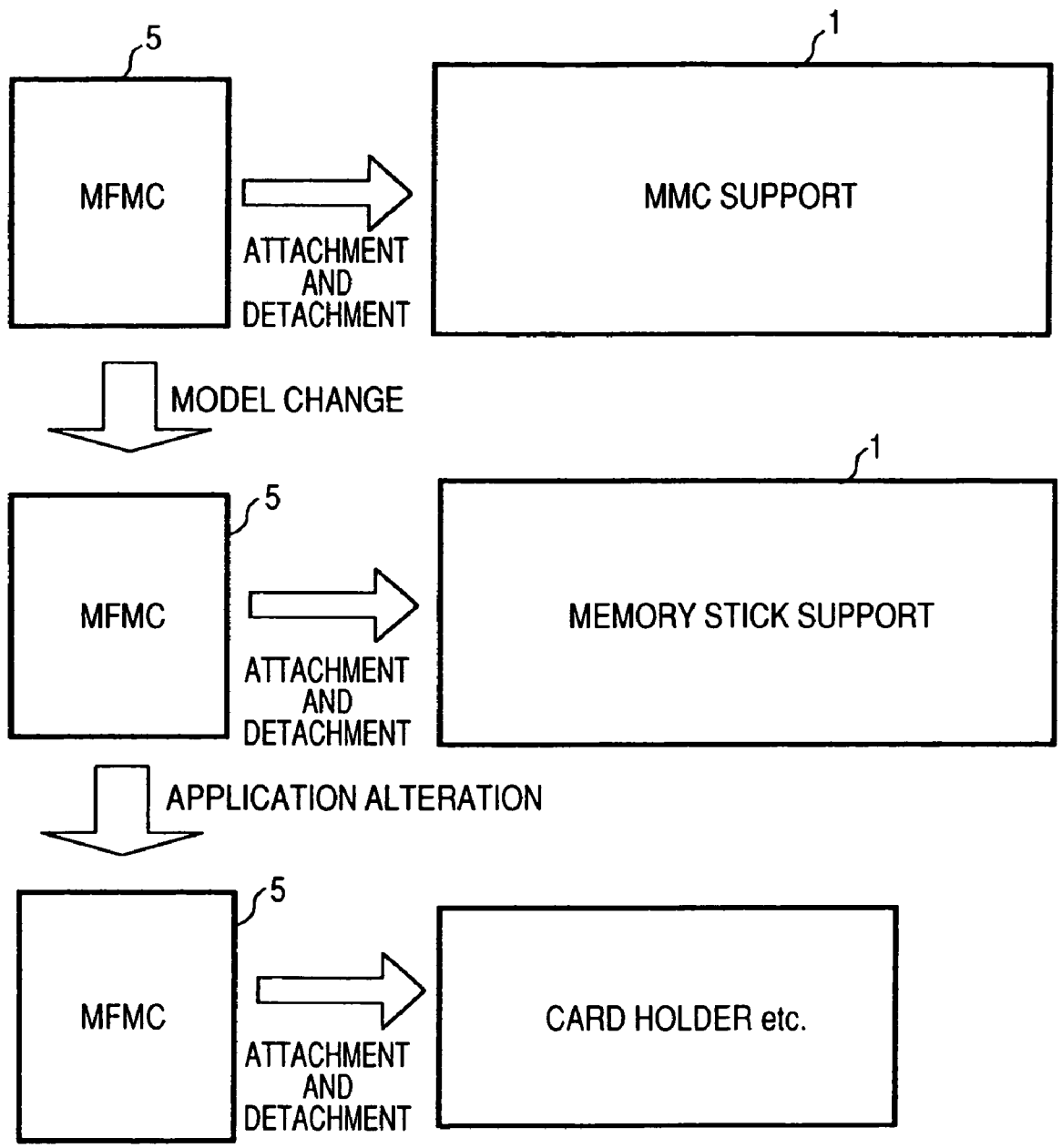
FIG. 12 is an explanatory drawing showing some applications over MFMC.

Some applications over the MFMC 5 are shown in FIG. 12. First, the case where MFMC 5 is operated as a memory card is explained. Communication personal digital assistant device 1 has a function which can access a memory card according to the predetermined memory card specification. For example, it is assumed that communication personal digital assistant device 1 has acquired the license for using MMC. According to this, MPU 2 has a function which accesses MMC according to the specification of MMC. If the card socket of communication personal digital assistant device 1 is equipped with MFMC 5 and a power source is switched on, MPU 2 will issue the initialize command of an MMC stipulation to MFMC 5, recognize the card waiting for the response to it, and initialize. MFMC 5 is made executable in the control program of an MMC interface control mode, in response to the fact that the initialize command of MMC was issued. Hereby, MFMC 5 operates as MMC, and contents data etc. are incorporated into memory 12. The format of the data stored in memory 12 is made into the data format proper to MFMC 5.

What is necessary is to remove MFMC 5, when changing the model of communication personal digital assistant device 1, and just to equip communication personal digital assistant device 1 of a new model. For example, it is assumed that communication personal digital assistant device 1 of a new model has acquired the license for using a memory stick. According to this, MPU 2 built in communication personal digital assistant device 1 of a new model outputs the signal for detecting wearing of a memory stick toward terminal INS-ms of card 5, MFMC 5 is made executable by this in the control program of a memory stick interface control mode, and it operates with the card interface of memory stick conformity by it. Hereby, MFMC 5 reads the contents data previously incorporated into the memory in the MMC action to another terminal unit 1 in a memory stick action, and it becomes available. Thus, it becomes possible to deal with versatility to a card host's model change.

MFMC 5 can also be used changing a card interface by the PCMCIA adapter, the USB adapter, Bluetooth adapter, etc. It is also possible by connecting an external non-contact antenna to use it like a conventional RF-IC card.

<<Security Process>>

Explanation of operation is given about the security process in MFMC 5. For example, user identification information is stored in the secure region of memory 12. When downloading contents data, the license information enciphered considering user identification information as a secret key is downloaded together. The decoding key for decoding contents data is contained in license information, and license information is decoded using user identification information for a decoding key. This performs copyright protection to contents data. This security process is performed by the program control by microcomputer 21.

The security process with IC card microcomputer 11 is explained. For example, IC card microcomputer 11 has realized the attested function by assessment and the authentication authority of ISO/IEC15408 available to electronic banking service etc. On condition that a predetermined authentication certificate is held, the authentication certificate is sent when there is an authorization request from a host, and authorization is acquired to this, the consecutive communications processing of EEPROM 36 is made possible. Mask ROM 40 holds the operation program of such a security process. As for the authenticating processing with IC card microcomputer 11, it is more desirable from the viewpoint of security to carry out in the environment closed to IC card microcomputer 11 inside. There is meaning of assigning external connection terminal 13B for exclusive use to IC card microcomputer 11 at this point. When there is no problem of security on an application or technically, performing a security process via interface controller 10 does not interfere. In the process from after manufacture of MFMC 5 to product shipment, various application software and a card issuing process can be easily written in IC card microcomputer 11 via external connection terminal 13B.

For example, when IC card microcomputer 11 is ending with authorization by assessment and the authentication authority of ISO/IEC15408 available to electronic banking service etc. like the above, as exemplified in FIG. 12, MFMC 5 is inserted in card holders, such as an ATM card, a credit card, or a commuter pass, and it becomes possible to realize these cards function using a non-contact interface.

<<Power on Reset of an IC Card Microcomputer>>

Figure 13:
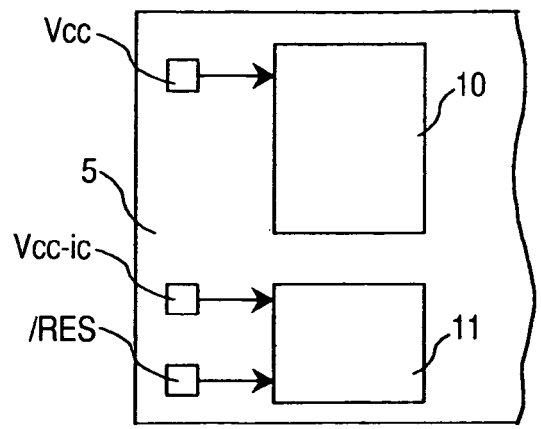
FIG. 13 is a block diagram showing the first example of the power-on-reset mechanism over IC card microcomputer 11.

If it takes into consideration that IC card microcomputer 11 is used for high-level security processes, such as electronic banking, the power on reset which initializes all the internal states to the unusual condition of IC card microcomputer 11 has high possibility of being frequently carried out compared with interface controller 10 etc. Since external power source terminal Vcc-ic for exclusive use explained by FIG. 7 and FIG. 8 is provided in IC card microcomputer 11 as an outline is shown in FIG. 13 if this is taken into consideration, power on reset becomes possible freely by IC card microcomputer 11 independent one, without resetting the MFMC 5 whole. Hereby, the user-friendliness of MFMC 5 can be improved, guaranteeing security.

Figure 14:
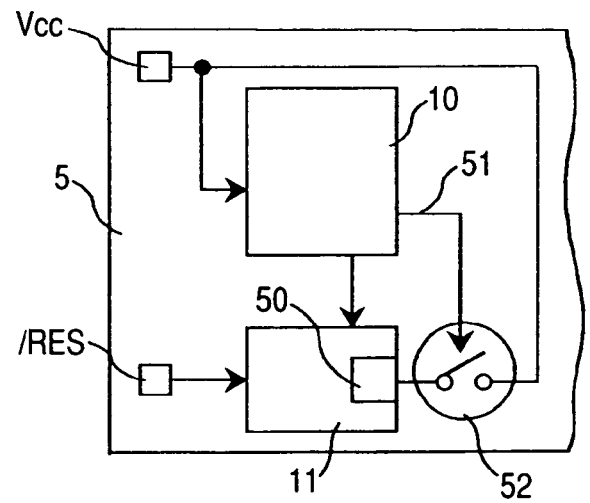
FIG. 14 is a block diagram showing the second example of the power-on-reset mechanism over IC card microcomputer 11.
Figure 15:
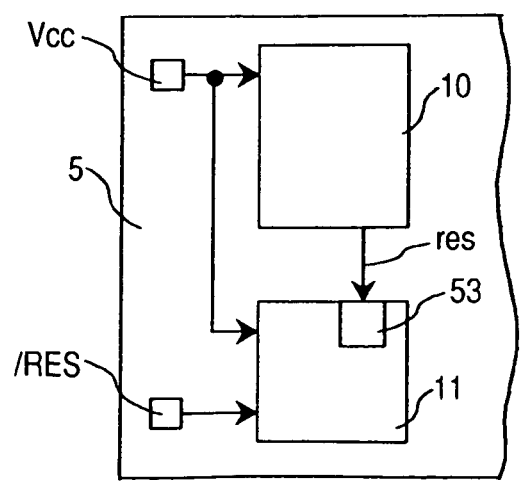
FIG. 15 is a block diagram showing the third example of the power-on-reset mechanism over IC card microcomputer 11.
Figure 16:
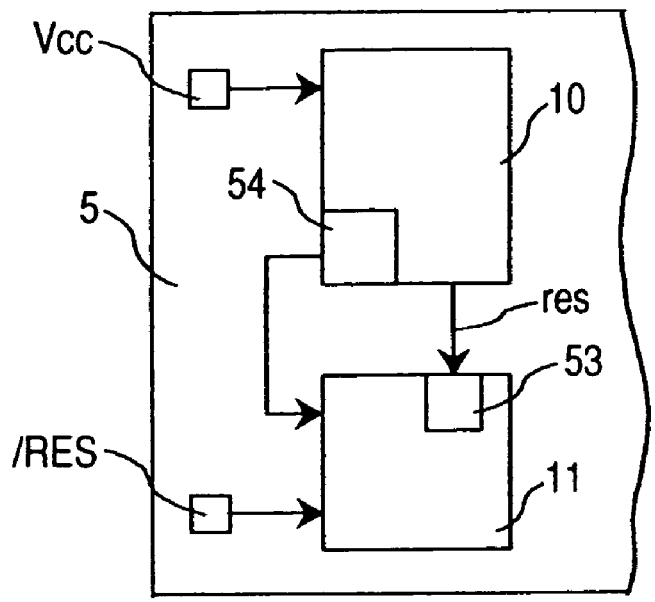
FIG. 16 is a block diagram showing the fourth example of the power-on-reset mechanism over IC card microcomputer 11.

Some another examples which make possible independent power on reset to IC card microcomputer 11 are shown in FIG. 14 through FIG. 16.

In FIG. 14, it has external power source terminal Vcc common to the IC card microcomputer 11 and interface controller 10 as an external connection terminal. In power supply path 51 from the common external power source terminal Vcc to power supply terminal 50 of IC card microcomputer 11, it has power switch 52 which can stop a power supply by control of interface controller 10.

In FIG. 15, it has external power source terminal Vcc common to the IC card microcomputer 11 and interface controller 10 as the external connection terminal, and the IC card microcomputer 11 has input terminal 53 of reset signal res with which power on reset is directed from the interface controller 10. Power on reset becomes possible with an IC card microcomputer independent also by this.

In FIG. 16, operation power is supplied from the external power source terminal Vcc to the interface controller 10. The IC card microcomputer 11 uses as operation power the power source which a voltage change was made or was bypassed via power supply circuits 54, such as a voltage step-down circuit and a generator regulator, in the operation power. The IC card microcomputer 11 has input terminal 53 of reset signal res with which power on reset is directed from the interface controller 10. Power on reset becomes possible by IC card microcomputer 11 independent one also by this. It is effective, when IC card microcomputer 11 and interface controller 10 are formed with another chip and operation power voltage is different especially.

<<The Antenna of a Non-Contact Interface>>

Figure 17:
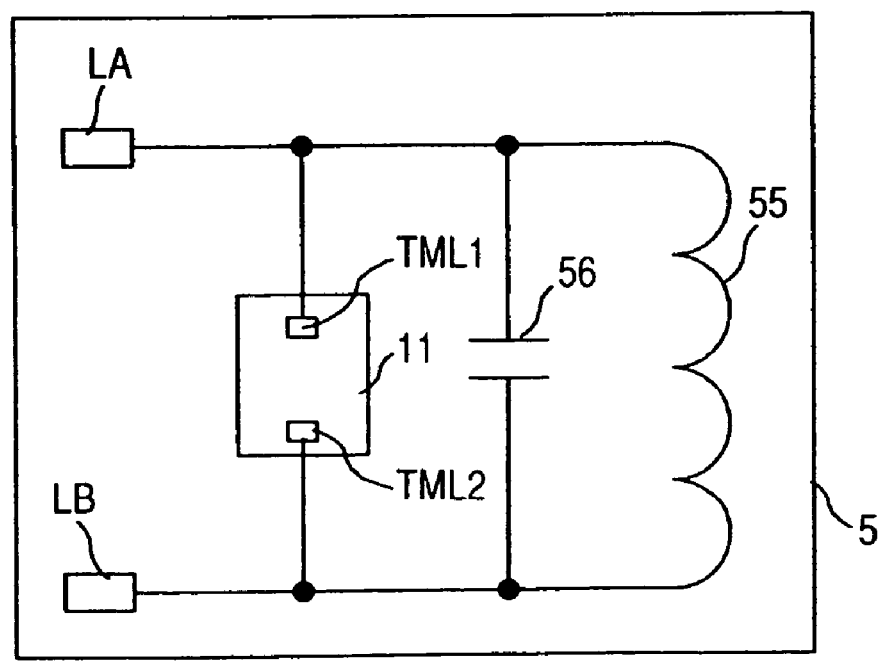
FIG. 17 is a circuit diagram which exemplifies an internal antenna and its tuning capacitor.
Figure 18:
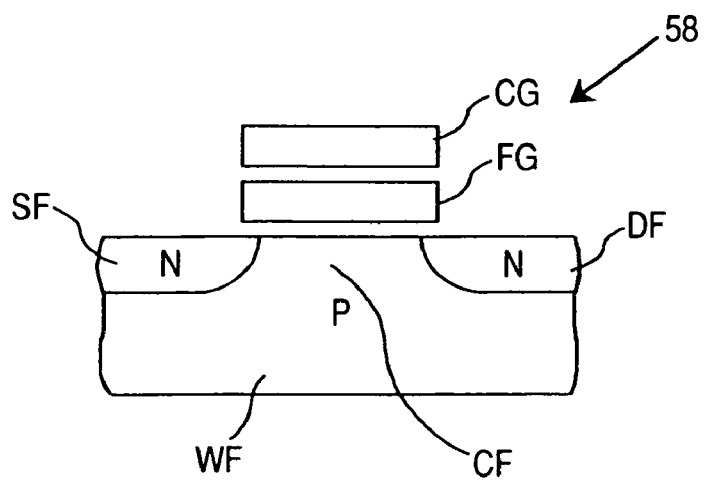
FIG. 18 is a longitudinal sectional view of the flash memory cell transistor used as nonvolatile MOS capacity.

As for the input capacitance seen from antenna terminal TML1 and TML2 of RF section 45 which the IC card microcomputer 11 has, it has 20% of manufacture variation about at the maximum. As variation may not be produced in tuning frequency, as exemplified in FIG. 17, tuning capacitor 56 which resonates with built-in antenna 55 built in MFMC 5 is arranged. What is necessary is for the capacitor 56 for tuning just to include the chip capacitor, a variable capacitance capacitor, or nonvolatile MOS capacity. What is necessary is just to use rewritable flash memory cell transistor 58 electrically, as exemplified in FIG. 18 as nonvolatile MOS capacity. Source region SF and drain area DF are formed in well region WF, on channel region CF between them, gate oxide film, floating gate FG, an insulating layer, and control gate CG are stacked in layers, and flash memory cell transistor 58 is made. It may be the structure which replaces with floating gate FG and adopts charge trap films, such as a silicon nitride film. Flash memory cell transistor 58 changes into a write state by hot electron injection to a floating gate from a drain by, for example control gate voltage VG=12V, drain voltage VD=5.5V and source voltage VS=0V, and changes into an erase state by electronic tunnel discharge from floating gate FG by, for example control gate voltage VG=0V, drain voltage VD=disconnection (open), and source voltage VS=12V. The nonvolatile MOS capacity sets one storage electrode to control gate CG, and makes the storage electrode of another side a well region. In an erase state, and a write state, the size of the depletion layer formed in a channel is different, and a difference is produced in the capacitance value between both terminals by this. The variable capacity accompanying change of the threshold voltage according to the degree of erasing and writing can be constituted. Since it is a nonvolatile memory cell transistor, the erase/write state set up once is maintained independently. By connecting nonvolatile memory cell transistor 58 to a plurality of series, it becomes possible to secure the breakdown voltage of the nonvolatile MOS capacity.

It is possible for MFMC 5 to use the induced e.m.f. by transformer coupling as operation power like a noncontact IC card, and for IC card microcomputer 11 to make it function independently according to a non-contact interface being possible using internal antenna 55. It is significant, when removing MFMC 5 from a card host or using at the time of a card host's power supply cutoff.

Figure 19:
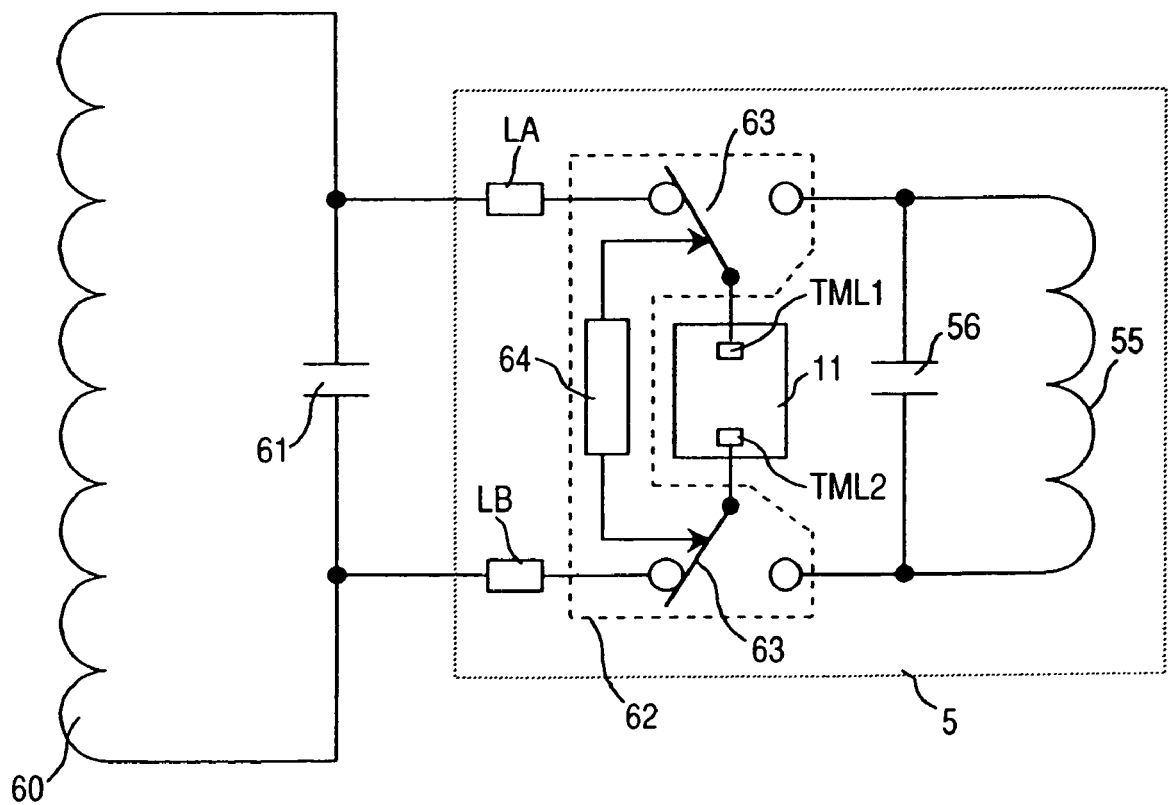
FIG. 19 is a circuit diagram showing the example which connected the external antenna in the condition detachable from the internal antenna.

The example which connected the external antenna in the condition detachable from an internal antenna is shown in FIG. 19. Switching circuit 62 which can connect external antenna connection terminals LA and LB to antenna terminal TML1 and TML2 of the IC card microcomputer 11 selectively instead of the internal antenna 55 is adopted. External antenna 60 is connected to connection terminals LA and LB, and tuning capacitor 61 is connected further. By preparing external antenna 60, utilization of the antenna which was excellent in characteristics, such as transmission and reception sensitivity, compared with the internal antenna is attained.

If the high frequency signal which flows in from there flows into internal antenna 55 when external antenna 60 is used, a high frequency signal will be emitted from built-in antenna 55 inside the instrument incorporating MFMC 5. There is a possibility that internal antenna 55 may become a high frequency noise generation source in short to the instrument which mounts MFMC 5. At this time, a possibility of producing such an undesirable high frequency noise is cancelable by enabling separation of internal antenna 55 at the time of usage of external antenna 60.

When MFMC 5 is taken out from instruments, such as communication personal digital assistant 1, the function which became independent as a noncontact IC card by MFMC 5 independent one can be used by changing to the condition of connecting internal antenna 55 to IC card microcomputer 11. The electric supply to a card is not needed depending on the method of application, but it operates without a battery.

The switching circuit 62 comprises switch 63 and its controlling circuit 64. Switch 63, as exemplified in FIG. 20, includes nonvolatile memory element 65 which intervenes between corresponding connection terminals, and is controllable in cutoff or conduction of a path by changing threshold voltage electrically. What is necessary is for the flash memory cell transistor 58 just to include nonvolatile memory element 65. Controlling circuit 64 makes threshold voltage seen from the selection terminal (gate) of the nonvolatile memory element 65 a first condition, for example, a write state, stops the path and performs conduction of the path by making the threshold voltage into a second condition, for example, an erase state. The selection terminal is connected to the ground voltage of a circuit in the second condition of the threshold voltage. In short, it will be considered as an over erase state, in other words, a depletion type. Hereby, maintenance of the switch state of the ON state to which conduction of the path is performed does not take power consumption. Interface controller 10 gives instruction of writing/erasure action to controlling circuit 64. Controlling circuit 64 controls the operation procedures to nonvolatile memory element 65 according to instruction of writing/erasure action.

Figure 21:
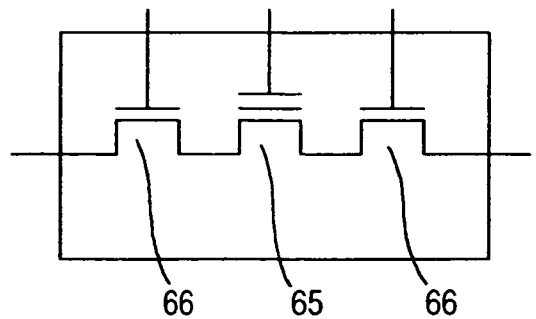
FIG. 21 is a circuit diagram which exemplifies the nonvolatile switch which has arranged the switch MOS transistor for isolation on both sides of a nonvolatile memory element.

If the high-voltage impression when changing the threshold voltage of nonvolatile memory element 65 is taken into consideration, as exemplified in FIG. 21, on both sides of the nonvolatile memory element 65, switch MOS transistor 66 for isolation of a pair may be arranged in series. Let the switch MOS transistor 66 for isolation be a MOS transistor of a depletion type in short made into an ON state by connecting the selection terminal to ground voltage Vss of a circuit. The controlling circuit 64 controls the switch MOS transistor 66 for isolation to an OFF-state, when changing the threshold voltage of nonvolatile memory element 65. At this time, gate voltage of switch MOS transistor 66 for isolation is made into negative voltage. By adopting the switch MOS transistor 66 for isolation, it is not required making into a high breakdown voltage all the circuits connected to the path between which the transistor concerned is placed.

Figure 22:
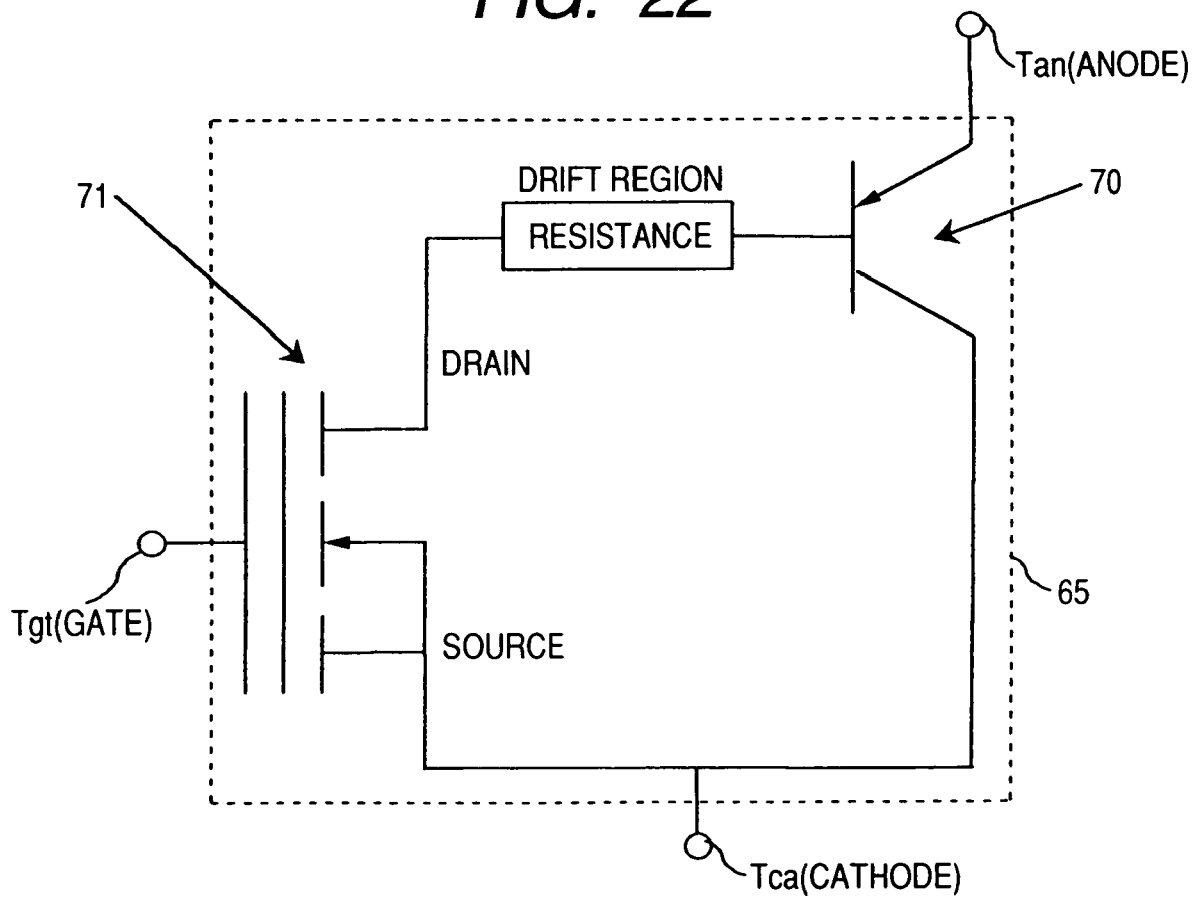
FIG. 22 is an internal equivalent-circuit chart of the switch for routing of NVCBT structure.
Figure 23:
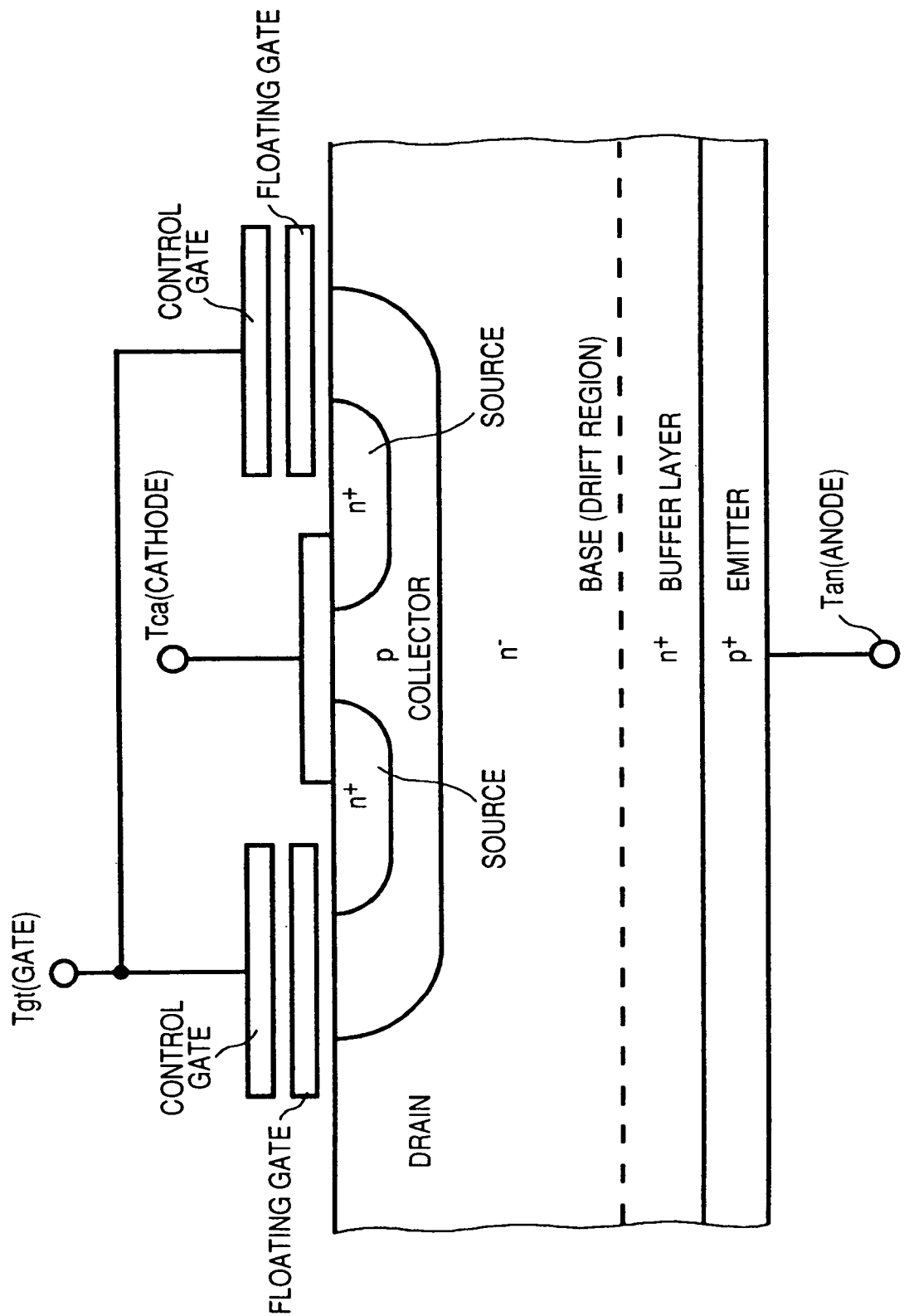
FIG. 23 is a longitudinal sectional view showing the element structure of the switching circuit shown in FIG. 22.

Another example of nonvolatile memory element 65 is shown in FIG. 22 and FIG. 23. FIG. 22 shows a circuit configuration and FIG. 23 shows the longitudinal-section structure of the transistor. Nonvolatile memory element 65 shown in the same drawing is made into high breakdown voltage nonvolatile transistor element structure (NVCBT: Non-Volatile Channel Bipolar Transistor), and has gate Tgt, anode Tan, and cathode Tca. That is, the nonvolatile memory element 65 comprises bipolar transistor part 70 and nonvolatile MOS transistor part 71 to which the drain source was connected between the base collector of bipolar transistor part 70. A charge storage region is formed via an insulating layer on the channel between source drain, and, as for nonvolatile MOS transistor part 71, threshold voltage is made adjustable according to the charge accumulated in this charge storage region. A charge storage region includes the floating gate and the control gate is formed via the insulating layer on it. Nonvolatile memory element 65 which has this NVCBT structure has a breakdown voltage of nonvolatile MOS transistor part 71 lower than the breakdown voltage of a bipolar transistor part.

The action of nonvolatile memory element 65 which has the NVCBT structure is explained. When it is in the situation which the electron is not accumulating in a floating gate, it is made for nonvolatile MOS transistor part 71 to be in an erase state, especially a depletion condition in nonvolatile memory element 65 which has NVCBT structure. Switch-on is explained first. In the erase state of the nonvolatile MOS transistor part 71, if applied voltage Vg of a control gate is larger than threshold voltage Vth of nonvolatile MOS transistor part 71, and the inversion layer is formed between a source and a drain of nonvolatile MOS transistor part 71, an electron will be poured into the base of bipolar transistor part 70, base current will flow, and bipolar transistor part 70 will be turned on. An ON state is maintained even if it makes control gate voltage Vg into the ground voltage of the same electric potential as cathode, since it is in depletion mode. The control gate voltage should just satisfy at least the bias condition (the ground voltage applying state) which is a grade by which a hot electron is not poured into a floating gate.

If voltage of a control gate is made high enough in an erase state, a hot electron will be poured into a floating gate from a source, and threshold voltage will be made high.

Next, a cut off state is explained. In the write state by which the electron was poured into the floating gate, threshold voltage is made high. Since a channel inversion layer is not formed between source drain when applied voltage Vg of a control gate is lower than threshold voltage in a write state, an electron is not poured in to bipolar transistor part 70, but since the base current does not flow, it will be in a cut off state between the anode of positive potential and the cathode of negative potential in bipolar transistor part 70. For example, an OFF state is maintained even if it makes control gate applied voltage Vg into the ground state of the same electric potential as cathode. The control gate electric potential should just satisfy the conditions (the ground voltage applying state) by which the accumulation electron of a floating gate is not drawn out at least.

By making control gate voltage Vg into negative potential enough to the source, drain, and p well region (region of the collector of FIG. 22) of MOS transistor part 71 in a write state, FN (Fowler Nordheim) current can draw out the accumulation electron of a floating gate, and it can be made an erase state. Hereby, MOS transistor part 71 can change from enhancing mode to depletion mode.

Figure 24:
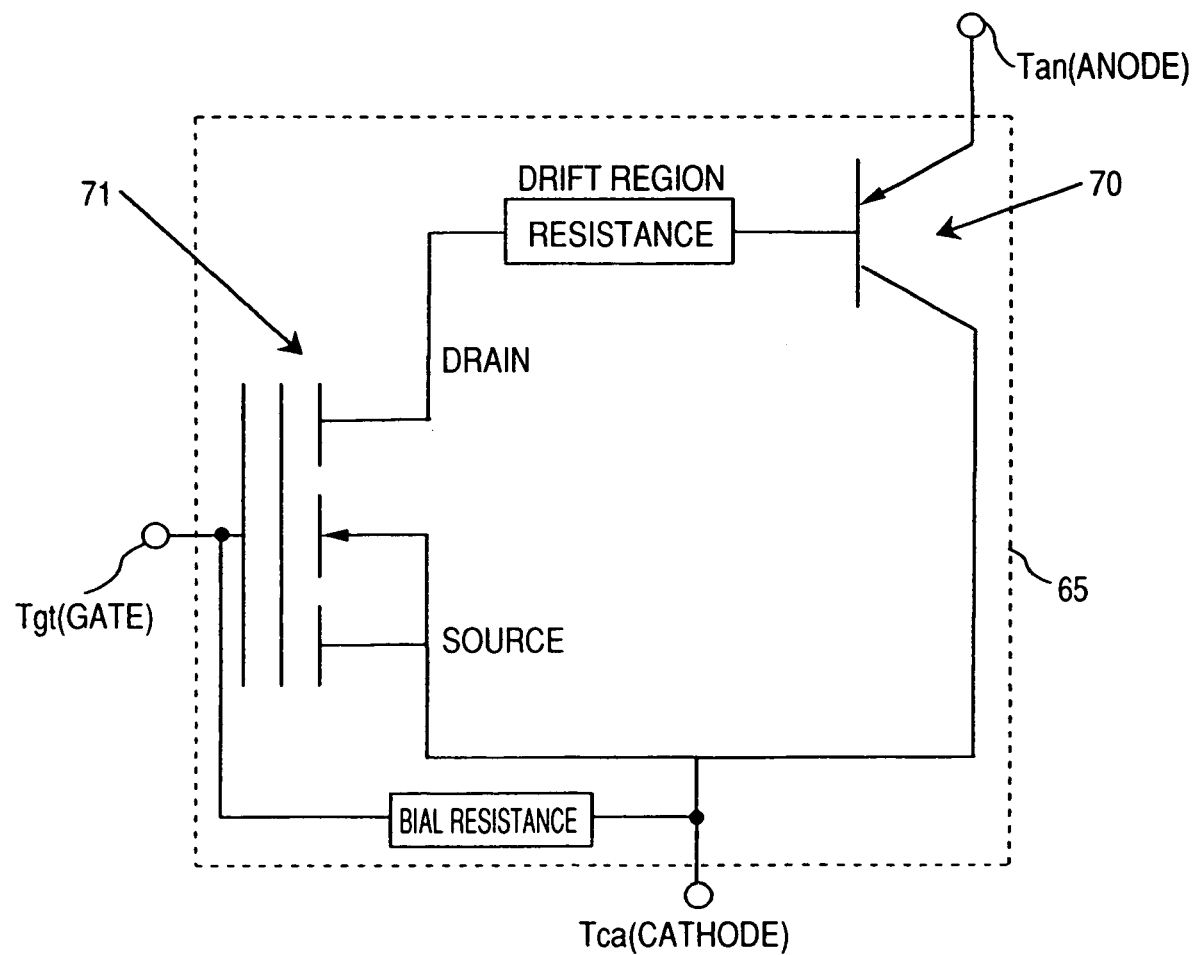
FIG. 24 is a circuit diagram to which gate bias resistance was added to FIG. 22.

By connecting gate Tgt and cathode Tca intervening bias resistance, as exemplified in FIG. 24, it becomes easy to perform the keeping memorization of the switch state of ON in an erase state and OFF in a write state good only by the existence of channel region formation, in short by the writing and erasure of nonvolatile MOS transistor part 71.

Figure 20:
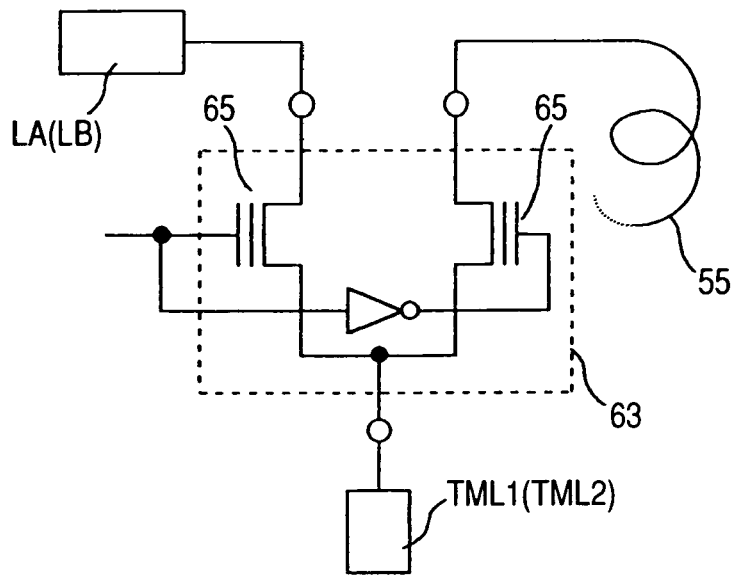
FIG. 20 is a circuit diagram which exemplifies the nonvolatile switch for a path change.
Figure 73:
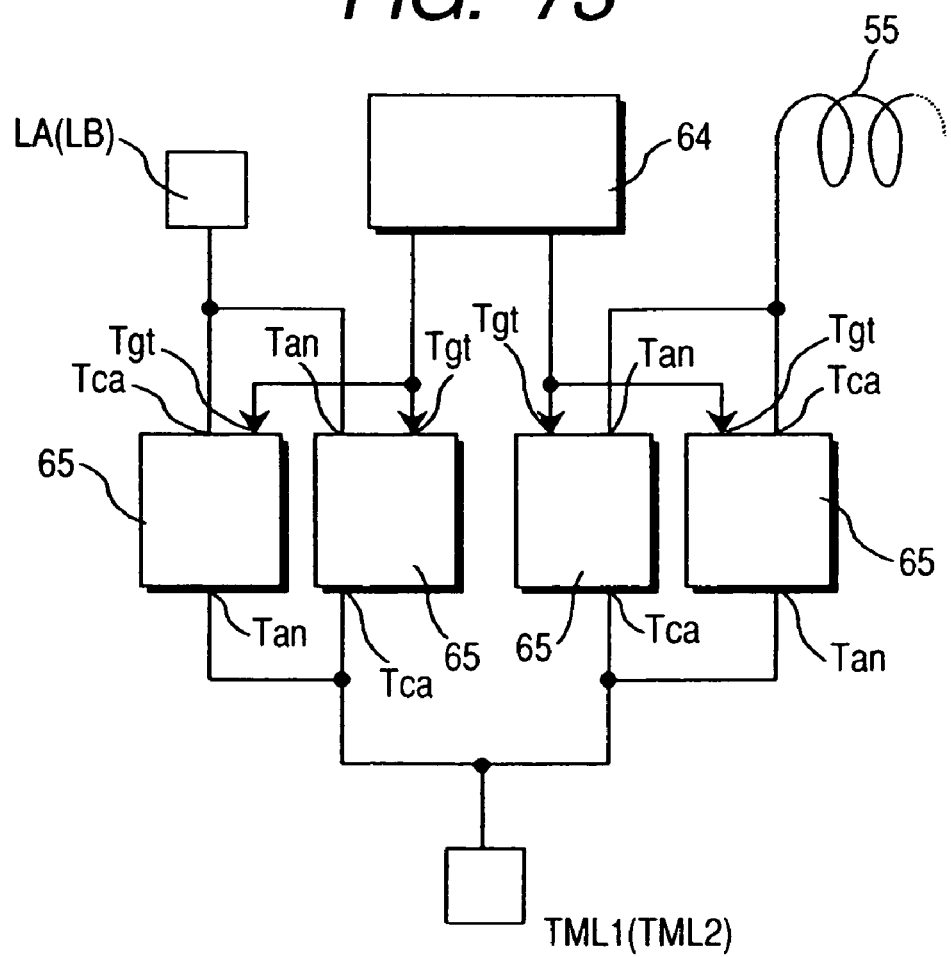
FIG. 73 is a circuit diagram which exemplifies the case where the NVCBT structure of FIG. 22 is adopted as a non-volatile switch for a path change.

Nonvolatile memory element 65 represented by NVCBT structure can be used also for the path change circuit explained by FIG. 20. As shown in FIG. 73 for example, in order to be able to pass a positive/negative alternating current, it is constituted by making one switch with two nonvolatile memory elements 65 of NVCBT structure like an MOS transfer gate, and mutually connecting anode Tan of nonvolatile memory element 65 of one NVCBT structure and cathode Tca of nonvolatile memory element 65 of the NVCBT structure of another side. One of such the switches is used for the alternative connection between terminal LA (LB) and terminal TML1 (TML2), and another switch is used for the alternative connection between terminal TML1 (TML2) and antenna 55. Controlling circuit 64 performs program control to nonvolatile memory element 65 of NVCBT structure via gate Tgt.

Nonvolatile memory element 65 represented by NVCBT structure can be used not only for an antenna switch but for the power switch of a circuit. For example, as exemplified in FIG. 25, nonvolatile memory element 65 and controlling circuit 64 are arranged to the power supply terminal Vcc side of predetermined circuit 66. In short, anode Tan (emitter) of nonvolatile memory element 65 of NVCBT structure is connected to the power supply terminal Vcc side. Enable signal EN of operation, and indication signal EW of writing and erasure are supplied to controlling circuit 64. Let the circuit 66 be RF section 45. When not using a non-contact interface, feeding of the operation power to RF section 45 can be stopped thoroughly.

Figure 26:
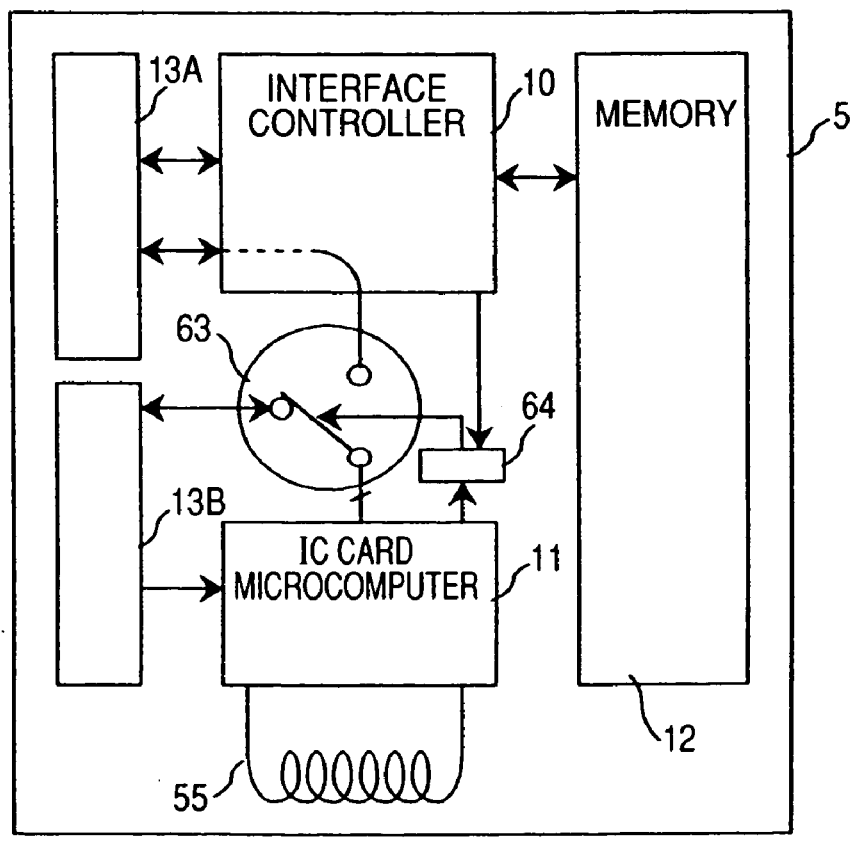
FIG. 26 is a block diagram at the time of applying the switching circuit using a nonvolatile memory element, and a controlling circuit to alternative separation with an IC card microcomputer and an interface controller.

As exemplified in FIG. 26, switching circuit 63 using nonvolatile memory element 65, and controlling circuit 64 are available to alternative separation with IC card microcomputer 11 and interface controller 10 etc. At this time, either IC card microcomputer 11 or interface controller 10 performs the movement directive to controlling circuit 64. The case where it is supposed that separating from another circuits is desirable as for IC card microcomputer 11 when performing authenticating processing etc. on an advanced security level is assumed. At this time, IC card microcomputer 11 interfaces using exclusive external terminal 13B. When IC card microcomputer 11 connects switching circuit 63 if needed, it is also made possible to use memory 12 via interface controller 10.

Figure 25:
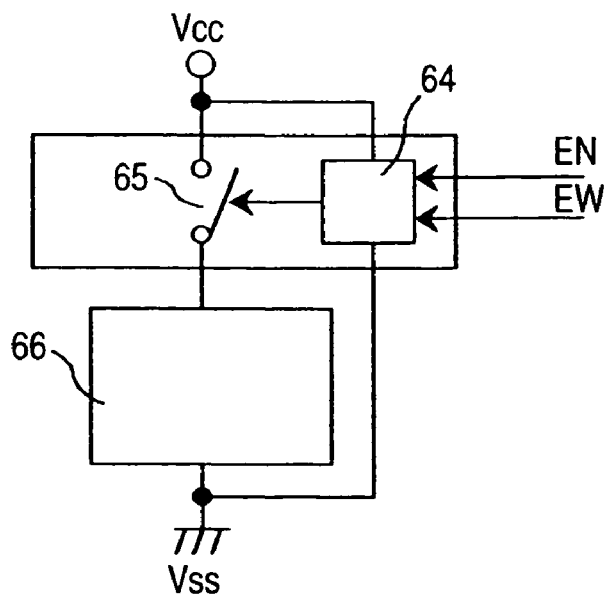
FIG. 25 is a block diagram showing the example which applied the nonvolatile memory element represented by NVCBT structure to the power switch of the circuit.

By using nonvolatile memory element 65 represented by NVCBT structure as alternative separation of an IC card microcomputer, the change of an internal antenna and an external antenna, a power switch, etc., steady external applied voltage and electric power which is needed by ON-and-OFF control like a conventional MOS switch become unnecessary, and it can contribute to low power. It is also possible to position the circuit which comprises nonvolatile memory element 65 and controlling circuit 64 as shown in FIG. 25, or the circuit which is exemplified by FIG. 19 and which comprises switching circuit 63 and controlling circuit 64 as a semiconductor switch module with dramatically small standby power requirement. Although not illustrated in particular, such a semiconductor switch module can also be used as a switch module of the small standby-power-requirement in an electric-power system circuit. If an example is especially taken by the high breakdown voltage of NVCBT structure, the application of an electric-power system switch module is preferred.

<<Improvement in an Antenna Characteristic>>

Figure 27:
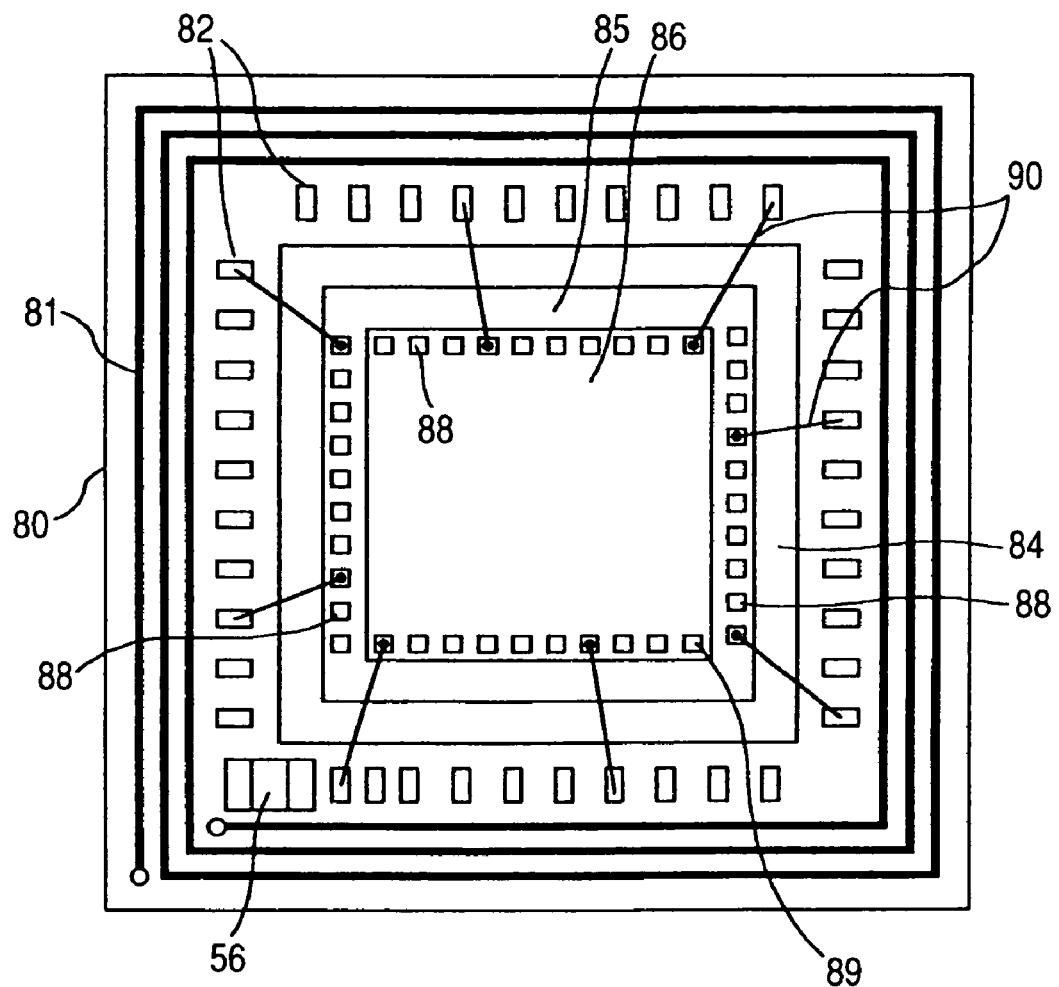
FIG. 27 is a plan view which exemplifies the planar structure of MFMC.

The planar structure of MFMC 5 is exemplified by FIG. 27. In one front surface of wiring substrate 80, circumference formation of the wiring coil pattern 81 which includes the internal antenna 55 is performed along with the peripheral part, and circumference arrangement of many bonding pads 82 is performed to the inside. Inside bonding pad 82, ferrite chip 84 which is an example of a ferrite plate is arranged, and the stack of the two semiconductor chips 85 and 86 is performed to this. Bonding pad 82 of a wiring substrate is connected with corresponding bonding pad 88 of semiconductor chip 85 and 86 by bonding wire 90. In this example, one semiconductor chip 86 realizes interface controller 10 and IC card microcomputer 11.

Figure 28:
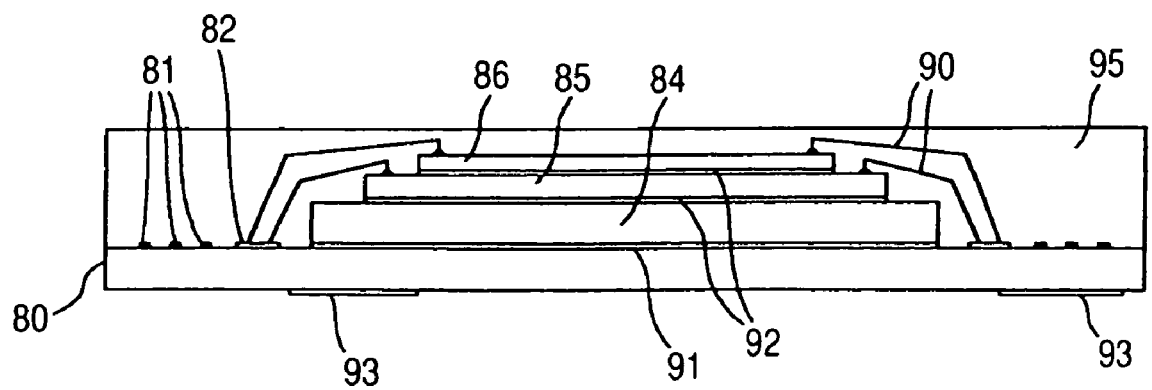
FIG. 28 is a side surface sectional view which exemplifies the side surface structure of MFMC of FIG. 27.

The side surface structure of MFMC 5 corresponding to the planar structure of FIG. 27 is exemplified by FIG. 28. Wiring substrate 80 and ferrite chip 84 by which the stack was performed, ferrite chip 84 and semiconductor chip 85, and both semiconductor chip 85 and 86 are combined with adhesives 91 and 92, respectively. Wiring substrate 80 comprises for example, a multilayer interconnection substrate, and connecter terminal (or soldering connection terminal) 93 connected to bonding pad 82 is formed in the back surface. Let connecter terminal 93 be an example of the external connection electrode 13A and 13B. In the front surface of wiring substrate 80, the whole is sealed by resin 95. In short, let casing be sealing resin 95 formed by the resin molding. The package structure shown in FIG. 27 and FIG. 28 is called a micro MMC package.

Since the ferrite which is a ferromagnetic substance has large magnetic permeability, the magnetic flux tries to take the path along it without penetrating ferrite chip 84. Therefore, since internal antenna 55 which comprises coil pattern 81 is arranged at the peripheral part of ferrite chip 84, it becomes possible to acquire big magnetic flux near antenna 55, and can contribute to improvement in the inductance performance, i.e., the antenna performance here, of antenna 55 by this. Since semiconductor chips 85 and 86 are piled up on ferrite chip 84, it can be eased that magnetic flux penetrates to semiconductor chips 85 and 86, and it becomes possible to prevent beforehand a possibility of an undesirable eddy current or the undesirable induced e.m.f. occurring in semiconductor chips 85 and 86, and producing malfunction.

Figure 29:
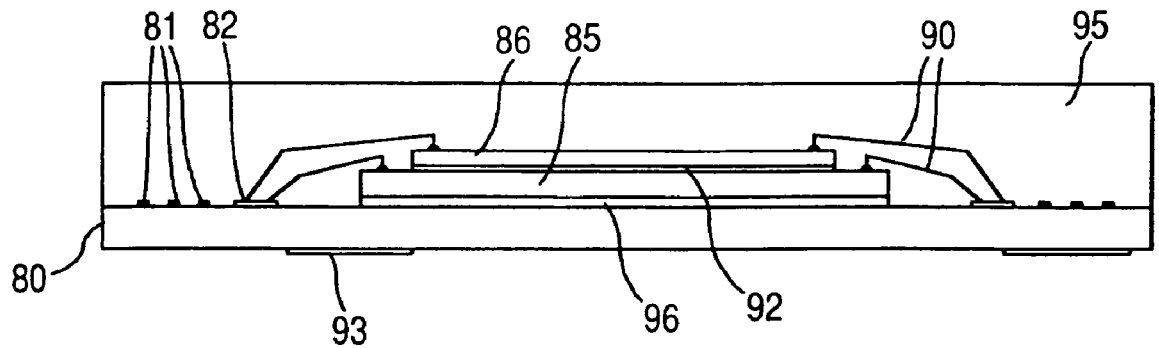
FIG. 29 is a side surface sectional view which exemplifies another side surface structure of MFMC.

Another side surface structure of MFMC 5 is exemplified by FIG. 29. Here, adhesives 96 containing ferrite powder as a ferrite plate were used instead of the ferrite chip. Wiring substrate 80 and semiconductor chip 85 are combined using these adhesives 96. The same operation effect as ferrite chip 84 is obtained also by this.

The ferrite plate may not be limited to ferrite chip 84, and the applied ferrite paste, such as adhesives 96 containing ferrite powder, but may be the stuck ferrite film. Since ferrite names generically the ferromagnetic oxide represented by $MO.Fe_2O_3$, it may be ferromagnetic oxide other than what is called ferrite.

Figure 31:
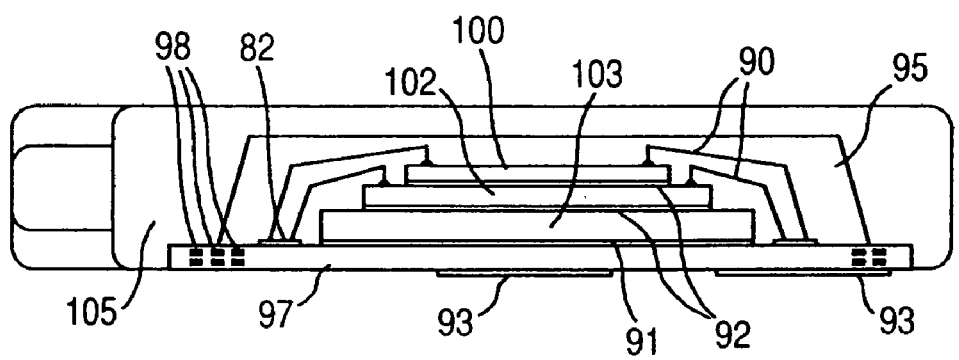
FIG. 31 is a side view which exemplifies the side surface structure of MFMC of FIG. 30.
Figure 30:
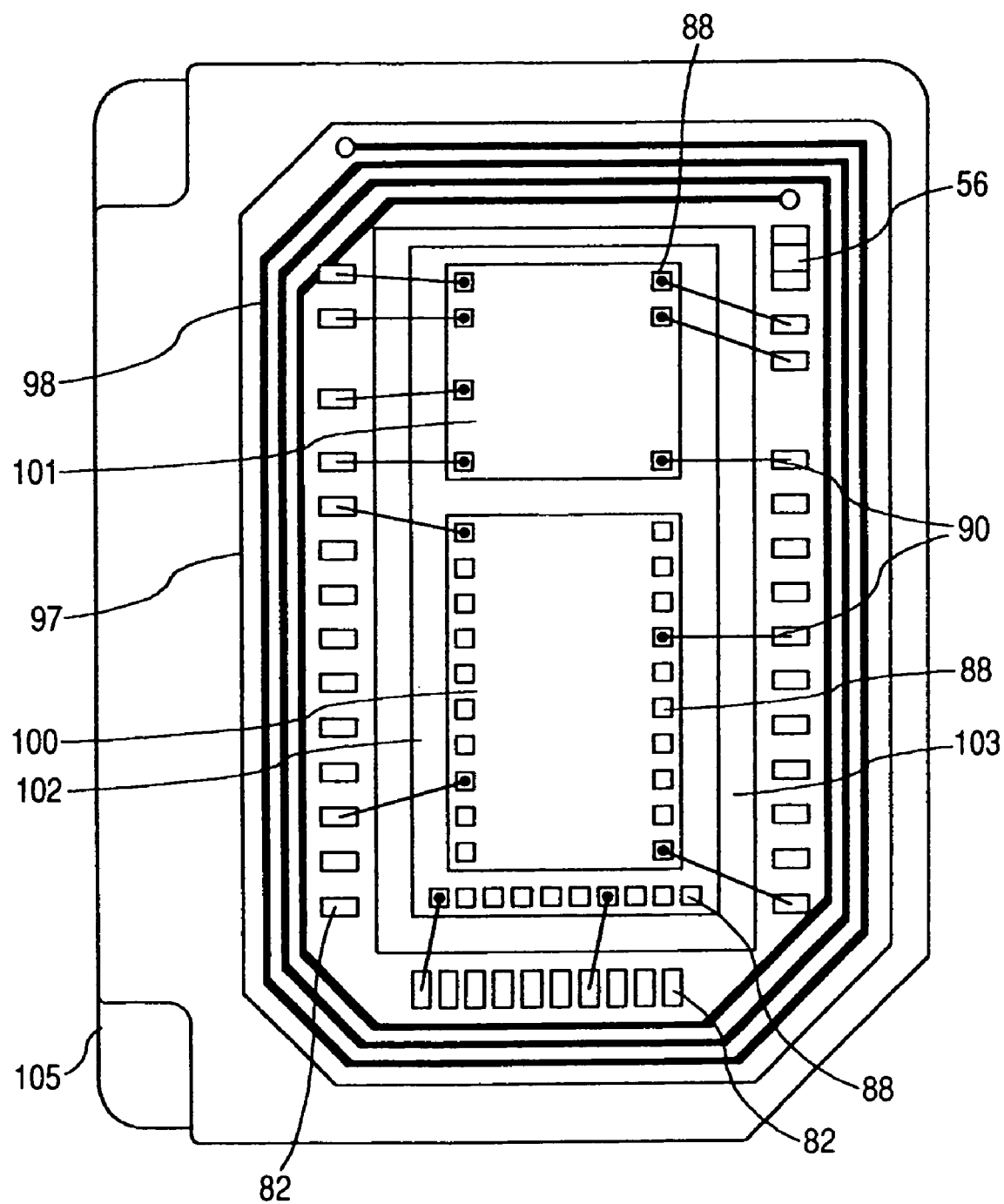
FIG. 30 is a permeation plan view which exemplifies another planar structure of MFMC.
Figure 38:
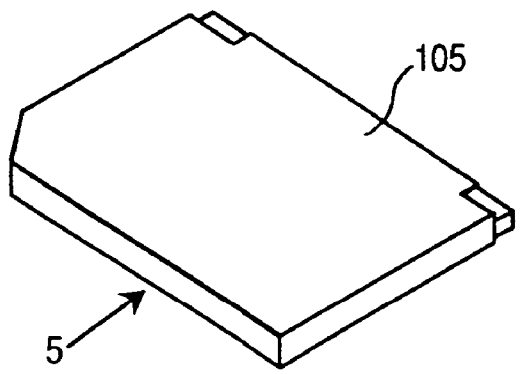
FIG. 38 is an external-appearance perspective view of MFMC which applied the RSMMC package.

Another planar structure of MFMC 5 is exemplified by FIG. 30. The side surface structure of MFMC 5 corresponding to the planar structure of FIG. 30 is exemplified by FIG. 31. Wiring coil pattern 98 which includes internal antenna 55 is formed using the multilayer interconnection pattern in wiring substrate 97. Three semiconductor chips 100,101,102 are mounted in the inside, and interface controller 10, IC card microcomputer 11, and memory 12 comprise respectively separate semiconductor chip 100,101,102. The other structure of semiconductor chip 100,101,102 to ferrite chip 103, such as stack structure and bonding structure, is fundamentally the same as FIG. 27. After semiconductor chips 100,101, 102 etc. on wiring substrate 97 are sealed by resin 95 on the whole, the whole is covered with cap 105 exposing connecter terminal 93 which includes an external connection terminal. Cap 105 constitutes casing. Between cap 105 and resin 95, it has adhered via the binding material which is not illustrated. On the whole, structure of FIG. 30 is enlarged rather than FIG. 27. The package structure shown in FIG. 30 and FIG. 31 is called a RSMMC package. The external appearance of MFMC 5 which applied the RSMMC package is exemplified with a perspective view by FIG. 38.

Figure 32:
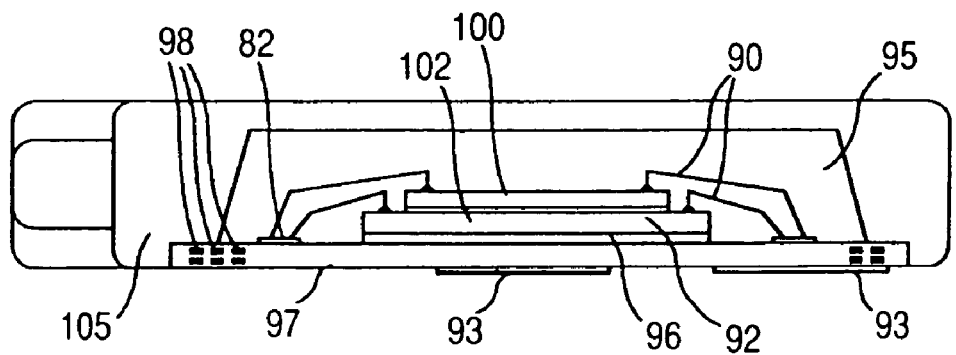
FIG. 32 is a side surface sectional view which exemplifies another side surface structure of MFMC.

Another side surface structure of MFMC 5 is exemplified by FIG. 32. Here, instead of ferrite chip 103 of FIG. 30, adhesives 96 containing ferrite powder were used as a ferrite plate. Wiring substrate 97 and semiconductor chip 102 are combined using these adhesives 96.

It becomes easy to secure the distance of wiring coil pattern 98 and each semiconductor chip by having arranged the semiconductor chips stacking in layers on wiring substrate 97 of MFMC 5. When the effect by the electromagnetic field to a semiconductor chip can be reduced by having secured the distance of each semiconductor chip and wiring coil pattern 98 even to extent which can be disregarded, it is also possible to paste up each semiconductor chip on wiring substrate 97 with the binding material for die bonding which does not include a ferromagnetic material.

Figure 33:
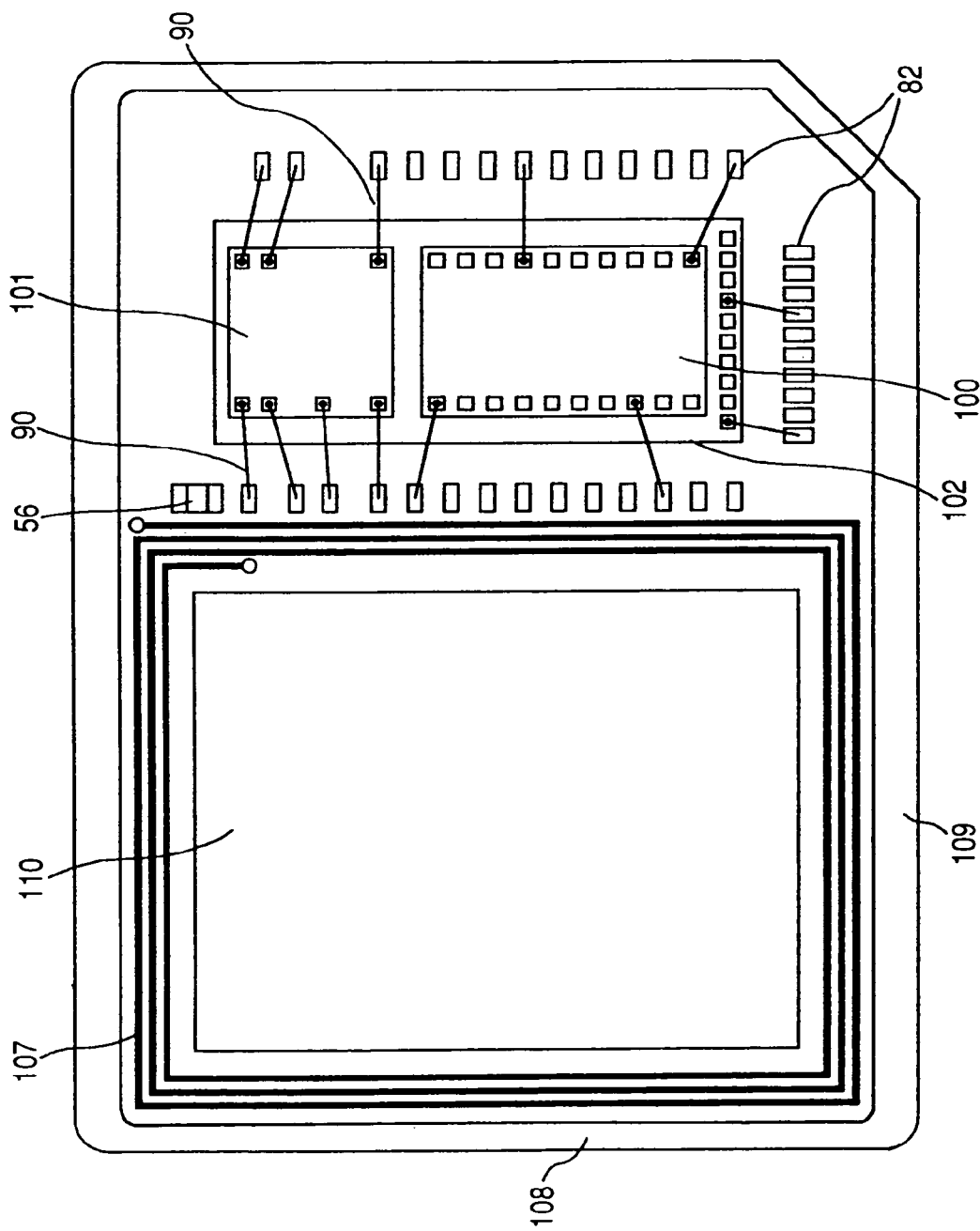
FIG. 33 is a plan view which exemplifies another planar structure of MFMC.
Figure 34:
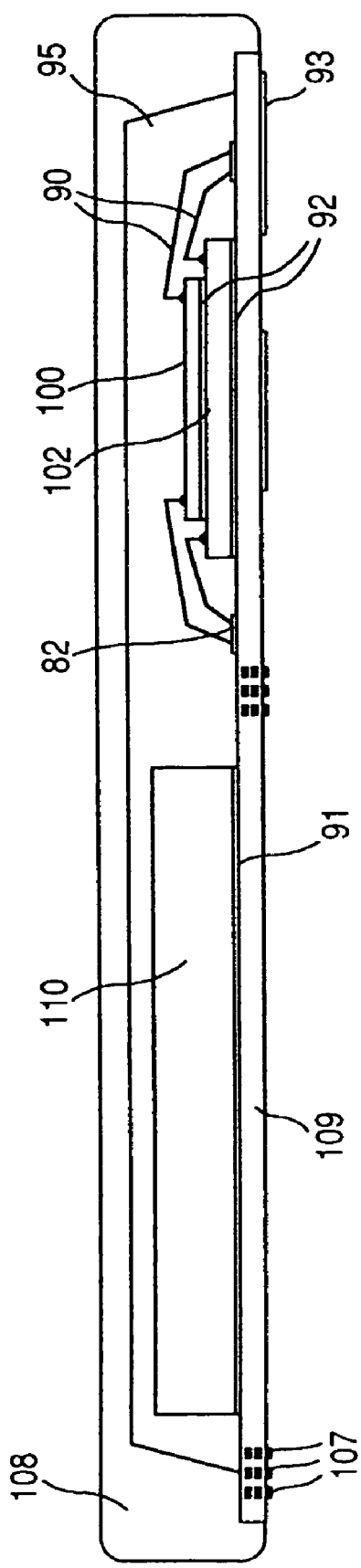
FIG. 34 is a side surface sectional view which exemplifies the side surface structure of MFMC corresponding to the planar structure of FIG. 33.
Figure 39:
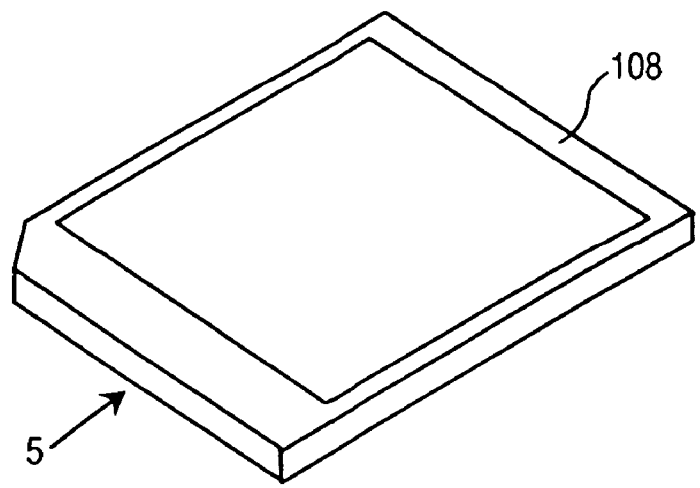
FIG. 39 is an external appearance perspective view of MFMC which applied the standard MMC package.

Another planar structure of MFMC 5 is exemplified by FIG. 33. The side surface structure of MFMC 5 corresponding to the planar structure of FIG. 33 is exemplified by FIG. 34. If there is no need of arranging internal antenna 55 in the peripheral part of semiconductor chip 100,101,102 like the above from the point of a space factor, what is necessary is to form in a part of comparatively big wiring substrate 109 wiring coil pattern 107 which includes internal antenna 55, and just to arrange semiconductor chip 100,101,102 to the side. In short, bigger cap 108 than the case of FIG. 30 constitutes casing from this example. Also in this case, it is desirable to arrange ferrite chip 110 from a viewpoint of improvement in antenna performance in the central part of wiring coil pattern 107 which includes the internal antenna 55. The package structure shown in FIG. 33 and FIG. 34 is called a standard MMC package. The external appearance of MFMC 5 which applied the standard MMC package is exemplified with a perspective view by FIG. 39.

Figure 35:
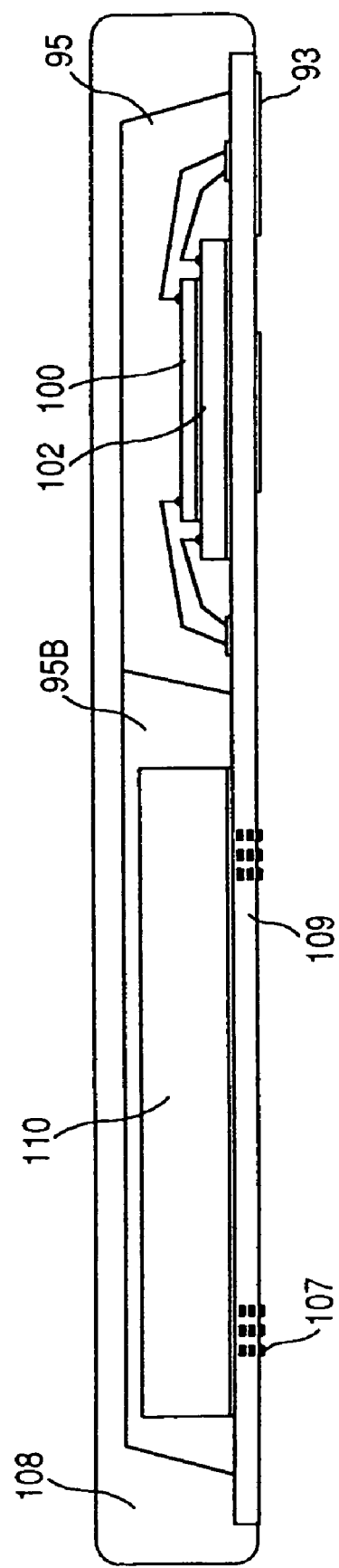
FIG. 35 is a side surface sectional view which exemplifies the side surface structure of another MFMC.

The side surface structure of another MFMC 5 is exemplified by FIG. 35. The point of difference with FIG. 34 is a point of having formed bigger ferrite chip 110 than the contour of wiring coil pattern 107 which includes the internal antenna 55, and as long as a space allows, the way which used ferrite chip 110 of big width contributes it to improvement in antenna efficiency. In the structure shown in FIG. 35, ferrite chip 110 is not covered by resin 95, but is fixed to wiring substrate 109 with adhesives 95B. Thus, by considering it as the structure where resin 95 does not cover ferrite chip 110, while becoming possible to mount ferrite chip 110 on wiring substrate 109 after the step which forms resin 95, as compared with the case where ferrite chip 110 is sealed inside resin 95, it becomes easy to mount thicker ferrite chip 110, and it can contribute to improvement in antenna efficiency.

Figure 36:
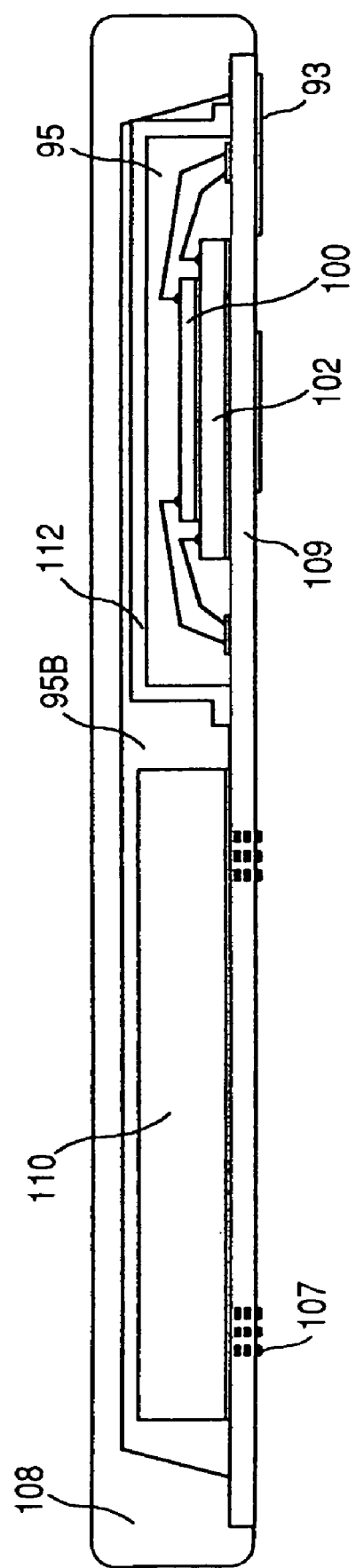
FIG. 36 is a side surface sectional view which exemplifies the side surface structure of another MFMC.

The side surface structure of another MFMC 5 is exemplified by FIG. 36. From a viewpoint of malfunction prevention of semiconductor chip 100,101,102 by magnetic flux, it is good to further wrap with internal cap 112 which contains metal or ferrite semiconductor chips 100,101,102 arranged in the side of wiring coil pattern 107 which includes the internal antenna 55. In FIG. 36, wiring substrate 109 and cap 108 have adhered via binding material 95B.

The inductor of the internal antenna 55 is formed with coil pattern 81,98,107 formed in the wiring substrate, for example. The inductor can also be formed with a winding coil.

When the coil pattern 81,98,107 is formed with the wiring pattern of the same layer as wiring of bonding pad 82 connected to each semiconductor chip 100,101,102, or others, for example, as compared with the case where an inductor is formed with a winding coil, while cost is reducible, it becomes easy also to attain the thinning of a device. Like wiring coil pattern 98,107, it becomes easy by forming a coil pattern using wiring of two or more layers to improve the effectiveness of the non-contact interface by transformer coupling.

Figure 37:
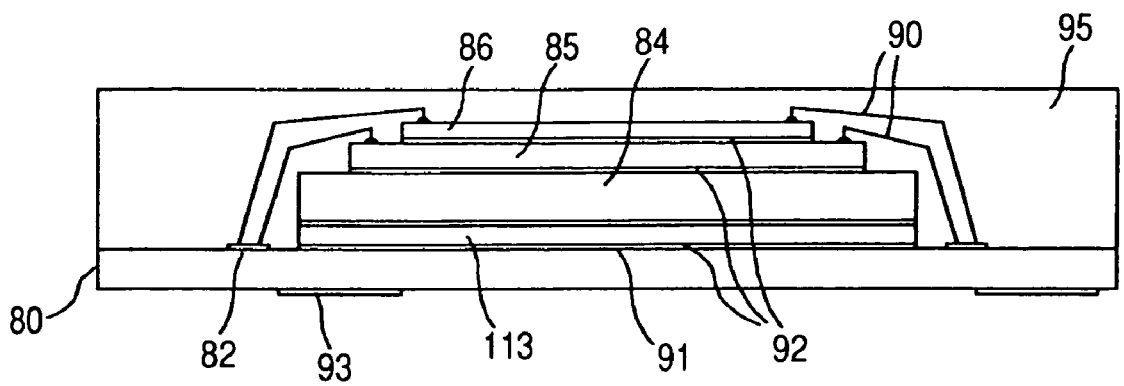
FIG. 37 is a side surface sectional view of MFMC which used the dielectric antenna chip.

When using high frequency like 5.8 GHz for an ETC on-vehicle device, an exclusive narrow band communication applications, etc., for example, the antenna 55 may be replaced with the dielectric antenna chip which comprises the dielectrics ceramics etc. It is desirable to perform the stack of the dielectric antenna chip on a ferrite plate in respect of an antenna characteristic. For example, as exemplified in FIG. 37, ferrite chip 84 is piled up on dielectric antenna chip 113. What is necessary is just to perform the stack of the semiconductor chips 86 and 85 on ferrite chip 84. Ferrite chip 84 can be changed into another ferrite plates, such as adhesives containing ferrite powder, and a ferrite film.

Figure 40:
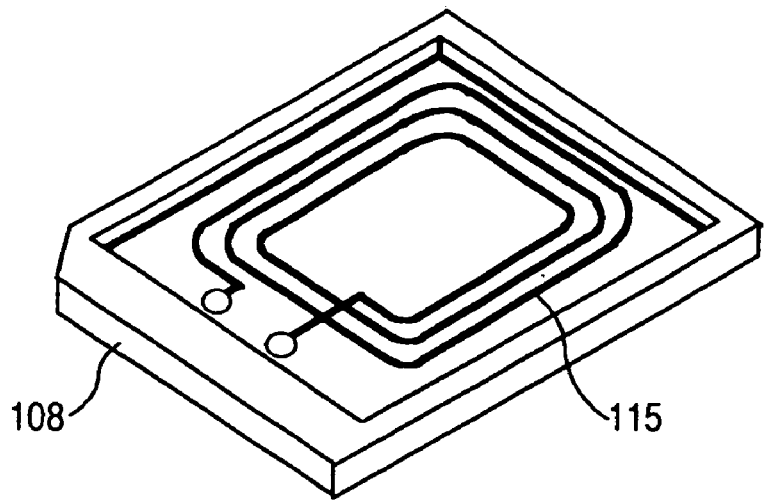
FIG. 40 is a perspective view showing the example which formed the internal antenna in the cap inside in standard MMC package structure.

The internal antenna 55 is not limited to the structure formed in a wiring substrate, for example, may be formed in the cap 105,108. For example, in the standard MMC package structure exemplified by FIG. 40, coil 115 which includes internal antenna 55 is formed inside cap 108. As exemplified in FIG. 41, the region of sealing resin 95 overlaps on coil 115, and connecter terminal 93 is exposed outside. If cap 105 is made into the product made of resin of ferrite powder mixing, antenna efficiency will improve like the above and it will be useful also for malfunction prevention of a semiconductor chip. In addition, it is good to insert ferrite plates 116, such as a ferrite chip, a ferrite film, or a ferrite label, between coil 115 and the region of sealing resin 95 from a viewpoint of improvement in antenna efficiency, and malfunction prevention of a semiconductor chip, as exemplified in FIG. 42. In this case, cap 105 is good by mere resin. The structure of FIG. 40 through FIG. 42 is applicable also to other package structures.

Figure 41:
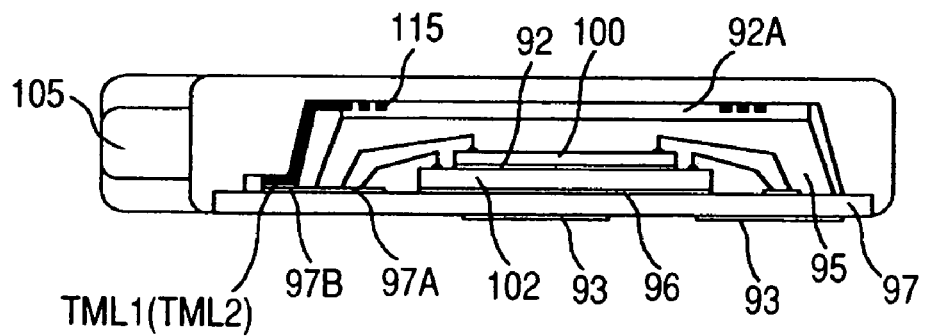
FIG. 41 is a side surface sectional view showing the structure of MFMC included in the cap of FIG. 40.
Figure 42:
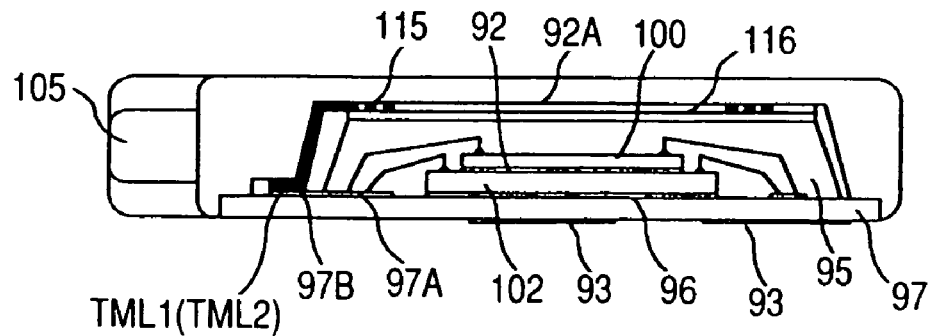
FIG. 42 is a side surface sectional view showing MFMC included in the cap of FIG. 40 together with the ferrite plate.

In FIG. 41 and FIG. 42, coil 115 formed in cap 105 and antenna terminals TML1/TML2 of IC card microcomputer 11 are connected with coil pattern 115 via wiring 97A formed on wiring substrate 97. What is necessary is just to have connected wiring 97A and coil pattern 115 electrically, for example via electrically conductive binding materials 97B, such as Ag paste, etc.

By forming coil 115 in cap 105, it becomes easy to secure the distance of coil 115 and each semiconductor chip. It is effective to secure the distance of coil 115 and each semiconductor chip, when reducing eddy current loss and securing the characteristics of coil 115, or also when preventing beforehand a possibility of an undesirable eddy current or the undesirable induced e.m.f. occurring in a semiconductor chip, and producing malfunction.

<<Antenna Characteristic Deterioration Prevention by Eddy Current Loss>>

Figure 43:
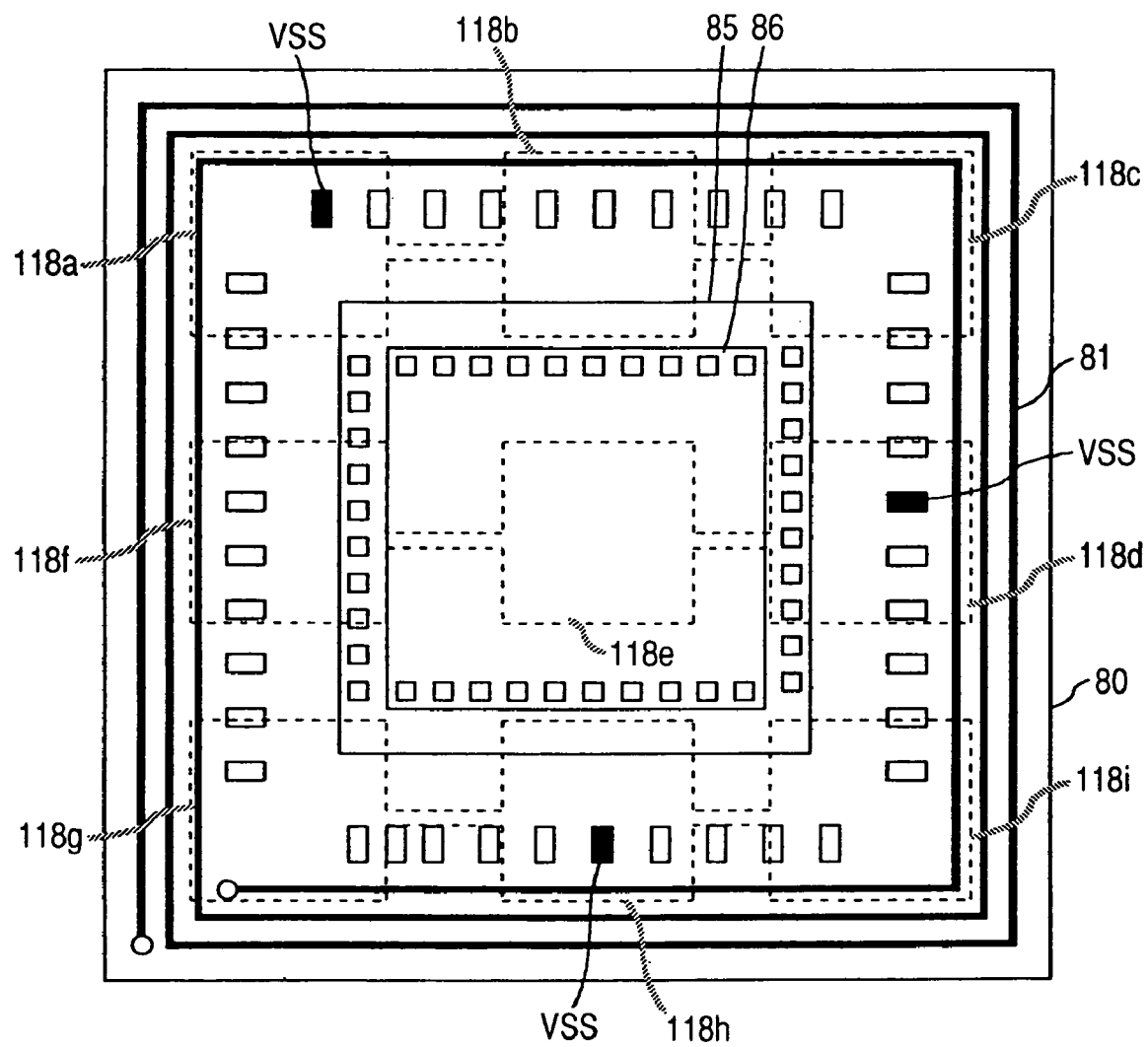
FIG. 43 is a side surface sectional view which exemplifies the structure of MFMC which formed the division ground pattern in the wiring substrate.
Figure 44:
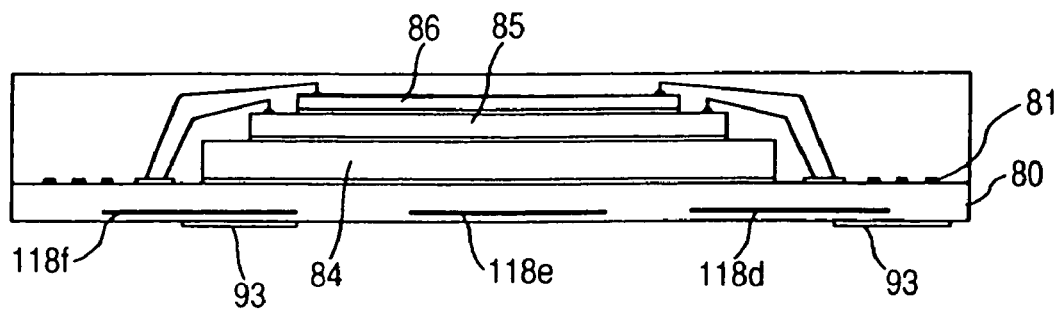
FIG. 44 is a sectional view showing the side surface section structure of FIG. 43.

The comparatively big ground pattern by which conduction is performed to grounding electric potential is formed in the multilayer interconnection substrate represented by the compound wiring substrate. If magnetic flux passes this ground pattern, eddy current loss will be generated and an antenna characteristic will deteriorate. From this viewpoint, as exemplified in FIG. 43, the wiring substrate has division ground patterns 118a-118i connected without being divided into plurality and forming closed circuit instead of a single ground pattern. It connects with bonding pad Vss which receives ground voltage, and division ground pattern 118a is connected to another division ground patterns 118b and 118c in in-series. Similarly, it connects with bonding pad Vss which receives ground voltage, and division ground pattern 118d is connected to another division ground patterns 118e and 118f in in-series. It connects with bonding pad Vss which receives ground voltage, and division ground pattern 118g is connected to another division ground patterns 118h and 118i in in-series. The side surface section structure of FIG. 43 is illustrated by FIG. 44. Division ground patterns 118a-118i are formed in the lower layer side of a multilayer interconnection substrate. Hereby, degradation of the antenna characteristic by the eddy current loss produced on the front surface of a ground pattern can be eased. Not only micro MMC package structure but in RSMMC, standard MMC package structure, etc., naturally, the division ground pattern structure can apply.

<<Measures Against EMI>>

The measures against EMI, i.e., the electromagnetic blockage to the outside and control of the fault occurrence by the electromagnetic waves from the outside, is explained.

Figure 45:
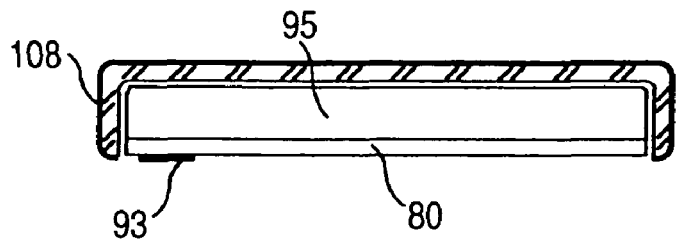
FIG. 45 is a side surface sectional view which exemplifies the structure where the cap which mixed ferritic grain performs electromagnetic shielding.

First, electromagnetic shielding with a cap is explained. In FIG. 45, the structure which mixed ferritic grain in cap 108, the structure which applied ferritic grain to the front surface, or the structure which applied the ferrite coating to the front surface is adopted from a viewpoint referred to as covering magnetic flux. These caps 108 made of resin become electromagnetic shielding. Connecter terminal 93 of a wiring substrate is exposed to opening of cap 108. With this structure, the receiving surface by an antenna faces opening. The magnetic flux shielding structure with a cap is applicable also to package structures other than standard MMC package structure.

Figure 46:
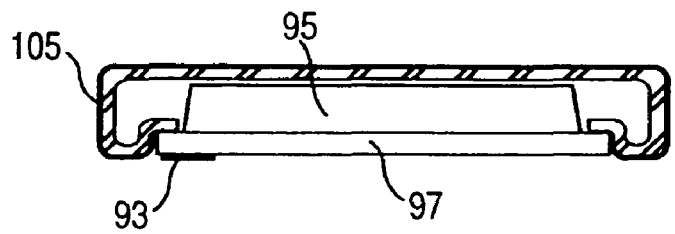
FIG. 46 is a side surface sectional view which exemplifies the structure where metal caps perform electromagnetic shielding.

What is necessary is to make cap 105 into metal and just to adopt the structure which gave the insulating film to the front surface, as exemplified in FIG. 46 if it stands on the viewpoint of easing the effect of magnetic flux by eddy current loss. Metal caps 105 turn into electromagnetic shielding. The eddy-current-loss structure by metal cap 105 is applicable also to package structures other than RSMMC package structure.

Figure 47:
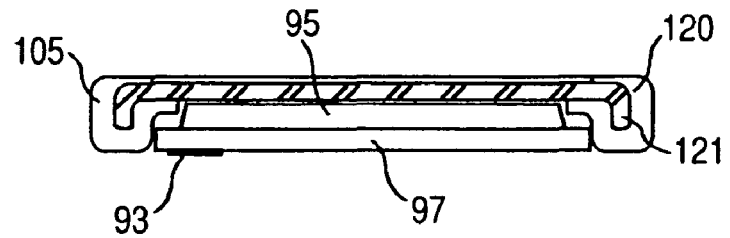
FIG. 47 is a side surface sectional view which exemplifies the structure where the mould cap containing metal or ferrite performs electromagnetic shielding.

In FIG. 47, the mould cap structure containing metal or ferrite is adopted. That is, metal or ferrite 121 is contained in the core part, it insulates performing the mould of the whole by resin 120, and cap 105 is formed by specified shape. The mould cap 105 concerned becomes electromagnetic shielding. This structure is applicable also to package structures other than RSMMC package structure. The metal or ferrite 121 does not have to perform the mould of the whole by resin 120. If it is the structure which does not cover the metal or ferrite 121 of a portion which serves as a label surface of RSMMC especially by resin 120, thickness of a wrap portion can be made thin for resin 95 of mould cap 105. If portion 95 which covers resin of mould cap 105 is made thin, it is advantageous, when the volume of resin 95 can be enlarged and a mass memory is mounted.

Figure 48:
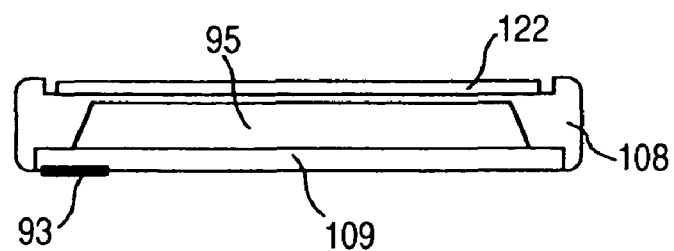
FIG. 48 is a side surface sectional view which exemplifies the structure of performing electromagnetic shielding by a label.
Figure 49:
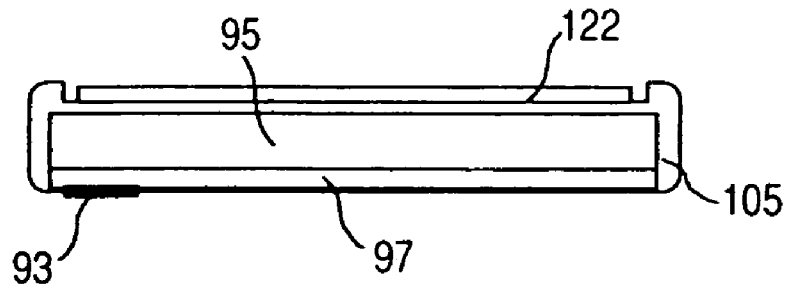
FIG. 49 is a side surface sectional view which exemplifies another structure of performing electromagnetic shielding by a label.
Figure 50:
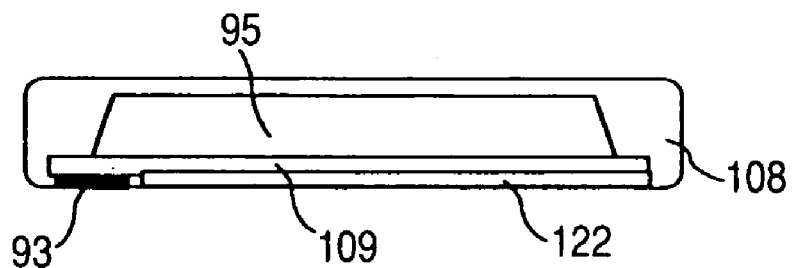
FIG. 50 is a side surface sectional view which exemplifies another structure of performing electromagnetic shielding by a label.
Figure 51:
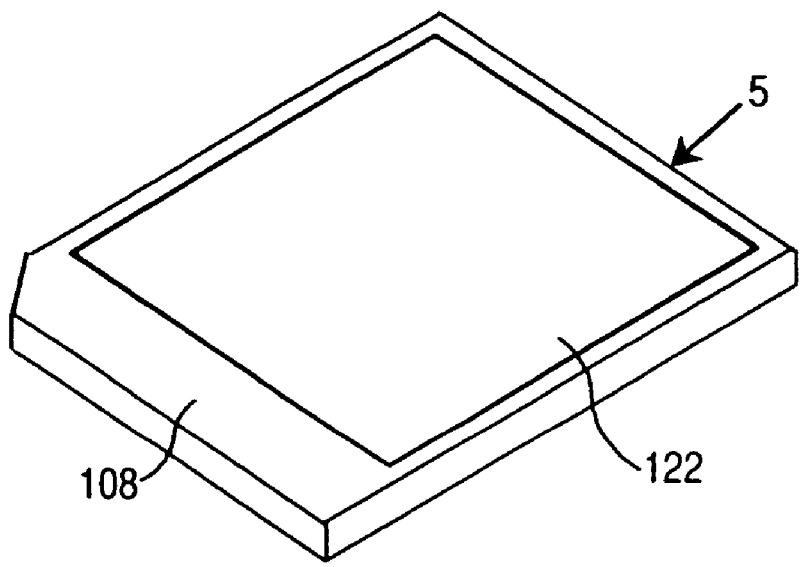
FIG. 51 is a perspective view showing MFMC of standard MMC package structure which stuck the electromagnetic shielding label in the form of FIG. 48.
Figure 52:
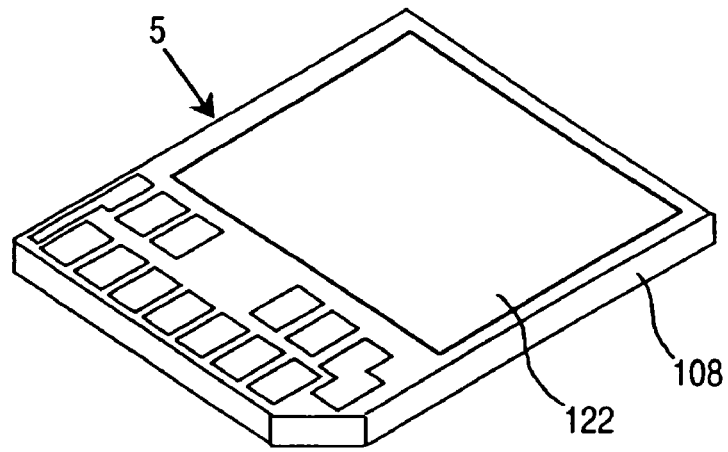
FIG. 52 is a perspective view showing MFMC of HSMMC package structure which stuck the electromagnetic shielding label in the form of FIG. 50.
Figure 53:
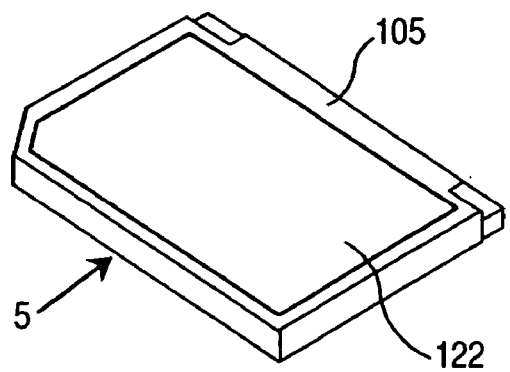
FIG. 53 is a perspective view showing MFMC of RSMMC package structure which stuck the electromagnetic shielding label in the form of FIG. 49.

Next, the electromagnetic shielding by a label is explained. What is necessary is just to perform attachment of electromagnetic shielding label 122 to cap 108 and 105 which is represented with FIG. 48 and FIG. 49, wiring substrate 109 which is represented with FIG. 50, and or the front surface of sealing resin in micro MMC package structure. The attachment location of electromagnetic shielding label 122 is a surface opposite to the input screen or receiving surface of an electric wave. In the case of FIG. 50, let a receiving surface be the opposite side in wiring substrate 109. In the case of FIG. 48 and FIG. 49, a receiving surface is performed the wiring substrate 109 and 97 side. FIG. 51 shows MFMC 5 of standard MMC package structure which stuck electromagnetic shielding label 122 in the form of FIG. 48 with a perspective view. FIG. 52 shows MFMC 5 of HSMMC package structure which stuck electromagnetic shielding label 122 in the form of FIG. 50 with a perspective view. FIG. 53 shows MFMC 5 of RSMMC package structure which stuck electromagnetic shielding label 122 in the form of FIG. 49 with a perspective view.

Let electromagnetic shielding labels 122 be the label on which ferritic grain was applied, printed or adhered, metal evaporation mat labels, such as aluminium, the metal plate label which used aluminium, copper, a grain-oriented electrical Si-steel sheet plate or a ferromagnetic material, etc. as the metal base, etc., for example.

With the electromagnetic shielding using the above-mentioned cap or a label, an electromagnetic blockage and the electromagnetic fault occurrence to the outside can be suppressed or eased. Such electromagnetic shielding technology can be applied also to the memory card which does not have a noncontact IC card function.

<<Thinning, Reverse Insertion Prevention>>

Figure 54:
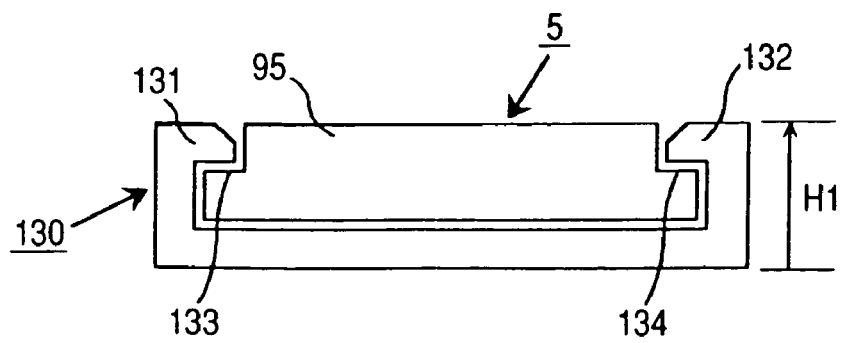
FIG. 54 is a sectional view showing the longitudinal-section structure in which the level difference part stopped by the elastic claw of a socket was formed in sealing resin.
Figure 57:
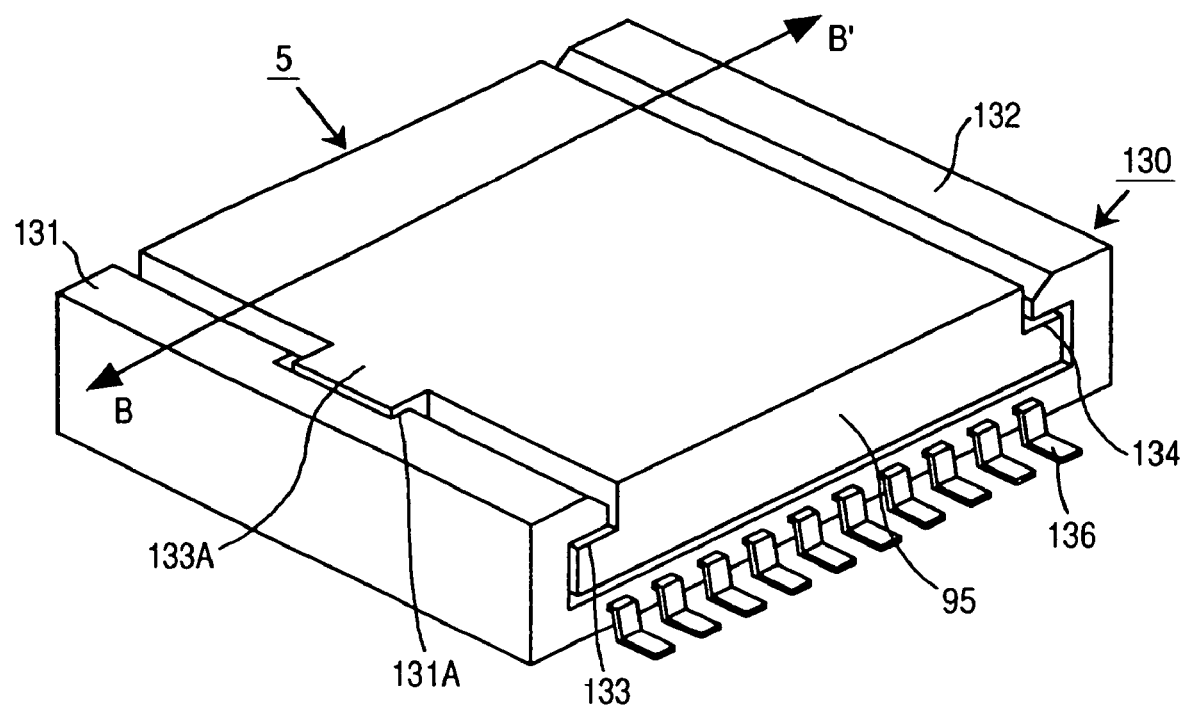
FIG. 57 is a perspective view showing the condition of having equipped the socket with MFMC of FIG. 56.
Figure 56:
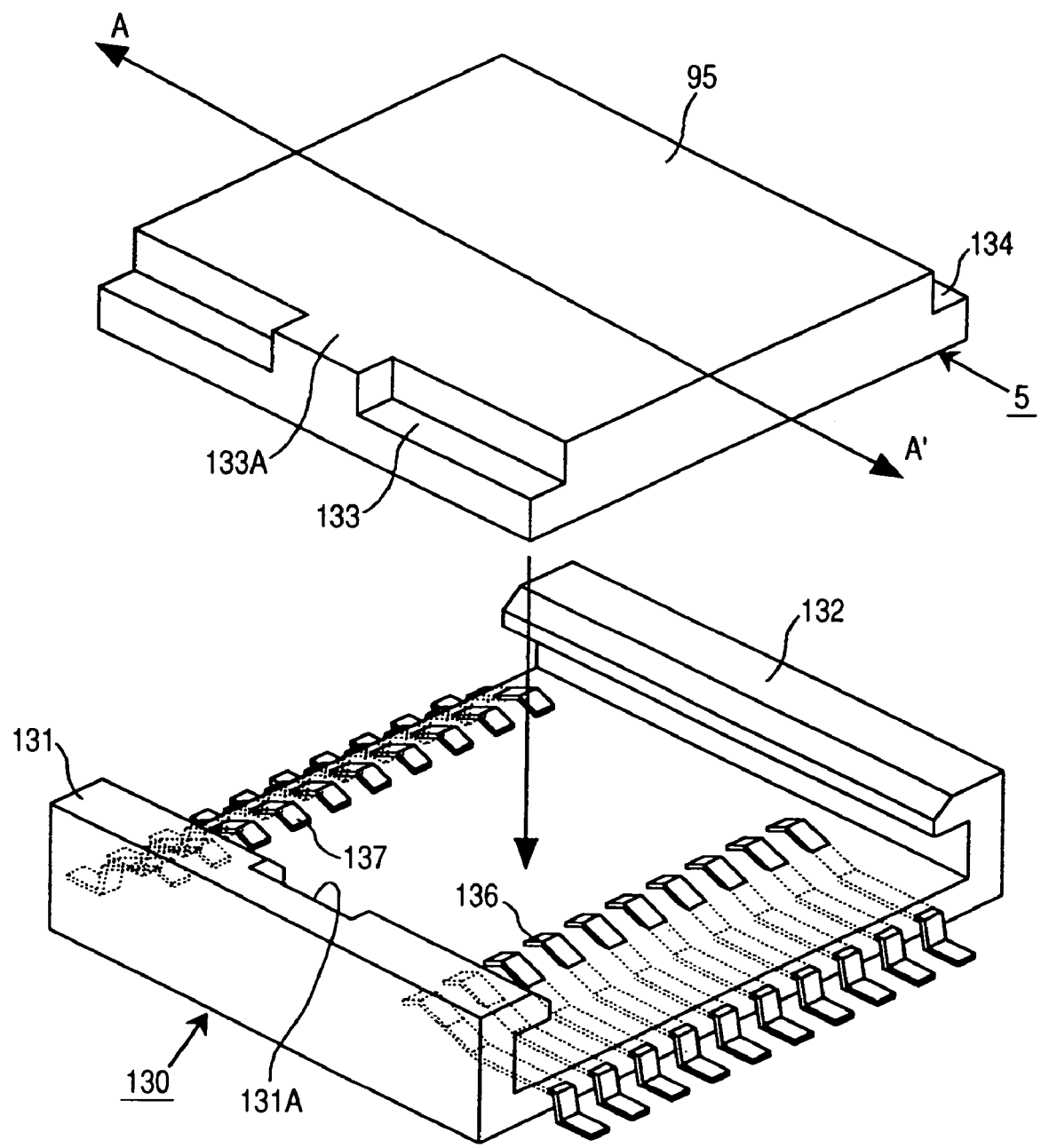
FIG. 56 is a perspective view which exemplifies the structure which made the level difference part unsymmetrical.
Figure 58:
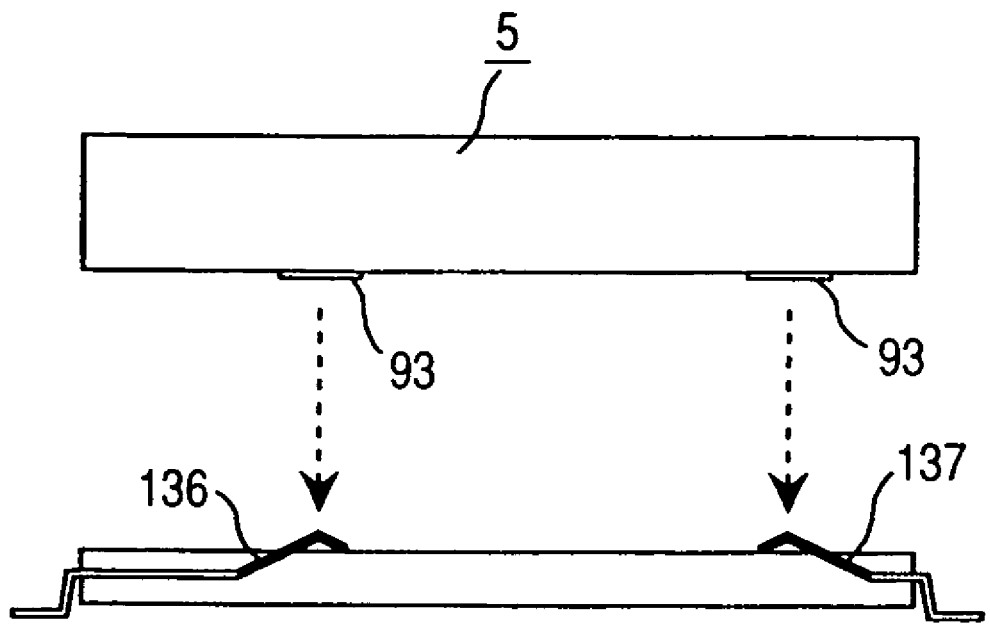
FIG. 58 is a side view which exemplifies the structure which makes the external connection terminal of MFMC non-line symmetry to the center of a package.
Figure 59:
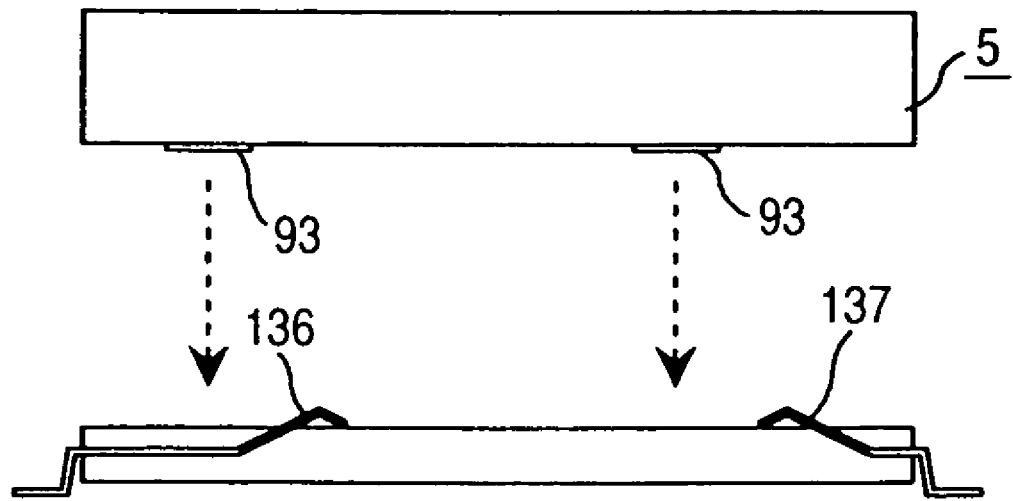
FIG. 59 is a side view showing the condition when inserting MFMC in a socket with the right-and-left reverse direction in the structure of FIG. 58.

The thinning of a socket and the reverse insertion prevention to a socket are explained. The condition before equipping socket 130 with MFMC 5 is shown in FIG. 56, and the condition of having equipped socket 130 with MFMC 5 is shown in FIG. 57. FIG. 58 and FIG. 59 show the A-A' cross section of FIG. 56, and FIG. 54 shows the B-B' cross section of FIG. 57.

Here, micro MMC package structure is explained to an example. In micro MMC package structure, package, i.e., sealing resin 95, is formed with a batch molding or a MAP (mould array package) form. At this time, as exemplified in FIG. 54, FIG. 56, and FIG. 57, level difference part 133,134 stopped by elastic claw 131,132 of socket 130 is formed in that thickness direction at sealing resin 95. At the time of a batch molding, by forming height in the cavity inner surface of a sealing metal mold, a groove is beforehand formed along the cutting separating position of sealing resin 95, and formation of level difference part 133,134 is done by performing cutting isolation of the device separately along the groove after that. Level difference part 133,134 will be formed in the parallel border part of sealing resin 95 as a result. The thickness of sealing resin 95 is prescribed by thickness required to seal semiconductor chips 85 and 86 and bonding wire 90 which were explained by FIG. 28. Since level difference part 133,134 was formed in a part for the both ends of sealing resin 95 and has shifted from parts for a stack part, such as semiconductor chips 85 and 86, it is satisfactory 136 and 137 are the cantilever elastic terminals in contact with connecter terminal 93 of MFMC 5.

Here, with reference to FIG. 67 through FIG. 71, the manufacturing method of MFMC 5 of micro MMC package structure which has the above-mentioned level difference part is explained.

Figure 67:
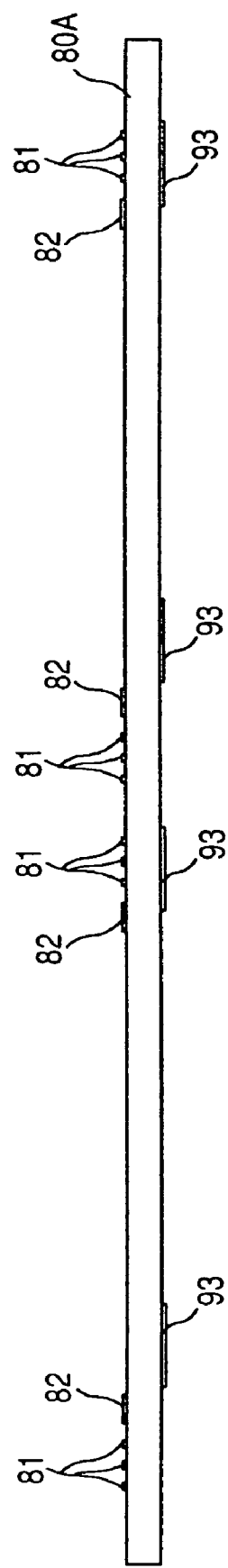
FIG. 67 is a front view of the wiring substrate used for manufacturing MFMC of micro MMC package structure which has a level difference part by a batch molding.
Figure 68:
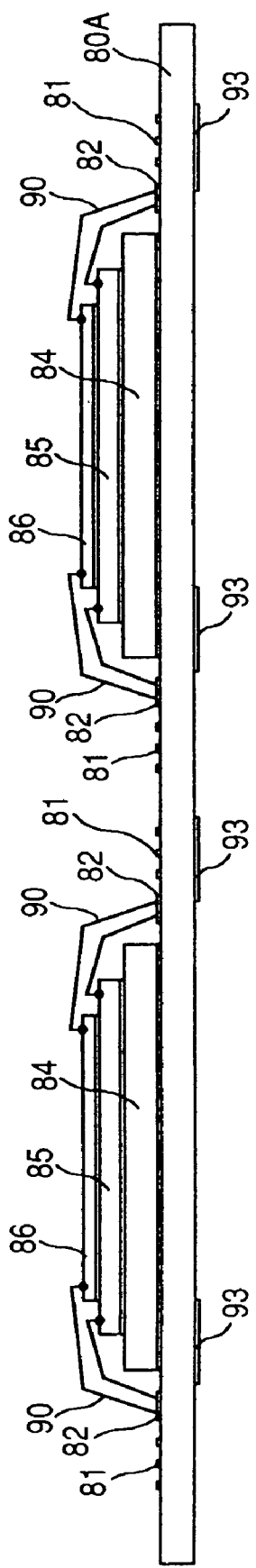
FIG. 68 is a front view showing the condition of having performed the stack of the chip to the wiring substrate of FIG. 67, and having performed wire bonding to it.
Figure 69:
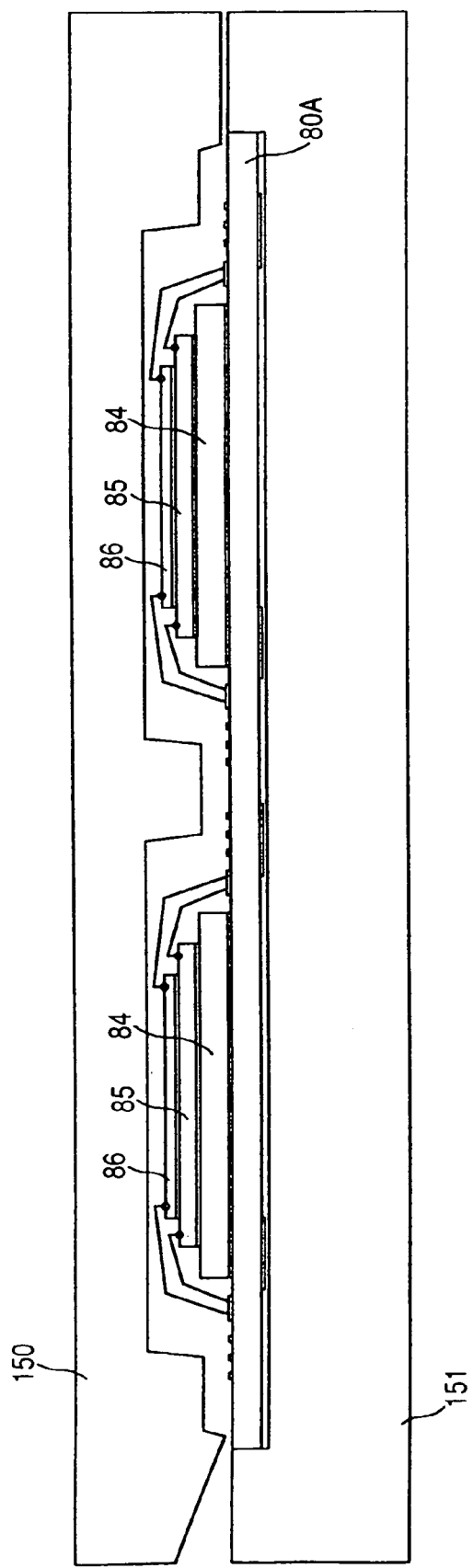
FIG. 69 is a front sectional view showing the condition of having arranged the wiring substrate which performed the stack of the chip to the cavity of a metal mold.
Figure 70:
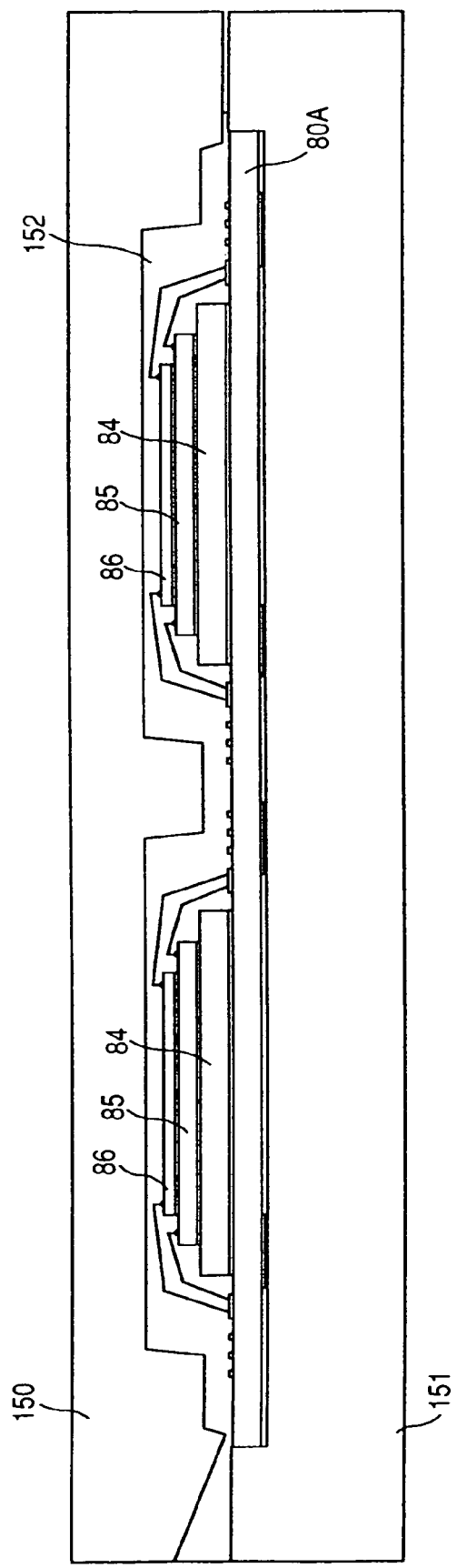
FIG. 70 is a front sectional view showing the condition of having poured sealing resin into the cavity of FIG. 69.
Figure 71:
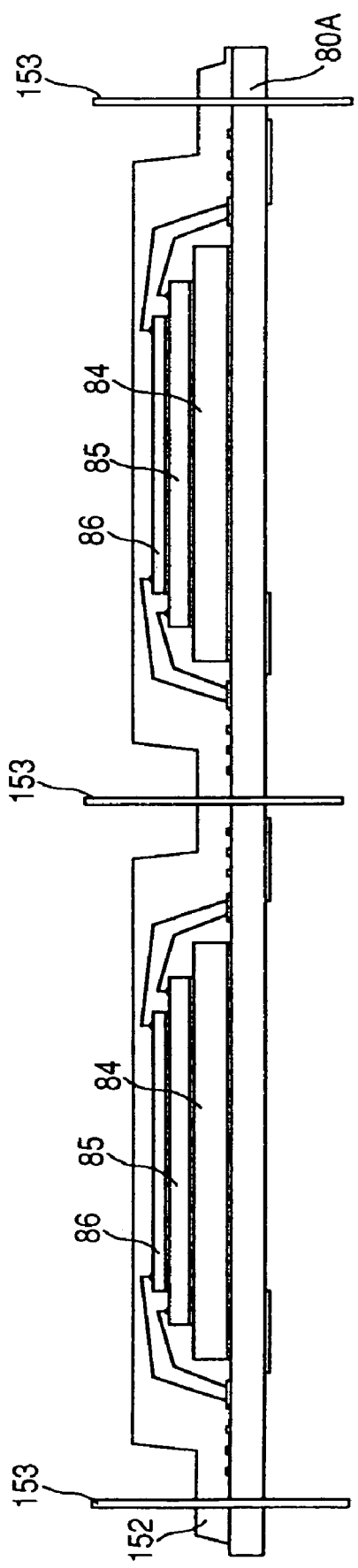
FIG. 71 is a front sectional view showing a state that dicing of sealing resin and the wiring substrate is performed.
Figure 72:
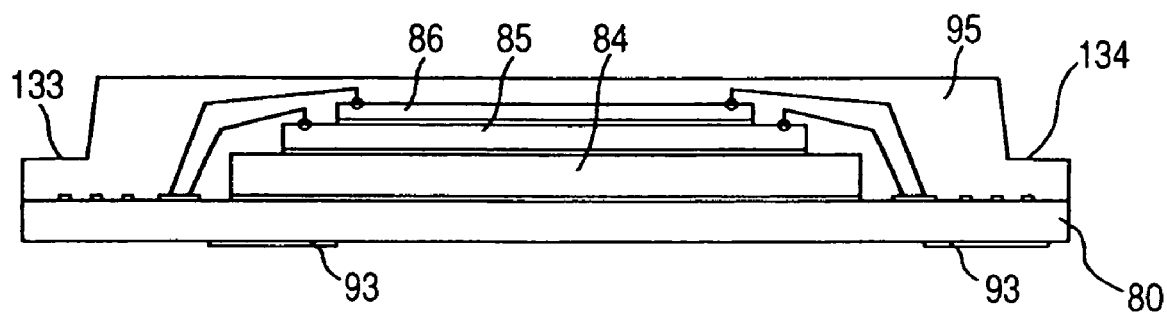
FIG. 72 is a front sectional view showing MFMC individually separated.

First, as exemplified in FIG. 67, wiring substrate 80A is prepared. Multi-unit formation of a wiring pattern, a pad electrode, etc. required for one MFMC 5 is performed at wiring substrate 80A prepared here. Next, as exemplified in FIG. 68, chips 84, 85, and 86 are mounted in the wiring pattern of each unit on a wiring substrate 80A, and the pad of chips 84, 85, and 86 is connected to corresponding bonding pad 82 by bonding wire 90. And wiring substrate 80A on which chips 84, 85, and 86 were mounted is arranged in the cavity of the sealing metal mold which comprises upper die 150 and lower die 151 (refer to FIG. 69). Resin 152 is poured in into a cavity and sealing resin is formed of this (refer to FIG. 70). After removing metal mold 150,151, dicing blade 153 cuts sealing resin 152 and wiring substrate 80A, MFMC 5 is individually separated (refer to FIG. 71), and MFMC 5 in which level difference part 133,134 was formed is completed.

Figure 55:
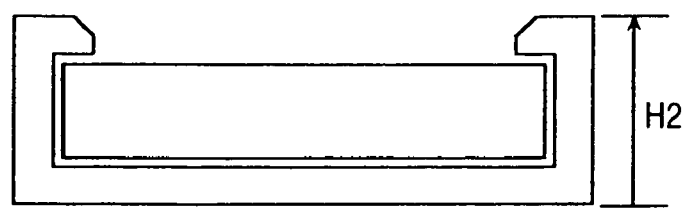
FIG. 55 is a sectional view showing the structure of a comparative example where the level difference part is not formed in sealing resin.

Since elastic claw 131,132 of socket 130 stops level difference part 133,134 thinner than the thickness of sealing resin 95, it becomes easy to suppress thickness H1 of socket 130 to the minimum. As shown in the FIG. 55 mentioned as a comparative example, in not forming a level difference part in sealing resin, the location of an elastic claw becomes high, and thickness H2 of the part socket becomes large.

As exemplified in FIG. 56, the two level difference parts 133,134 are made unsymmetrical. For example, one level difference part 134 is formed uniformly, and, as for level difference part 133 of another side, formation of the level difference is stopped on the way. Cavity 131A which stops the projection 133A is formed in corresponding elastic claw 131. Hereby, the generation of the situation where socket 130 is equipped with MFMC 5 turning a right-and-left border to a reverse direction can be deterred. In short, the reverse insertion of MFMC 5 to socket 130 can be prevented. Mounting of MFMC 5 is enabled to socket 130 only with the direction shown in FIG. 57. Hereby, the situation that a circuit and a terminal are destroyed by that terminal 136, 137 of socket 130 and terminal 93 of MFMC 5 electrically contact the terminal not corresponding to them, can be prevented.

Figure 60:
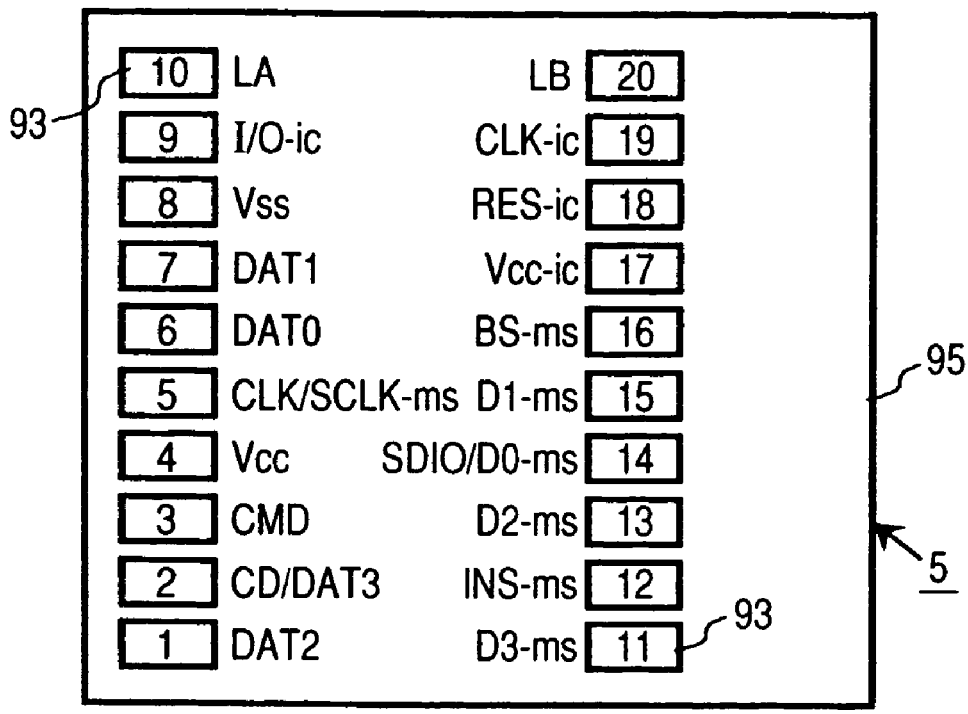
FIG. 60 is a plan view showing the terminal arrangement corresponding to the terminal structure of FIG. 3 as an example of the terminal arrangement which shifted right and left.

If it stands on the viewpoint of preventing the situation that a circuit and a terminal are destroyed by that terminal 136,137 of socket 130, and terminal 93 of MFMC 5 electrically contact the terminals not corresponding to them, it is effective to make the external connection terminal 93 into non-line symmetry to the center of sealing resin 95 as a package. For example, external connection terminal 93 exposed out of sealing resin 95 is arranged in parallel in plural lines, and the plural lines are biased to level difference part 133,134 of sealing resin 95 as exemplified in FIG. 58. The terminal arrangement corresponding to the terminal structure of FIG. 3 is exemplified by FIG. 60 as an example of the arrangement of terminal 93 which shifted right and left. If MFMC 5 is inserted in a socket with the direction of FIG. 58, a correspondence terminal will connect normally. As shown in FIG. 59, even if it inserts MFMC 5 in a socket with a right-and-left reverse direction, terminal 136,137 and terminal 93 do not contact it electrically. As for the means to give a deviation to the above-mentioned terminal arrangement, it is possible to adopt it with the means which makes level difference part 133,134 unsymmetrical or to adopt it replacing that.

Figure 61:
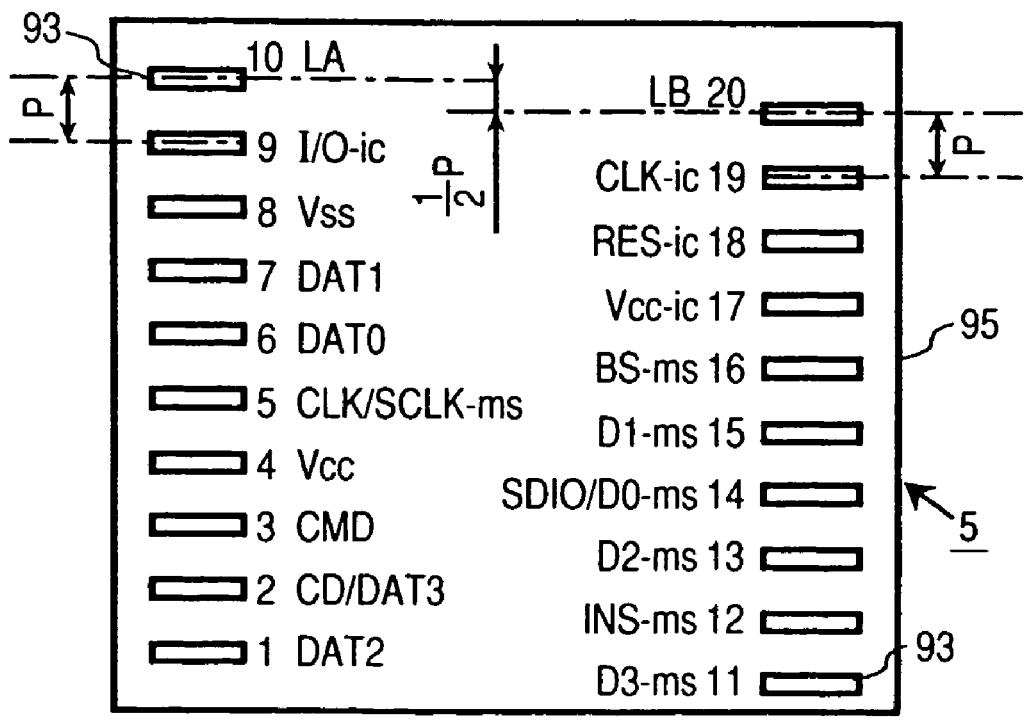
FIG. 61 is a plan view which exemplifies the terminal arrangement which arranges an external connection terminal in parallel in plural lines, and gives a deviation mutually to plural lines to a parallel direction as terminal arrangement of reverse insertion prevention.
Figure 62:
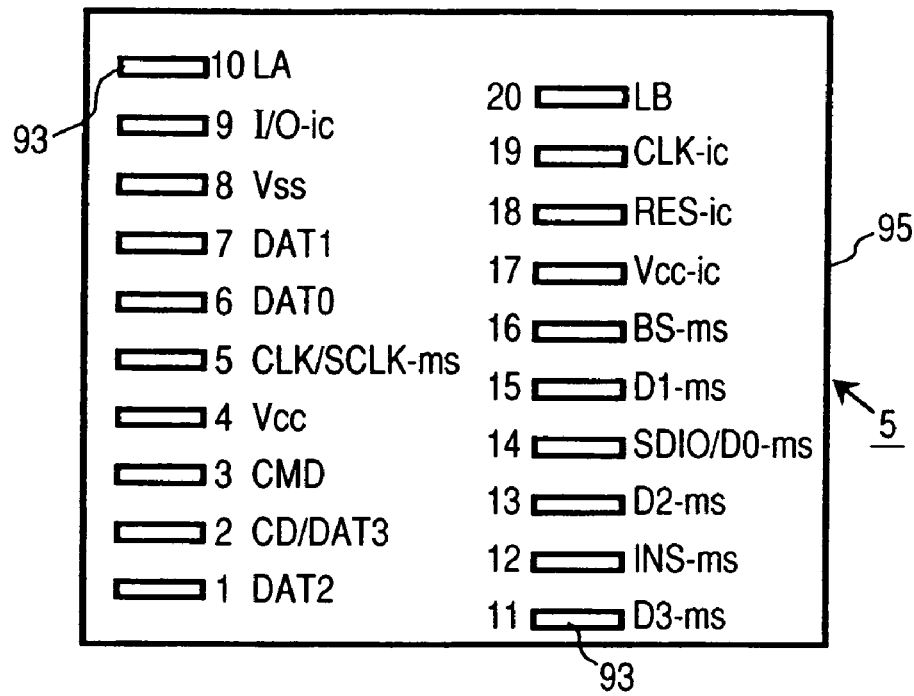
FIG. 62 is a plan view showing the terminal arrangement which adopted the both sides of the deviation over a level difference part, and the deviation of the arrangement direction of terminal arrangement.
Figure 63:
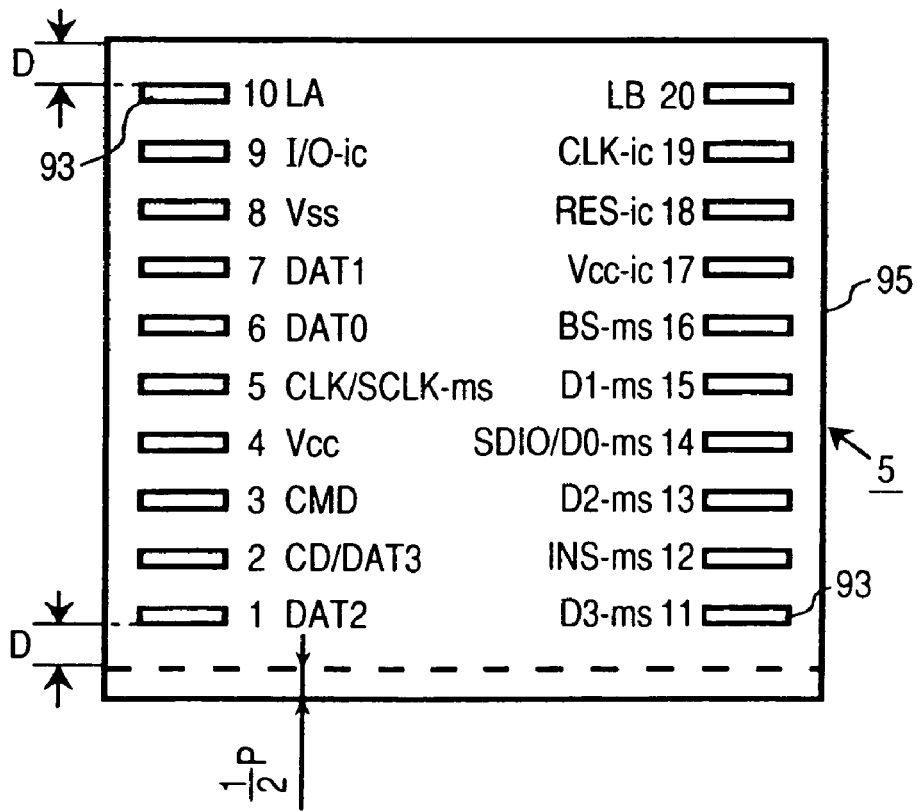
FIG. 63 is a plan view showing the structure which gives a deviation by shifting a terminal on the whole to terminal arrangement direction one way to sealing resin.
Figure 64:
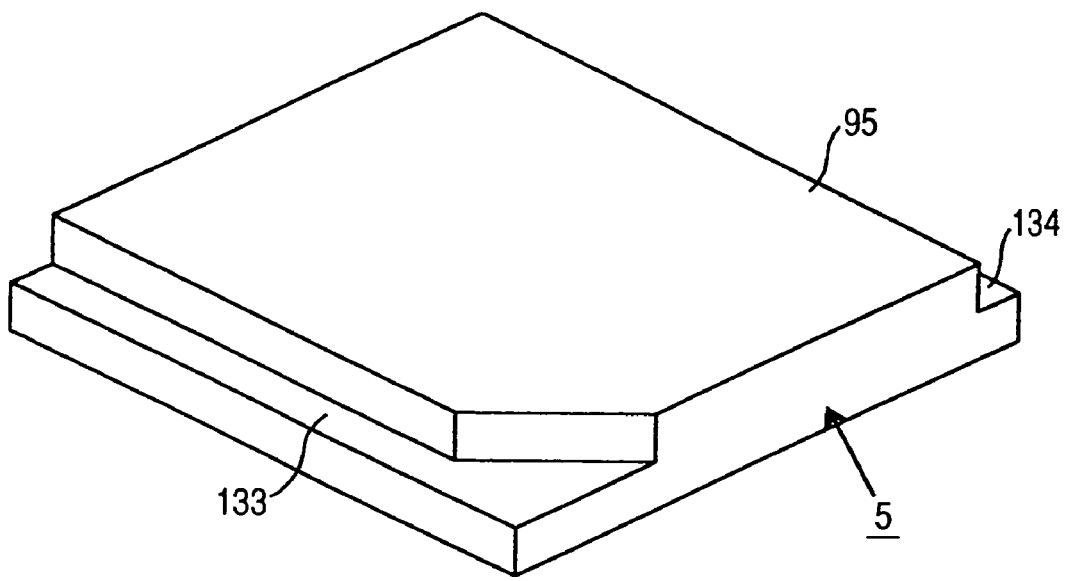
FIG. 64 is a perspective view which exemplifies another imbalanced shape over the level difference part of reverse insertion prevention.
Figure 65:
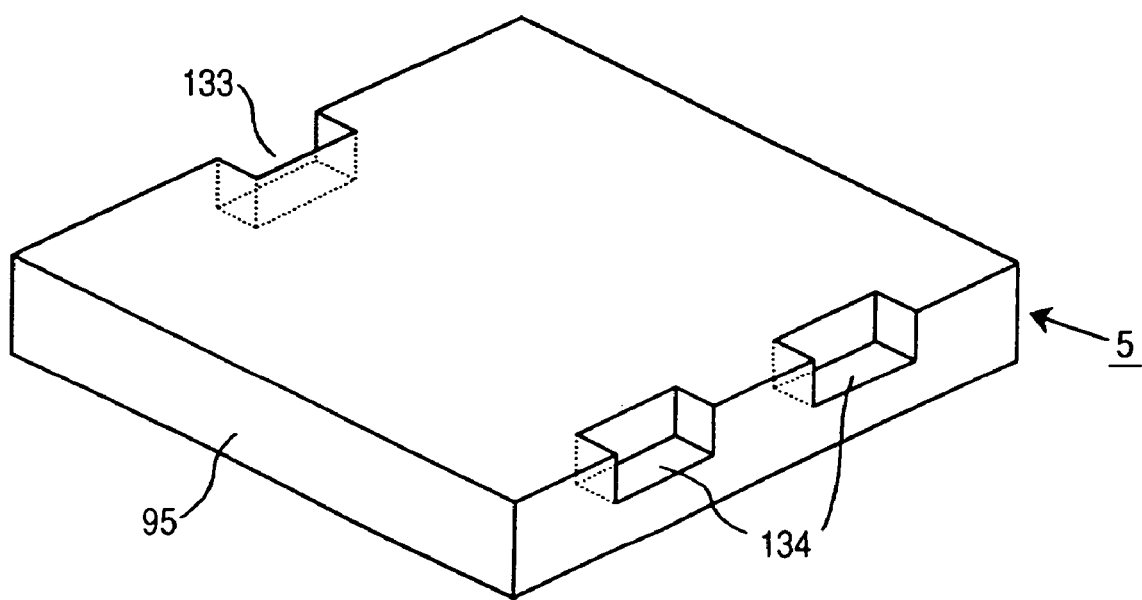
FIG. 65 is a perspective view which exemplifies another imbalanced shape to the level difference part of reverse insertion prevention.

The terminal arrangement of the above-mentioned reverse insertion prevention arranges external connection terminal 93 in parallel in plural lines, as shown in FIG. 61, and it may be made to give a deviation mutually to the plural lines to a parallel direction. What is necessary is just to make a deviation into P/2, when the pitch between terminals is P. The width of terminal 93 itself becomes narrow compared with FIG. 3. As exemplified in FIG. 62, the both sides of the deviation over level difference part 133,134 and the deviation of the arrangement direction of terminal arrangement may be adopted. As exemplified in FIG. 63, on the whole, a deviation is given shifting a terminal to terminal arrangement direction one way to sealing resin 95. A gap should just be set to half P/2 of terminal pitch P. The shape of level difference part 133,134 of the above-mentioned reverse insertion prevention may be imbalanced shape shown in FIG. 64 or FIG. 65.

In manufacturing a socket using the molding metal mold for plastic goods molding, as shown in FIG. 56, by designing a socket so that the location of elastic claw 131,132 and the location of external connection terminal 93 may arrange in a different location on a plan view, it becomes easy to simplify structure of a molding metal mold more, and it can improve the productivity of a socket.

What is necessary is according to the viewpoint of the thinning of MFMC 5, for the thing which has small surface area to be formed more thinly, and just to arrange a thinner semiconductor chip in the upper layer in a plurality of semiconductor chips by which a stack is performed on a wiring substrate or a ferrite plate. It is because what has smaller surface area is smaller as for the stress and distortion condition by the bending moment. For example, in FIG. 28, relatively thick and big semiconductor chip 85 is located downward, and relatively thin and small semiconductor chip 86 is piled up upwards. If especially this method is adopted, it will become easy to thicken a ferrite plate. It is effective to thicken a ferrite plate, when reducing magnetic resistance.

<<Test Facilitation>>

Figure 66:
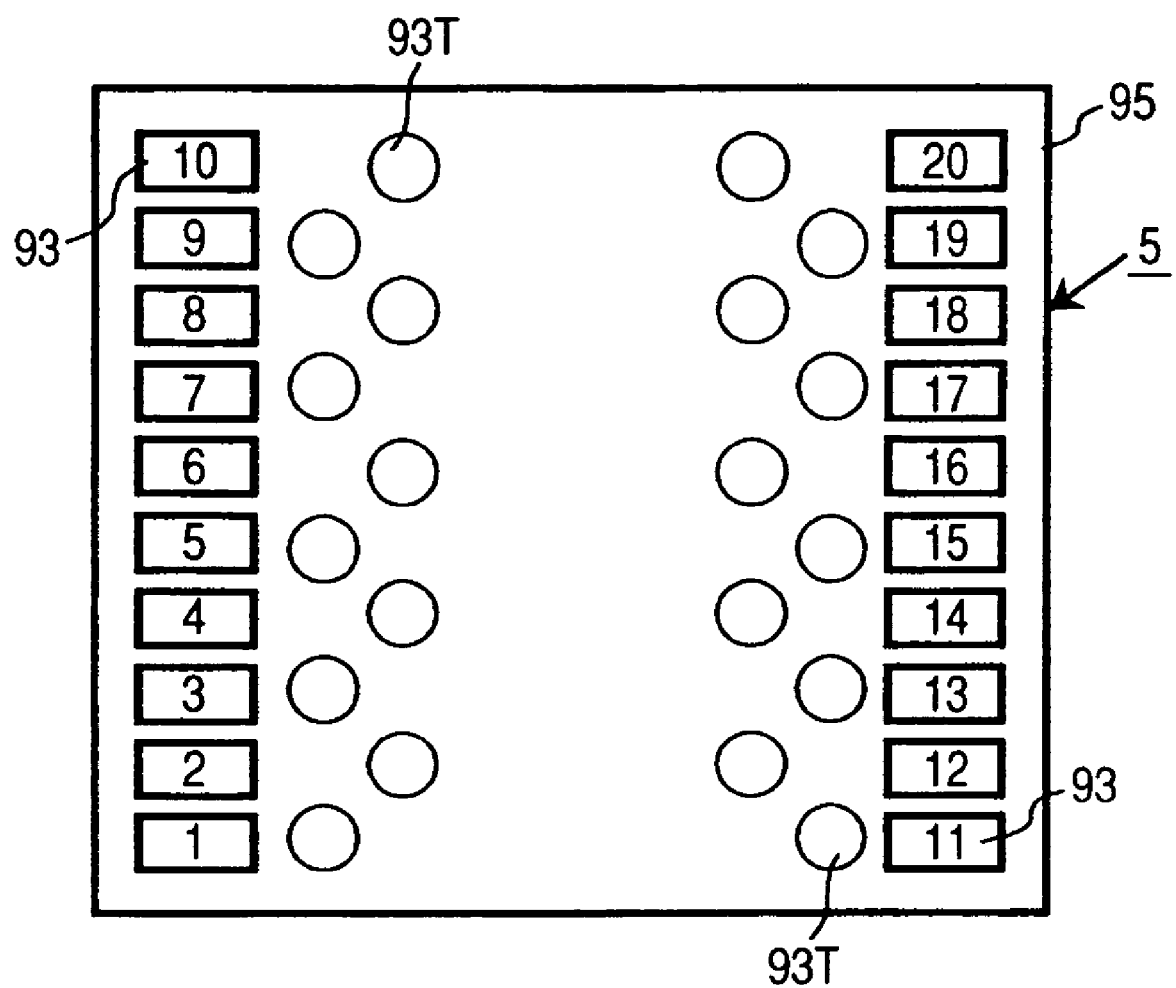
FIG. 66 is an explanatory drawing which exemplifies the arrangement state of the test terminal in MFMC.

As exemplified in FIG. 66, from a viewpoint of the test facilitation to MFMC 5, when an external connection terminal is exposed and the whole is sealed by the package, it is good to arrange a plurality of test terminals 93T which are connecting with the a plurality of first external terminals 93, respectively, and whose pitch and surface area are bigger than the first external terminal 93 other than the first external terminal 93 connected to the terminal of a card socket as an external connection terminal exposed out of the package. By using a plurality of test terminals 93T with big pitch and surface area, operation of contacting a test probe perpendicularly to much MFMC 5 becomes easy. In order to increase the efficiency of arrangement of test terminal 93T, the first external terminals 93 are good to arrange to plural lines being spaced out, and to arrange the second external terminals 93T to the whole region between plural lines.

As things mentioned above, the present inventions accomplished by the present inventors were concretely explained based on above embodiments, but the present inventions are not limited by above embodiments, but variations and modifications may be made, of course, in various ways in the limit that does not deviate from the gist.

For example, a multifunction card device may be a device which does not have a security controller like an IC card microcomputer. The wiring substrate of a multifunction card device or a semiconductor card device may not be limited to a multilayer interconnection substrate, but may be what is called a lead frame. The invention concerning antenna characteristic deterioration prevention by eddy current loss, improvement in inductance performance, the measures against EMI, reverse insertion prevention of the semiconductor card device to a socket, the thinning of the socket for semiconductor card devices and test facilitation is not limited when applying to a multifunction card device, but it can be widely applied also to other semiconductor card devices, such as a modem card and a LAN card.

INDUSTRIAL APPLICABILITY

The present invention is widely applicable not only to the multifunction memory card carrying a card controller, a flash memory, and an IC card microcomputer but to other compound function cards, a communication card, an I/O card, a memory card, etc.

The invention claimed is:

1. A multifunction card device comprising:
    a wiring substrate on which external connection terminals are formed; and
    a plurality of semiconductor chips mounted over the wiring substrate, the plurality of semiconductor chips including:
        a first semiconductor chip having an interface controller and coupled to the external connection terminals, and
        a second semiconductor chip having a memory and coupled to the interface controller,
    wherein the interface controller has a plurality of interface control modes for controlling an external interface action to an outside of the multifunction card device and a memory interface action to the memory, the interface controller being adapted to control the external interface action and the memory interface action by one of the interface control modes according to an instruction from outside of the multifunction card device,
    wherein the interface control modes include a first interface control mode, a second interface control mode and a third interface control mode,
    wherein the external connection terminals include first, second and third groups of terminals corresponding to the first, second and third interface control modes, respectively, and common terminals,
    wherein the common terminals include a clock input terminal, a power supply terminal and a ground terminal,
    wherein the first group of terminals includes four data terminals and a command input terminal,
    wherein the second group of terminals includes eight data terminals and a command input terminal, and
    wherein the third group of terminals includes four data terminals, an insertion/removal detection terminal and a bus status terminal.

2. A multifunction card device according to claim 1,
    wherein a third semiconductor chip of the plurality of semiconductor chips or the first semiconductor chip has a security controller,
    wherein the security controller is coupled to the interface controller and to the external connection terminals, and
    wherein the multifunction card device further includes a fourth group of terminals for the security controller.

3. A multifunction card device according to claim 2,
    wherein the fourth group of terminals includes a clock terminal, a data input/output terminal, a reset terminal, and a power supply terminal.

4. A multifunction card device according to claim 2,
    wherein the security controller performs a security process according to a signal state of the external connection terminals or an action command given from the interface controller.

5. A multifunction card device according to claim 4,
    wherein the multifunction card device has an internal antenna, and
    wherein a non-contact interface for the security controller is provided by the internal antenna.

6. A multifunction card device according to claim 5, further comprising:
    external antenna connection terminals coupled to an external antenna, and
    a switching circuit adapted to selectively couple the external antenna connection terminals to the security controller or the internal antenna.

7. A multifunction card device comprising:
    a wiring substrate;
    external connection terminals disposed on the wiring substrate;
    an interface controller disposed on the wiring substrate and coupled to the external connection terminals; and
    a memory disposed on the wiring substrate and coupled to the interface controller,
    wherein the interface controller has a plurality of interface control modes for controlling an external interface action to an outside of the multifunction card device and a memory interface action to the memory, the interface controller being adapted to control the external interface action and the memory interface action by one of the interface control modes according to an instruction from outside of the multifunction card device,
    wherein the interface control modes include a first interface control mode, a second interface control mode and a third interface control mode,
    wherein the external connection terminals include first, second and third groups of terminals corresponding to the first, second and third interface control modes, respectively, and common terminals,
    wherein the common terminals include a clock input terminal, a power supply terminal and a ground terminal,
    wherein the first group of terminals includes four data terminals and a command input terminal,
    wherein the second group of terminals includes eight data terminals and a command input terminal, and
    wherein the third group of terminals includes four data terminals, an insertion/removal detection terminal and a bus status terminal.

8. A multifunction card device comprising:
    a wiring substrate;
    external connection terminals on the wiring substrate;
    an interface controller disposed over the wiring substrate and coupled to the external connection terminals;
    a memory disposed over the wiring substrate and coupled to the interface controller; and
    a security controller disposed over the wiring substrate and coupled to the interface controller,
    wherein the interface controller has a plurality of interface control modes for controlling an external interface action to an outside of the multifunction card device and a memory interface action to the memory, and the interface controller is adapted to control the external interface action and the memory interface action by one of the interface control modes according to an instruction from outside of the multifunction card device,
    wherein the interface control modes include a first interface control mode, a second interface control mode, a third interface control mode and a fourth interface control mode,
    wherein the external connection terminals include:
        first, second, third and fourth groups of terminals corresponding to the first, second, third and fourth interface control modes, respectively,
        first common terminals for the first, second and third interface control modes, the first common terminals including a clock input terminal and a power supply terminal,
        a second common terminal for the first, second, third and fourth interface control modes, the second common terminal being a ground terminal,
    wherein the first group of terminals includes four data terminals and a command input terminal, wherein the second group of terminals includes eight data terminals and a command input terminal, wherein the third group of terminals includes four data terminals, an insertion/removal detection terminal and a bus status terminal, and wherein the fourth group of terminals includes a clock terminal, a data input/output terminal, a reset terminal and a power supply terminal.

* * * * *